US009478224B2

(12) United States Patent
Kjoerling et al.

(10) Patent No.: US 9,478,224 B2
(45) Date of Patent: Oct. 25, 2016

(54) AUDIO PROCESSING SYSTEM

(71) Applicant: DOLBY INTERNATIONAL AB, Amsterdam (NL)

(72) Inventors: Kristofer Kjoerling, Solna (SE); Heiko Purnhagen, Sundbyberg (SE); Lars Villemoes, Jarfalla (SE)

(73) Assignee: Dolby International AB, Amsterdam (NL)

( * ) Notice: Subject to any disclaimer, the term of this patent is extended or adjusted under 35 U.S.C. 154(b) by 0 days.

(21) Appl. No.: 14/781,232

(22) PCT Filed: Apr. 4, 2014

(86) PCT No.: PCT/EP2014/056857
§ 371 (c)(1),
(2) Date: Sep. 29, 2015

(87) PCT Pub. No.: WO2014/161996
PCT Pub. Date: Oct. 9, 2014

(65) Prior Publication Data

US 2016/0055855 A1 Feb. 25, 2016

Related U.S. Application Data

(60) Provisional application No. 61/809,019, filed on Apr. 5, 2013, provisional application No. 61/875,959, filed on Sep. 10, 2013.

(51) Int. Cl.
*G10L 19/00* (2013.01)
*G10L 19/008* (2013.01)
(Continued)

(52) U.S. Cl.
CPC ........... *G10L 19/008* (2013.01); *G10L 19/032* (2013.01); *G10L 19/04* (2013.01); *G10L 19/20* (2013.01)

(58) Field of Classification Search
USPC ................ 704/500, 205, 219, 200, 94, 501; 381/98, 17, 300, 22, 307; 375/316
See application file for complete search history.

(56) References Cited

U.S. PATENT DOCUMENTS 7,292,901 B2 11/2007 Baumgarte
7,412,380 B1 * 8/2008 Avendano .............. G10L 21/00 381/1

(Continued)

FOREIGN PATENT DOCUMENTS

EP 1928212 6/2008
EP 2302624 3/2011

(Continued)

OTHER PUBLICATIONS

Geiser, B. et al "Bandwidth Extension for Hierarchical Speech and Audio Coding in ITU-T Rec. G.729.1" IEEE Transactions on Audio, Speech, and Language Processing, vol. 15, Issue 8, Nov. 2007, pp. 2496-2509.

(Continued)

*Primary Examiner* — Pierre-Louis Desir
*Assistant Examiner* — Neeraj Sharma

(57) ABSTRACT

An audio processing system (100) comprises a front-end component (102, 103), which receives quantized spectral components and performs an inverse quantization, yielding a time-domain representation of an intermediate signal. The audio processing system further comprises a frequency-domain processing stage (104, 105, 106, 107, 108), configured to provide a time-domain representation of a processed audio signal, and a sample rate converter (109), providing a reconstructed audio signal sampled at a target sampling frequency. The respective internal sampling rates of the time-domain representation of the intermediate audio signal and of the time-domain representation of the processed audio signal are equal. In particular embodiments, the processing stage comprises a parametric upmix stage which is operable in at least two different modes and is associated with a delay stage that ensures constant total delay.

15 Claims, 25 Drawing Sheets

(51) Int. Cl.

| | |
|---|---|
| ***G10L 19/04*** | (2013.01) |
| ***G10L 19/20*** | (2013.01) |
| ***G10L 19/032*** | (2013.01) |
| *G10L 25/00* | (2013.01) |
| *G10L 21/00* | (2013.01) |
| *H04L 27/00* | (2006.01) |
| *H03G 5/00* | (2006.01) |
| *H04R 5/00* | (2006.01) |

(56) References Cited

U.S. PATENT DOCUMENTS

| | | | | |
|---|---|---|---|---|
| 7,657,427 | B2 | 2/2010 | Jelinek | |
| 8,200,351 | B2 | 6/2012 | Kurniawati | |
| 8,296,159 | B2 | 10/2012 | Neuendorf | |
| 8,484,019 | B2 | 7/2013 | Hedelin | |
| 8,655,670 | B2 | 2/2014 | Purnhagen | |
| 9,082,395 | B2 | 7/2015 | Heiko | |
| 2005/0058304 | A1* | 3/2005 | Baumgarte | G10L 19/008 381/98 |
| 2005/0157883 | A1 | 7/2005 | Herre | |
| 2007/0002971 | A1* | 1/2007 | Purnhagen | H04R 5/00 375/316 |
| 2008/0004883 | A1 | 1/2008 | Vilermo | |
| 2008/0130904 | A1* | 6/2008 | Faller | H04S 1/002 381/17 |
| 2008/0232616 | A1* | 9/2008 | Pulkki | H04S 3/02 381/300 |
| 2011/0022402 | A1 | 1/2011 | Engdegard | |
| 2011/0051938 | A1 | 3/2011 | Moon | |
| 2011/0161087 | A1 | 6/2011 | Ashley | |
| 2011/0202354 | A1 | 8/2011 | Grill | |
| 2011/0218797 | A1 | 9/2011 | Mittal | |
| 2011/0224994 | A1 | 9/2011 | Norvell | |
| 2011/0317842 | A1* | 12/2011 | Neusinger | G10L 19/008 381/22 |
| 2012/0035936 | A1 | 2/2012 | Kurniawati | |
| 2012/0185256 | A1 | 7/2012 | Virette | |
| 2013/0064383 | A1 | 3/2013 | Schnell | |
| 2014/0064527 | A1* | 3/2014 | Walther | H04S 3/006 381/307 |

FOREIGN PATENT DOCUMENTS

| | | |
|---|---|---|
| EP | 2 360 683 | 8/2011 |
| WO | 2005/078706 | 8/2005 |
| WO | 2009/046460 | 4/2009 |
| WO | 2010/075895 | 7/2010 |
| WO | 2012/040898 | 4/2012 |
| WO | 2012/058805 | 5/2012 |
| WO | 2013/068587 | 5/2013 |

OTHER PUBLICATIONS

Capobianco, J. et al "Dynamic Strategy for Window Splitting, Parameters Estimation and Interpolation in Spatial Parametric Audio Coders" IEEE International Conference on Acoustics, Speech and Signal Processing, Mar. 25-30, 2012, pp. 397-400.

Hsu, Han-Wen, et al "On the Design of Low Power MPEG-4 HE-AAC Encoder" AES Convention, 122, published on May 1, 2007.

Exposito, J.E.M. et al. "Audio Coding Improvement Using Evolutionary Speech/Music Discrimination" IEEE International Fuzzy Systems Conference, Jul. 23-26, 2007, pp. 1-6.

Fielder, L.D. et al "The Design of a Video Friendly Audio Coding System for Distribution Applications" AES International Conference on High Quality Audio Coding, vol. 17, Aug. 1, 1999, pp. 86-95.

Den Brinker, A.C. et al. "An Overview of the Coding Standard MPEG-4 Audio Amendments 1 and 2: HE-AAC, SSC, and HE-AAC v2" EURASIP Journal on Audio, Speech, and Music Processing, vol. 34, No. 4, Jan. 1, 2009, pp. 744-721.

Bosi, M. et al "ISO/IEC MPEG-2 Advanced Audio Coding" Journal of the Audio Engineering Society, New York, US, vol. 45, No. 10, Oct. 1, 1997, pp. 789-812.

Herre, J. et al "MPEG Surround—The ISO/MPEG Standard for Efficient and Compatible Multichannel Audio Coding" Journal of the Audio Engineering Society, vol. 56, No. 11, Nov. 2008.

* cited by examiner

100

AUDIO PROCESSING SYSTEM

CROSS-REFERENCE TO RELATED APPLICATIONS

This application claims priority from U.S. Provisional patent Application No. 61/809,019 filed 5 Apr. 2013 and 61/875,959 filed 10 Sep. 2013, each of which is hereby incorporated by reference in its entirety.

TECHNICAL FIELD

This disclosure generally relates to audio encoding and decoding. Various embodiments provide audio encoding and decoding systems (referred to as audio codec systems) particularly suited for voice encoding and decoding.

BACKGROUND

Complex technological systems, including audio codec systems, typically evolve cumulatively over an extended time period and oftentimes by uncoordinated efforts in independent research and development teams. As a result, such systems may include awkward combinations of components that represent different design paradigms and/or unequal levels of technological progress. The frequent desire to preserve compatibility with legacy equipment places an additional constraint on designers and may result in a less coherent system architecture. In parametric multichannel audio codec systems, backward compatibility may in particular involve providing a coded format where the downmix signal will return a sensibly sounding output when played in a mono or stereo playback system without processing capabilities.

Available audio coding formats representing the state of the art include MPEG Surround, USAC and High Efficiency AAC v2. These have been thoroughly described and analyzed in the literature.

It would be desirable to propose a versatile yet architecturally uniform audio codec system with reasonable performance, especially for voice signals.

BRIEF DESCRIPTION OF THE DRAWINGS

Embodiments within the inventive concept will now be described in detail, with reference to the accompanying drawings, wherein.

Figure 1:
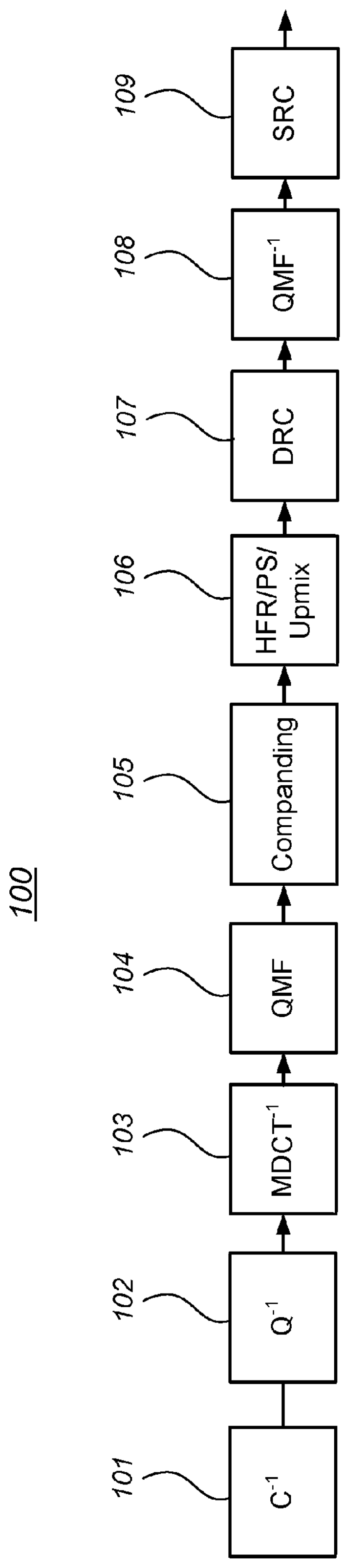
FIG. 1 is a generalized block diagram showing an overall structure of an audio processing system according to an example embodiment.

All the figures are schematic and generally only show parts which are necessary in order to elucidate the invention, whereas other parts may be omitted or merely suggested.

DETAILED DESCRIPTION

An audio processing system accepts an audio bitstream segmented into frames carrying audio data. The audio data may have been prepared by sampling a sound wave and transforming the electronic time samples thus obtained into spectral coefficients, which are then quantized and coded in a format suitable for transmission or storage. The audio processing system is adapted to reconstruct the sampled sound wave, in a single-channel, stereo or multi-channel format. As used herein, an audio signal may relate to a pure audio signal or the audio part of a video, audiovisual or multimedia signal.

The audio processing system is generally divided into a front-end component, a processing stage and a sample rate converter. The front-end component includes: a dequantization stage adapted to receive quantized spectral coefficients and to output a first frequency-domain representation of an intermediate signal; and an inverse transform stage for receiving the first frequency-domain representation of the intermediate signal and synthesizing, based thereon, a time-domain representation of the intermediate signal. The processing stage, which may be possible to bypass altogether in some embodiments, includes: an analysis filterbank for receiving the time-domain representation of the intermediate signal and outputting a second frequency-domain representation of the intermediate signal; at least one processing component for receiving said second frequency-domain representation of the intermediate signal and outputting a frequency-domain representation of a processed audio signal; and a synthesis filterbank for receiving the frequency-domain representation of the processed audio signal and outputting a time-domain representation of the processed audio signal. The sample rate converter, finally, is configured to receive the time-domain representation of the processed audio signal and to output a reconstructed audio signal sampled at a target sampling frequency.

According to an example embodiment, the audio processing system is a single-rate architecture, wherein the respective internal sampling rates of the time-domain representation of the intermediate audio signal and of the time-domain representation of the processed audio signal are equal.

In particular example embodiments where the front-end stage comprises a core coder and the processing stage comprises a parametric upmix stage, the core coder and the parametric upmix stage operate at equal sampling rate. Additionally or alternatively, the core coder may be extended to handle a broader range of transform lengths and the sampling rate converter may be configured to match standard video frame rates to allow decoding of video-synchronous audio frames. This will be described in greater detail below under the Audio mode coding section.

In still further particular example embodiments, the front-end component is operable in an audio mode and a voice mode different from the audio mode. Because the voice mode is specifically adapted for voice content, such signals can be played more faithfully. In the audio mode, the front-end component may operate similarly to what is disclosed in FIG. 6 and associated sections of this description. In the voice mode, the front-end component may operate as particularly discussed below in the Voice mode coding section.

In example embodiments, generally speaking, the voice mode differs from the audio mode of the front-end component in that the inverse transform stage operates at a shorter frame length (or transform size). A reduced frame length has been shown to capture voice content more efficiently. In some example embodiments, the frame length is variable within the audio mode and within the video mode; it may for instance be reduced intermittently to capture transients in the signal. In such circumstances, a mode change from the audio mode into the voice mode will—all other factors equal—imply a reduction of the frame length of the inverse transform stage. Put differently, such mode change from the audio mode into the voice mode will imply a reduction of the maximal frame length (out of the selectable frame lengths within each of the audio mode and voice mode). In particular, the frame length in the voice mode may be a fixed fraction (e.g., ⅛) of the current frame length in the audio mode.

In an example embodiment, a bypass line parallel to the processing stage allows the processing stage to be bypassed in decoding modes where no frequency-domain processing is desired. This may be suitable when the system decodes discretely coded stereo or multichannel signals, in particular signals where the full spectral range is waveform-coded (whereby spectral band replication may not be required). To avoid time shifts on occasions where the bypass line is switched into or out of the processing path, the bypass line may preferably comprise a delay stage matching the delay (or algorithmic delay) of the processing stage in its current mode. In embodiments where the processing stage is arranged to have constant (algorithmic) delay independently of its current operating mode, the delay stage on the bypass line may incur a constant, predetermined delay; otherwise, the delay stage in the bypass line is preferably adaptive and varies in accordance with the current operating mode of the processing stage.

In an example embodiment, the parametric upmix stage is operable in a mode where it receives a 3-channel downmix signal and returns a 5-channel signal. Optionally, a spectral band replication component may be arranged upstream of the parametric upmix stage. In a playback channel configuration with three front channels (e.g., L, R, C) and two surround channels (e.g., Ls, Rs) and where the coded signal is 'front-heavy', this example embodiment may achieve more efficient coding. Indeed, the available bandwidth of the audio bitstream is spent primarily on an attempt to waveform-code as much as possible of the three front channels. An encoding device preparing the audio bitstream to be decoded by the audio processing system may adaptively select decoding in this mode by measuring properties of the audio signal to be encoded. An example embodiment of the upmix procedure of upmixing one downmix channel into two channels and the corresponding downmix procedure is discussed below under the heading Stereo coding.

In a further development of the preceding example embodiment, two of the three channels in the downmix signal correspond to jointly coded channels in the audio bitstream. Such joint coding may entail that, e.g., the scaling of one channel is expressed as compared to the other channel. A similar approach has been implemented in AAC intensity stereo coding, wherein two channels may be encoded as a channel pair element. It has been proven by listening experiments that, at a given bitrate, the perceived quality of the reconstructed audio signal improves when some channels of the downmix signal are jointly coded.

In an example embodiment, the audio processing system further comprises a spectral band replication module. The spectral band replication module (or high-frequency reconstruction stage) is discussed in greater detail below under the heading Stereo coding. The spectral band replication module is preferably active when the parametric upmix stage performs an upmix operation, i.e., when it returns a signal with a greater number of channels than the signal it receives. When the parametric upmix stage acts as a pass-through component, however, the spectral band replication module can be operated independently of the particular current mode of the parametric upmix stage; this is to say, in non-parametric decoding modes, the spectral band replication functionality is optional.

In an example embodiment, the at least one processing component further includes a waveform coding stage, which is described in greater detail below under the multi-channel coding section.

In an example embodiment, the audio processing system is operable to provide a downmix signal suitable for legacy playback equipment. More precisely, a stereo downmix signal is obtained by adding surround channel content in-phase to the first channel in the downmix signal and by adding phase-shifted (e.g., by 90 degrees) surround channel content to the second channel. This allows the playback equipment to derive the surround channel content by a combined reverse phase-shift and subtraction operation. The downmix signal may be acceptable for playback equipment configured to accept a left-total/right-total downmix signal. Preferably, the phase-shift functionality is not a default setting of the audio processing system but can be deactivated when the audio processing system prepares a downmix signal not intended for playback equipment of this type. Indeed, there are known special content types that reproduce poorly with phase-shifted surround signals; in particular, sound recorded from a source with limited spatial extent that is subsequently panned between a left front and a left surround signal will not, as expected, be perceived as located between the corresponding left front and left surround speakers but will according to many listeners not be associated with a well-defined spatial location. This artefact can be avoided by implementing the surround channel phase shift as an optional, non-default functionality.

In an example embodiment, the front-end component comprises a predictor, a spectrum decoder, an adding unit and an inverse flattening unit. These elements, which enhance the performance of the system when it processed voice-type signals, will be described in greater detail below under the heading voice mode coding.

In an example embodiment, the audio processing system further comprises an Lfe decoder for preparing at least one additional channel based on information in the audio bitstream. Preferably, the Lfe decoder provides a low-frequency effects channel which is waveform-coded, separately from the other channels carried by the audio bitstream. If the additional channel is coded discretely with the other channels of the reconstructed audio signal, the corresponding processing path can be independent from the rest of the audio processing system. It is understood that each additional channel adds to the total number of channels in the reconstructed audio signal; for instance, in a use case where a parametric upmix stage—if such is provided—operates in a N=5 mode and where there is one additional channel, the total number of channels in the reconstructed audio signal will be N+1=6.

Further example embodiments provide a method including steps corresponding to the operations performed by the above audio processing system when in use, and a computer program product for causing a programmable computer to perform such method.

The inventive concept further relates to an encoder-type audio processing system for encoding an audio signal into an audio bitstream having a format suitable for decoding in the (decoder-type) audio processing system described hereinabove. The first inventive concept further encompasses encoding methods and computer program products for preparing an audio bitstream.

FIG. 1 shows an audio processing system 100 in accordance with an example embodiment. A core decoder 101 receives an audio bitstream and outputs, at least, quantized spectral coefficients, which are supplied to a front-end component comprising an dequantization stage 102 and an inverse transform stage 103. The front-end component may be of a dual-mode type in some example embodiments. In those embodiments, it can be operated selectively in a general-purpose audio mode and a specific audio mode (e.g., a voice mode). Downstream of the front-end component, a processing stage is delimited, at its upstream end, by an analysis filterbank 104 and, at its downstream end, by a synthesis filterbank 108. Components arranged between the analysis filterbank 104 and the synthesis filterbank 108 perform frequency-domain processing. In the embodiment of the first concept shown in FIG. 1, these components include:

- a companding component 105;
- a combined component 106 for high frequency reconstruction, parametric stereo and upmixing; and
- a dynamic range control component 107.

The component 106 may for example perform upmixing as described below in the Stereo coding section of the present description.

Downstream of the processing stage, the audio processing system 100 further comprises a sample rate converter 109 configured to provide a reconstructed audio signal sampled at a target sampling frequency.

At the downstream end, the system 100 may optionally include a signal-limiting component (not shown) responsible for fulfilling a non-clip condition.

Further, optionally, the system 100 may comprise a parallel processing path for providing one or more additional channels (e.g., a low-frequency effects channel). The parallel processing path may be implemented as a Lfe decoder (not shown in any of FIGS. 1 and 3-11) which receives the audio bitstreams or a portion thereof and which is arranged to insert the additional channel(s) thus prepared into the reconstructed audio signal; the insertion point may be immediately upstream of the sample rate converter 109.

Figure 2:
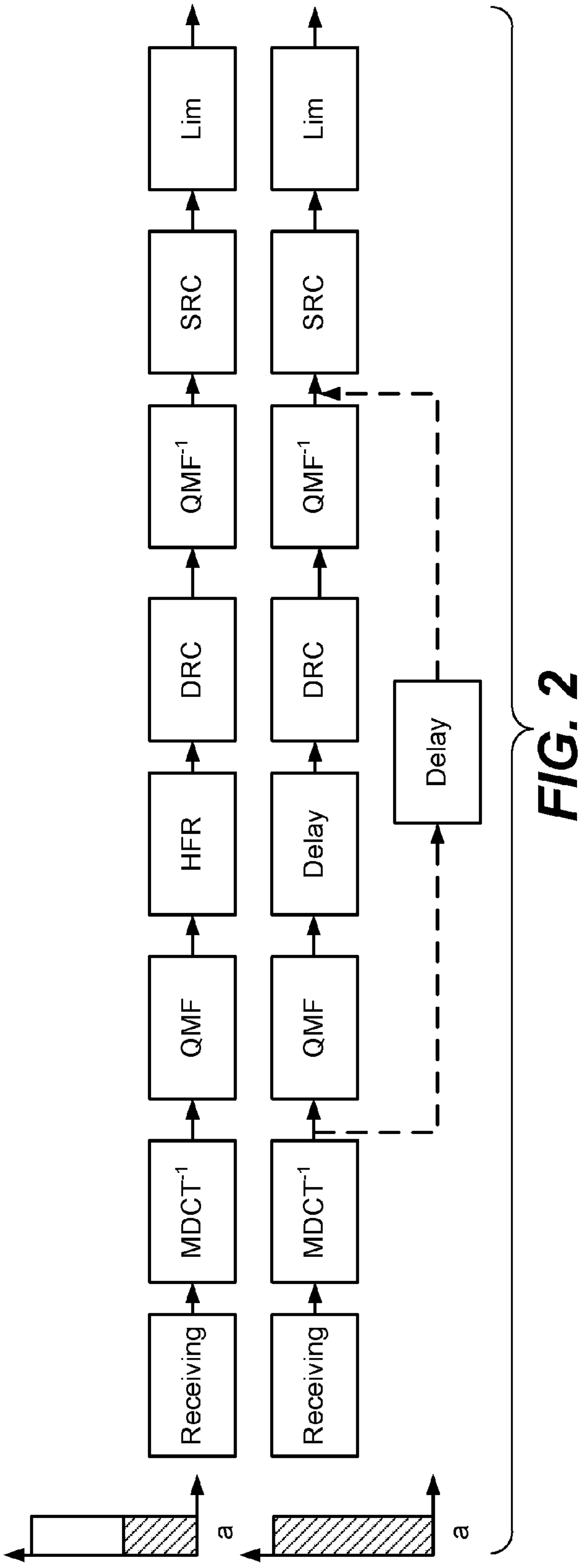
FIG. 2 shows processing paths for two different mono decoding modes of the audio processing system.

FIG. 2 illustrates two mono decoding modes of the audio processing system shown in FIG. 1 with corresponding labelling. More precisely, FIG. 2 shows those system components which are active during decoding and which form the processing path for preparing the reconstructed (mono) audio signal based on the audio bitstream. It is noted that the processing paths in FIG. 2 further include a final signal-limiting component ("Lim") arranged to downscale signal values to meet a non-clip condition. The upper decoding mode in FIG. 2 uses high-frequency reconstruction, whereas the lower decoding mode in FIG. 2 decodes a completely waveform-coded channel. In the lower decoding mode, therefore, the high-frequency reconstruction component ("HFR") has been replaced by a delay stage ("Delay") incurring a delay equal to the algorithmic delay of the HFR component.

As the lower part of FIG. 2 suggests, it is further possible to bypass the processing stage ("QMF", "Delay", "DRC", "$QMF^{-1}$") altogether; this may be applicable when no dynamic range control (DRC) processing is performed on the signal. Bypassing the processing stage eliminates any potential deterioration of the signal due to the QMF analysis followed by the QMF synthesis, which may involve non-perfect reconstruction. The bypass line includes a second delay line stage configured to delay the signal by an amount equal to the total (algorithmic) delay of the processing stage.

Figure 3:
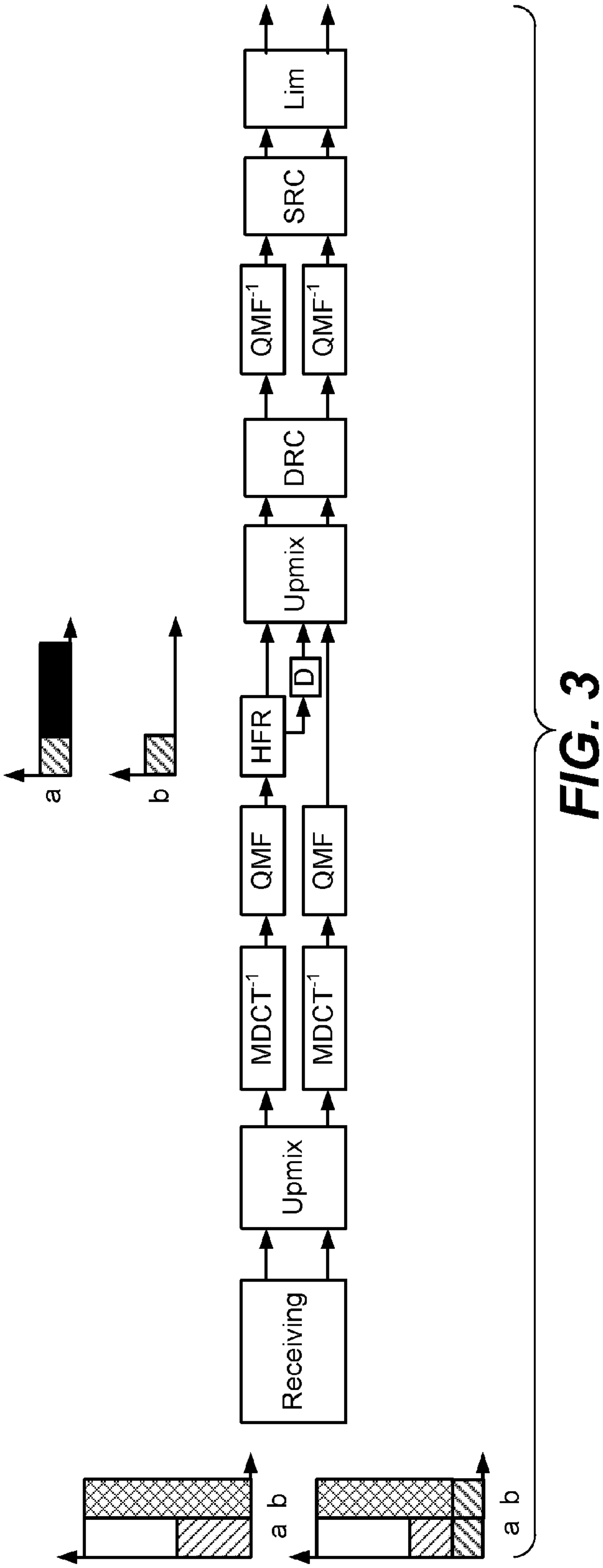
FIG. 3 shows processing paths for two different parametric stereo decoding modes, one without and one including post-upmix augmentation by waveform-coded low-frequency content.

FIG. 3 illustrates two parametric stereo decoding modes. In both modes, the stereo channels are obtained by applying high-frequency reconstruction to a first channel, producing a decorrelated version of this using a decorrelator ("D"), and then forming a linear combination of both to obtain a stereo signal. The linear combination is computed by the upmix stage ("Upmix") arranged upstream of the DRC stage. In one of the modes—the one shown in the lower portion of the drawing—the audio bitstream additionally carries waveform-coded low-frequency content for both channels (area hatched by "\ \ \"). The implementation details of the latter mode is described by FIGS. 7-10 and corresponding sections of the present description.

Figure 4:
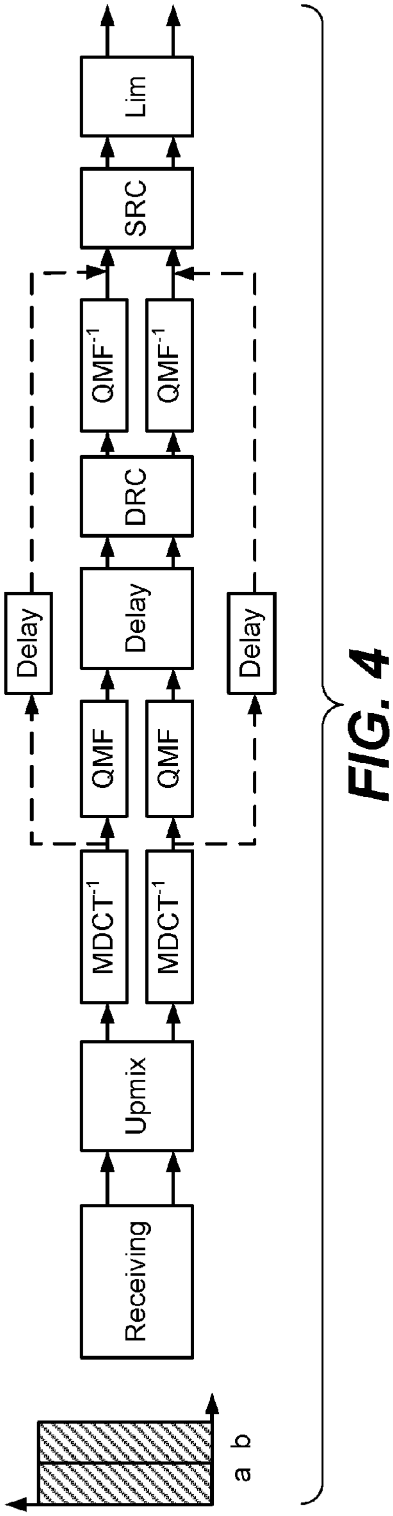
FIG. 4 shows a processing path for a decoding mode in which the audio processing system processes an entirely waveform-coded stereo signal with discretely coded channels.

FIG. 4 illustrates a decoding mode in which the audio processing system processes an entirely waveform-coded stereo signal with discretely coded channels. This is a high-bitrate stereo mode. If DRC processing is not deemed necessary, the processing stage can be bypassed altogether, using the two bypass lines with respective delay stages shown in FIG. 4. The delay stages preferably incur a delay equal to that of the processing stage when in other decoding modes, so that mode switching may happen continuously with respect to the signal content.

Figure 5:
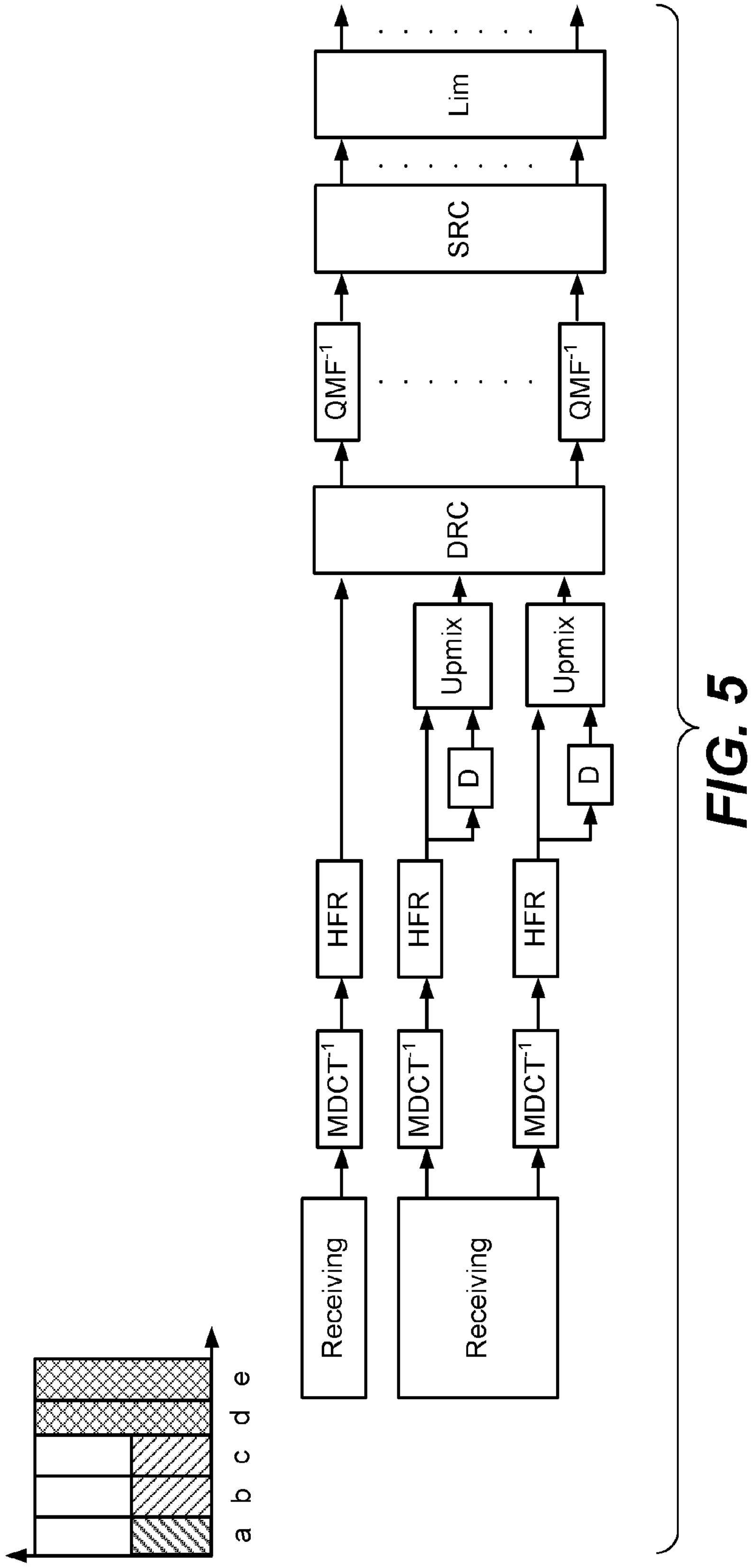
FIG. 5 shows a processing path for a decoding mode in which the audio processing system provides a five-channel signal by parametrically upmixing a three-channel downmix signal after applying spectral band replication.

FIG. 5 illustrates a decoding mode in which the audio processing system provides a five-channel signal by parametrically upmixing a three-channel downmix signal after applying spectral band replication. As already mentioned, it is advantageous to code two of the channels (area hatched by "/ / /") jointly (e.g., as a channel pair element) and the audio processing system is preferably designed to handle a bitstream with this property. For this purpose, the audio processing system comprises two receiving sections, the lower being configured to decode the channel pair element and the upper to decode the remaining channel (area hatched by "\ \ \"). After high-frequency reconstruction in the QMF domain, each channel of the channel pair is decorrelated separately, after which a first upmix stage forms a first linear combination of a first channel and a decorrelated version thereof and a second upmix stage forms a second linear combination of the second channel and a decorrelated version thereof. The implementation details of this processing are described by FIGS. 7-10 and corresponding sections of the present description. The total of five channels is then subjected to DRC processing before QMF synthesis.

Audio Mode Coding

Figure 6:
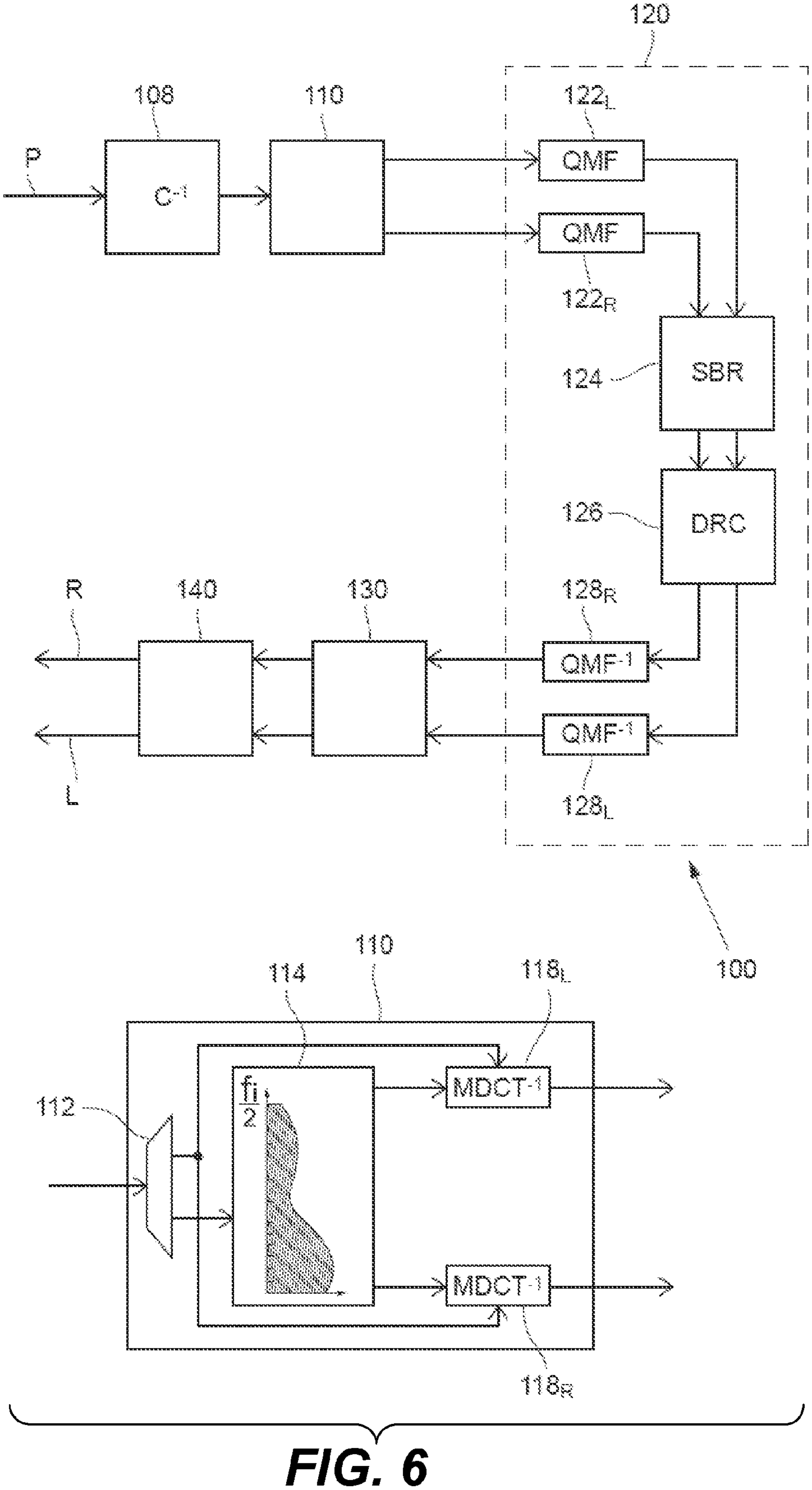
FIG. 6 shows the structure of an audio processing system according to an example embodiment as well as the inner workings of a component in the system.

FIG. 6 is a generalized block diagram of an audio processing system 100 receiving an encoded audio bitstream P and with a reconstructed audio signal, shown as a pair of stereo baseband signals L, R in FIG. 6, as its final output. In this example it will be assumed that the bitstream P comprises quantized, transform-coded two-channel audio data. The audio processing system 100 may receive the audio bitstream P from a communication network, a wireless receiver or a memory (not shown). The output of the system 100 may be supplied to loudspeakers for playback, or may be re-encoded in the same or a different format for further transmission over a communication network or wireless link, or for storage in a memory.

The audio processing system 100 comprises a decoder 108 for decoding the bitstream P into quantized spectral coefficients and control data. A front-end component 110, the structure of which will be discussed in greater detail below, dequantizes these spectral coefficients and supplies a time-domain representation of an intermediate audio signal to be processed by the processing stage 120. The intermediate audio signal is transformed by analysis filterbanks 122$_L$, 122$_R$ into a second frequency domain, different from the one associated with the coding transform previously mentioned; the second frequency-domain representation may be a quadrature mirror filter (QMF) representation, in which case the analysis filterbanks 122$_L$, 122$_R$ may be provided as QMF filterbanks Downstream of the analysis filterbanks 122$_L$, 122$_R$, a spectral band replication (SBR) module 124 responsible for high-frequency reconstruction and a dynamic range control (DRC) module 126 process the second frequency-domain representation of the intermediate audio signal. Downstream thereof, synthesis filterbanks 128$_L$, 128$_R$ produce a time-domain representation of the audio signal thus processed. As the skilled person will realize after studying this disclosure, neither the spectral band replication module 124 nor the dynamic range control module 126 are necessary elements of the invention; to the contrary, an audio processing system according to a different example embodiment may include additional or alternative modules within the processing stage 120. Downstream of the processing stage 120, a sample rate converter 130 is operable to adjust the sampling rate of the processed audio signal into a desired audio sampling rate, such as 44.1 kHz or 48 kHz, for which the intended playback equipment (not shown) is designed. It is known per se in the art how to design a sample rate converter 130 with a low amount of artefacts in the output. The sample rate converter 130 may be deactivated at times where sampling rate conversion is not needed—that is, where the processing stage 120 supplies a processed audio signal that already has the target sampling frequency. An optional signal limiting module 140 arranged downstream of the sample rate converter 130 is configured to limit baseband signal values as needed, in accordance with a no-clip condition, which may again be chosen in view of particular intended playback equipment.

As shown in the lower portion of FIG. 6, the front-end component 110 comprises a dequantization stage 114, which can be operated in one of several modes with different block sizes, and an inverse transform stage 118$_L$, 118$_R$, which can operate on different block sizes too. Preferably, the mode changes of the dequantization stage 114 and the inverse transform stage 118$_L$, 118$_R$ are synchronous, so that the block size matches at all points in time. Upstream of these components, the front-end component 110 comprises a demultiplexer 112 for separating the quantized spectral coefficients from the control data; typically, it forwards the control data to the inverse transform stage 118$_L$, 118$_R$ and forwards the quantized spectral coefficients (and optionally, the control data) to the dequantization stage 114. The dequantization stage 114 performs a mapping from one frame of quantization indices (typically represented as integers) to one frame of spectral coefficients (typically represented as floating-point numbers). Each quantization index is associated with a quantization level (or reconstruction point). Assuming that the audio bitstream has been prepared using non-uniform quantization, as discussed above, the association is not unique unless it is specified what frequency band the quantization index refers to. Put differently, the dequantization process may follow a different codebook for each frequency band, and the set of codebooks may vary as a function of the frame length and/or bitrate. In FIG. 6, this is schematically illustrated, wherein the vertical axis denotes frequency and the horizontal axis denotes the allocated amount of coding bits per unit frequency. Note that the frequency bands are typically wider for higher frequencies and end at one half of the internal sampling frequency $f_i$. The internal sampling frequency may be mapped to a numerically different physical sampling frequency as a result of the resampling in the sample rate converter 130; for instance, an upsampling by 4.3% will map $f_i$=46.034 kHz to the approximate physical frequency 48 kHz and will increase the lower frequency band boundaries by the same factor. As FIG. 6 further suggests, the encoder preparing the audio bitstream typically allocates different amounts of coding bits to different frequency bands, in accordance with the complexity of the coded signal and expected sensitivity variations of the human hearing sense.

Quantitative data characterizing the operating modes of the audio processing system 100, and particularly the front-end component 110, are given in table 1.

resampling factor—chosen to match the quotient of the target external sampling frequency and the internal sampling frequency—to ensure that each frame of the processed audio signal will contain a number of samples corresponding to a target external sampling frequency of 48 kHz in physical units.

TABLE 1

Example operating modes a-m of audio processing system

| Mode | Frame rate [Hz] | Frame duration [ms] | Frame length in front-end component [samples] | Bin width in front-end component [Hz] | Internal sampling frequency [kHz] | Analysis filterbank [bands] | Width of analysis frequency band [Hz] | SRC factor | External sampling frequency [kHz] |
|---|---|---|---|---|---|---|---|---|---|
| A | 23.976 | 41.708 | 1920 | 11.988 | 46.034 | 64 | 359.640 | 0.9590 | 48.000 |
| B | 24.000 | 41.667 | 1920 | 12.000 | 46.080 | 64 | 360.000 | 0.9600 | 48.000 |
| C | 24.975 | 40.040 | 1920 | 12.488 | 47.952 | 64 | 374.625 | 0.9990 | 48.000 |
| D | 25.000 | 40.000 | 1920 | 12.500 | 48.000 | 64 | 375.000 | 1.0000 | 48.000 |
| E | 29.970 | 33.367 | 1536 | 14.985 | 46.034 | 64 | 359.640 | 0.9590 | 48.000 |
| F | 30.000 | 33.333 | 1536 | 15.000 | 46.080 | 64 | 360.000 | 0.9600 | 48.000 |
| G | 47.952 | 20.854 | 960 | 23.976 | 46.034 | 64 | 359.640 | 0.9590 | 48.000 |
| H | 48.000 | 20.833 | 960 | 24.000 | 46.080 | 64 | 360.000 | 0.9600 | 48.000 |
| I | 50.000 | 20.000 | 960 | 25.000 | 48.000 | 64 | 375.000 | 1.0000 | 48.000 |
| J | 59.940 | 16.683 | 768 | 29.970 | 46.034 | 64 | 359.640 | 0.9590 | 48.000 |
| K | 60.000 | 16.667 | 768 | 30.000 | 46.080 | 64 | 360.000 | 0.9600 | 48.000 |
| l | 120.000 | 8.333 | 384 | 60.000 | 46.080 | 64 | 360.000 | 0.9600 | 48.000 |
| M | 25.000 | 40.000 | 3840 | 12.500 | 96.000 | 128 | 375.000 | 1.0000 | 96.000 |

The three emphasized columns in table 1 contain values of controllable quantities, whereas the remaining quantities may be regarded as dependent on these. It is furthermore noted that the ideal values of the resampling (SRC) factor are (24/25)×(1000/1001)≈0.9560, 24/25=0.96 and 1000/1001≈0.9990. The SRC factor values listed in table 1 are rounded, as are the frame rate values. The resampling factor 1.000 is exact and corresponds to the SRC 130 being deactivated or entirely absent. In example embodiments, the audio processing system 100 is operable in at least two modes with different frame lengths, one or more of which may coincide with the entries in table 1.

Modes a-d, in which the frame length of the front-end component is set to 1920 samples, are used for handling (audio) frame rates 23.976, 24.000, 24.975 and 25.000 Hz, selected to exactly match video frame rates of widespread coding formats. Because of the different frame lengths, the internal sampling frequency (frame rate×frame length) will vary from about 46.034 kHz to 48.000 kHz in modes a-d; assuming critical sampling and evenly spaced frequency bins, this will correspond to bin width values in the range from 11.988 Hz to 12.500 Hz (half internal sampling frequency/frame length). Because the variation in internal sampling frequencies is limited (it is about 5%, as a consequence of the range of variation of the frame rates being about 5%), it is judged that the audio processing system 100 will deliver a reasonable output quality in all four modes a-d despite the non-exact matching of the physical sampling frequency for which incoming audio bitstream was prepared.

Continuing downstream of the front-end component 110, the analysis (QMF) filterbank 122 has 64 bands, or 30 samples per QMF frame, in all modes a-d. In physical terms, this will correspond to a slightly varying width of each analysis frequency band, but the variation is again so limited that it can be neglected; in particular, the SBR and DRC processing modules 124, 126 may be agnostic about the current mode without detriment to the output quality. The SRC 130 however is mode dependent, and will use a specific In each of the modes a-d, the audio processing system 100 will exactly match both the video frame rate and the external sampling frequency. The audio processing system 100 may then handle the audio parts of multimedia bitstreams T1 and T2, where audio frames A11, A12, A13, . . . ; A22, A23, A24, . . . and video frames V11, V12, V13, . . . ; V22, V23, V24 coincide in time within each stream. It is then possible to improve the synchronicity of the streams T1, T2 by deleting an audio frame and an associated video frame in the leading stream. Alternatively, an audio frame and an associated video frame in the lagging stream are duplicated and inserted next to the original position, possibly in combination with interpolation measures to reduce perceptible artefacts.

Modes e and f, intended to handle frame rates 29.97 Hz and 30.00 Hz, can be discerned as a second subgroup. As already explained, the quantization of the audio data is adapted (or optimized) for an internal sampling frequency of about 48 kHz. Accordingly, because each frame is shorter, the frame length of the front-end component 110 is set to the smaller value 1536 samples, so that internal sampling frequencies of about 46.034 and 46.080 kHz result. If the analysis filterbank 122 is mode-independent with 64 frequency bands, each QMF frame will contain 24 samples.

Similarly, frame rates at or around 50 Hz and 60 Hz (corresponding to twice the refresh rate in standardized television formats) and 120 Hz are covered by modes g-i (frame length 960 samples), modes j-k (frame length 768 samples) and mode l (frame length 384 samples), respectively. It is noted that the internal sampling frequency stays close to 48 kHz in each case, so that any psychoacoustic tuning of the quantization process by which the audio bitstream was produced will remain at least approximately valid. The respective QMF frame lengths in a 64-band filterbank will be 15, 12 and 6 samples.

As mentioned, the audio processing system 100 may be operable to subdivide audio frames into shorter subframes; a reason for doing this may be to capture audio transients more efficiently. For a 48 kHz sampling frequency and the settings given in table 1, below tables 2-4 show the bin widths and frame lengths resulting from subdivision into 2, 4, 8 and 16 subframes. It is believed that the settings according to table 1 achieve an advantageous balance of time and frequency resolution.

TABLE 2

| Time/frequency resolution at frame length 2048 samples | Number of subframes | | | | |
|---|---|---|---|---|---|
| | 1 | 2 | 4 | 8 | 16 |
| Number of bins | 2048 | 1024 | 512 | 256 | 128 |
| Bin width [Hz] | 11.72 | 23.44 | 46.88 | 93.75 | 187.50 |
| Frame duration [ms] | 42.67 | 21.33 | 10.67 | 5.33 | 2.67 |

TABLE 3

| Time/frequency resolution at frame length 1920 samples | Number of subframes | | | | |
|---|---|---|---|---|---|
| | 1 | 2 | 4 | 8 | 16 |
| Number of bins | 1920 | 960 | 480 | 240 | 120 |
| Bin width [Hz] | 12.50 | 25.00 | 50.00 | 100.00 | 200.00 |
| Frame duration [ms] | 40.00 | 20.00 | 10.00 | 5.00 | 2.50 |

TABLE 4

| Time/frequency resolution at frame length 1536 samples | Number of subframes | | | | |
|---|---|---|---|---|---|
| | 1 | 2 | 4 | 8 | 16 |
| Number of bins | 1536 | 768 | 384 | 192 | 96 |
| Bin width [Hz] | 15.63 | 31.25 | 62.50 | 125.00 | 250.00 |
| Frame duration [ms] | 32.00 | 16.00 | 8.00 | 4.00 | 2.00 |

Decisions relating to subdivision of a frame may be taken as part of the process of preparing the audio bitstream, such as in an audio encoding system (not shown). As illustrated by mode m in table 1, the audio processing system 100 may be further enabled to operate at an increased external sampling frequency of 96 kHz and with 128 QMF bands, corresponding to 30 samples per QMF frame. Because the external sampling frequency incidentally coincides with the internal sampling frequency, the SRC factor is unity, corresponding to no resampling being necessary.

Multi-Channel Coding

As used in this section, an audio signal may be a pure audio signal, an audio part of an audiovisual signal or multimedia signal or any of these in combination with metadata.

As used in this section, downmixing of a plurality of signals means combining the plurality of signals, for example by forming linear combinations, such that a lower number of signals is obtained. The reverse operation to downmixing is referred to as upmixing that is, performing an operation on a lower number of signals to obtain a higher number of signals.

Figure 7:
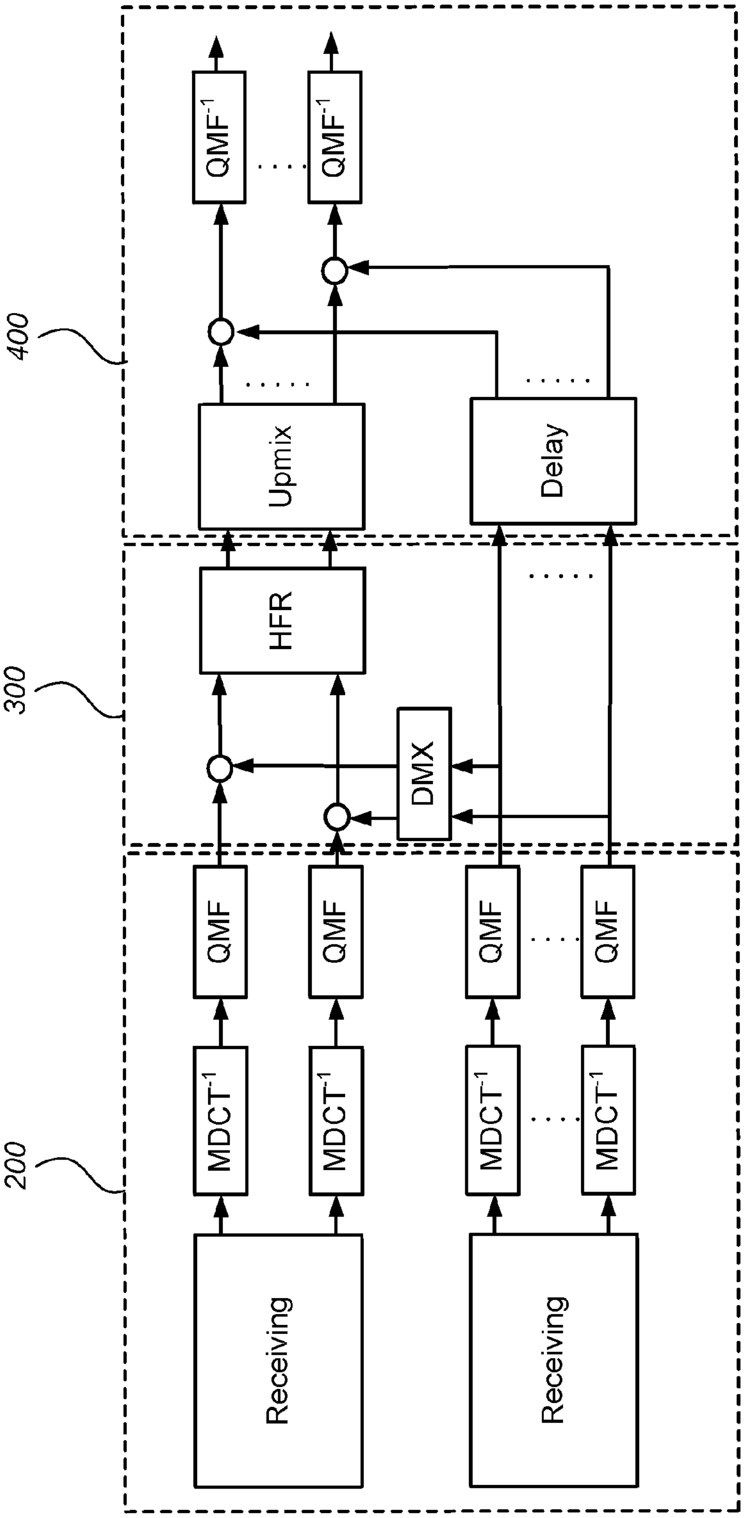
FIG. 7 is a generalized block diagram of a decoding system in accordance with an example embodiment.

FIG. 7 is a generalized block diagram of a decoder 100 in a multi-channel audio processing system for reconstructing M encoded channels. The decoder 100 comprises three conceptual parts 200, 300, 400 that will be explained in greater detail in conjunction with FIG. 17-19 below. In first conceptual part 200, the encoder receives N waveform-coded downmix signals and M waveform-coded signals representing the multi-channel audio signal to be decoded, wherein 1<N<M. In the illustrated example, N is set to 2. In the second conceptual part 300, the M waveform-coded signals are downmixed and combined with the N waveform-coded downmix signals. High frequency reconstruction (HFR) is then performed for the combined downmix signals. In the third conceptual part 400, the high frequency reconstructed signals are upmixed, and the M waveform-coded signals are combined with the upmix signals to reconstruct M encoded channels.

Figure 8:
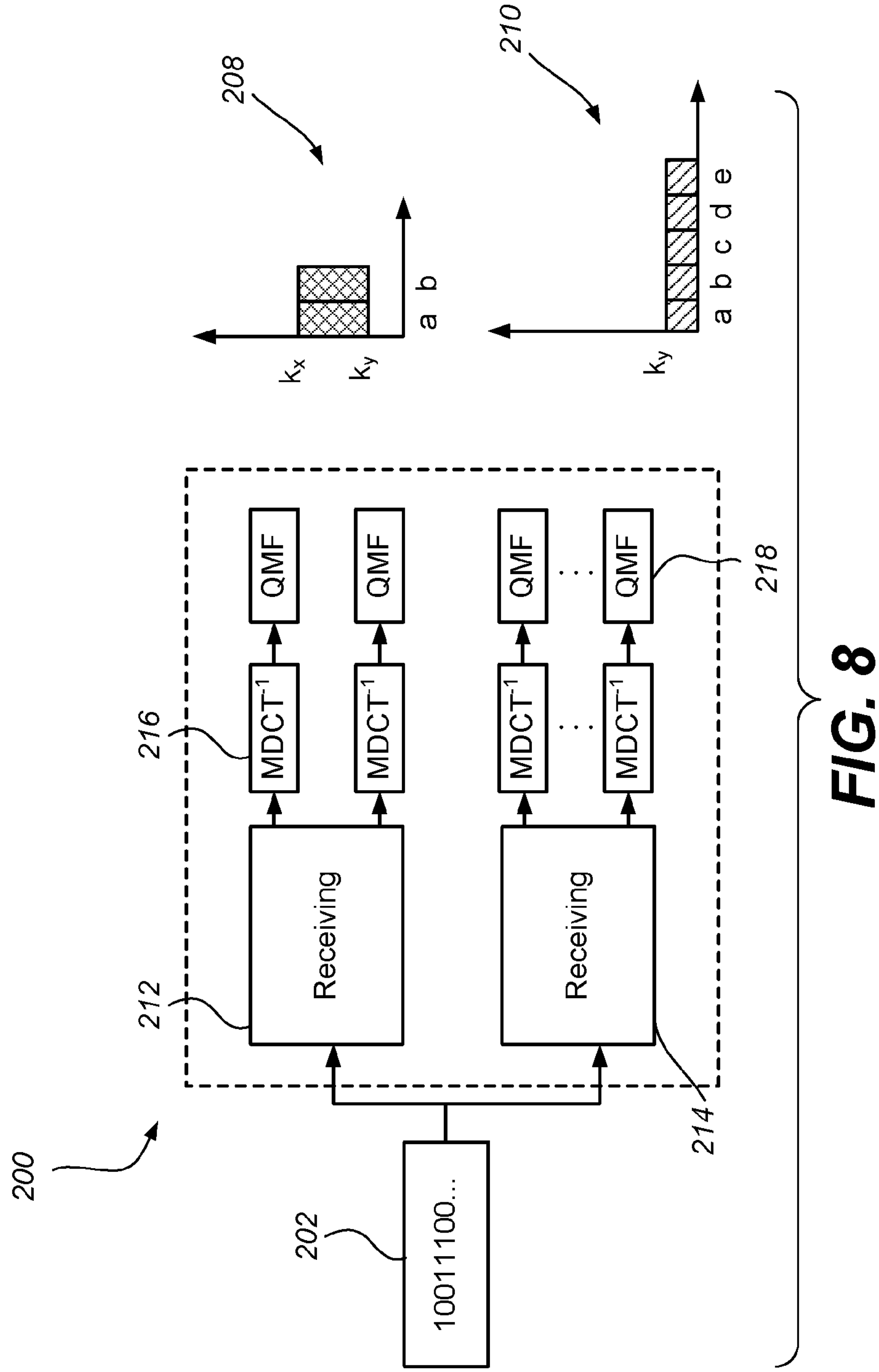
FIG. 8 illustrates a first part of the decoding system in FIG. 7.
Figure 9:
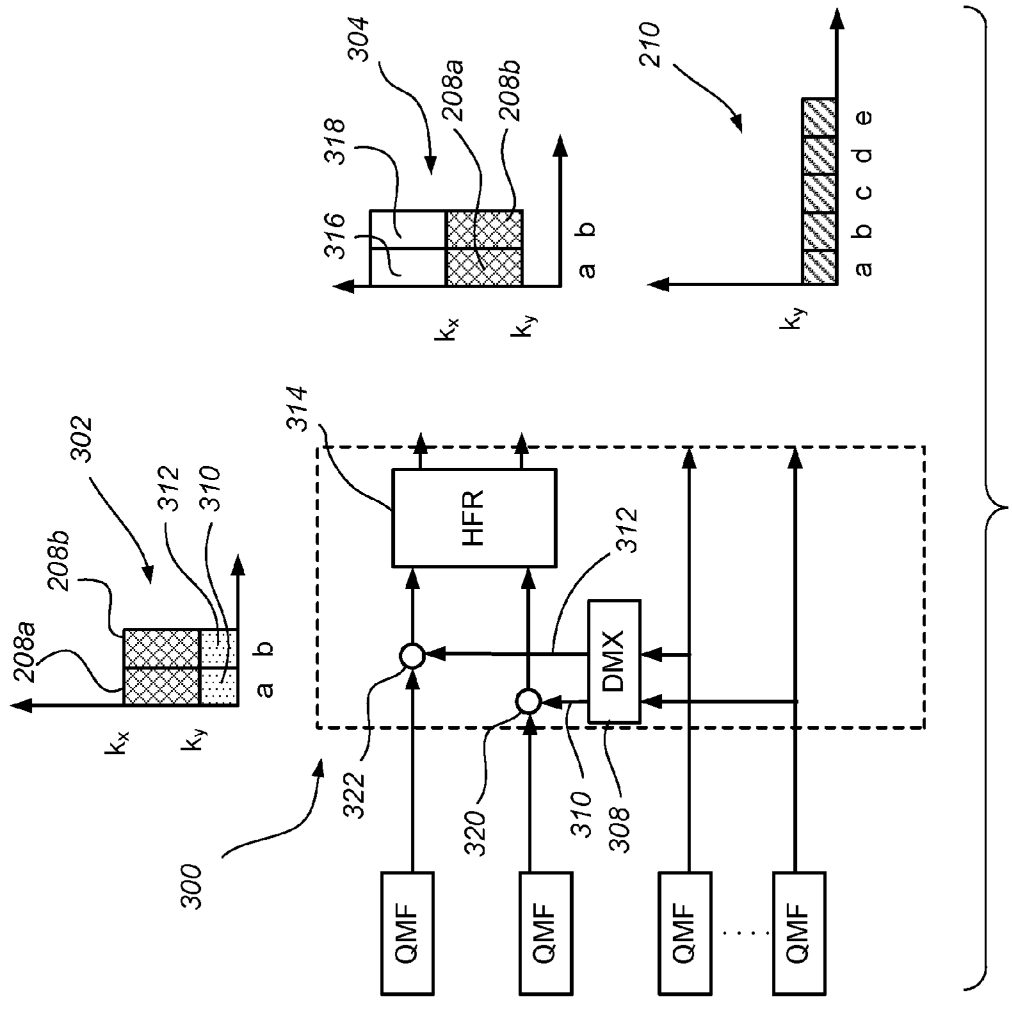
FIG. 9 illustrates a second part of the decoding system in FIG. 7.
Figure 10:
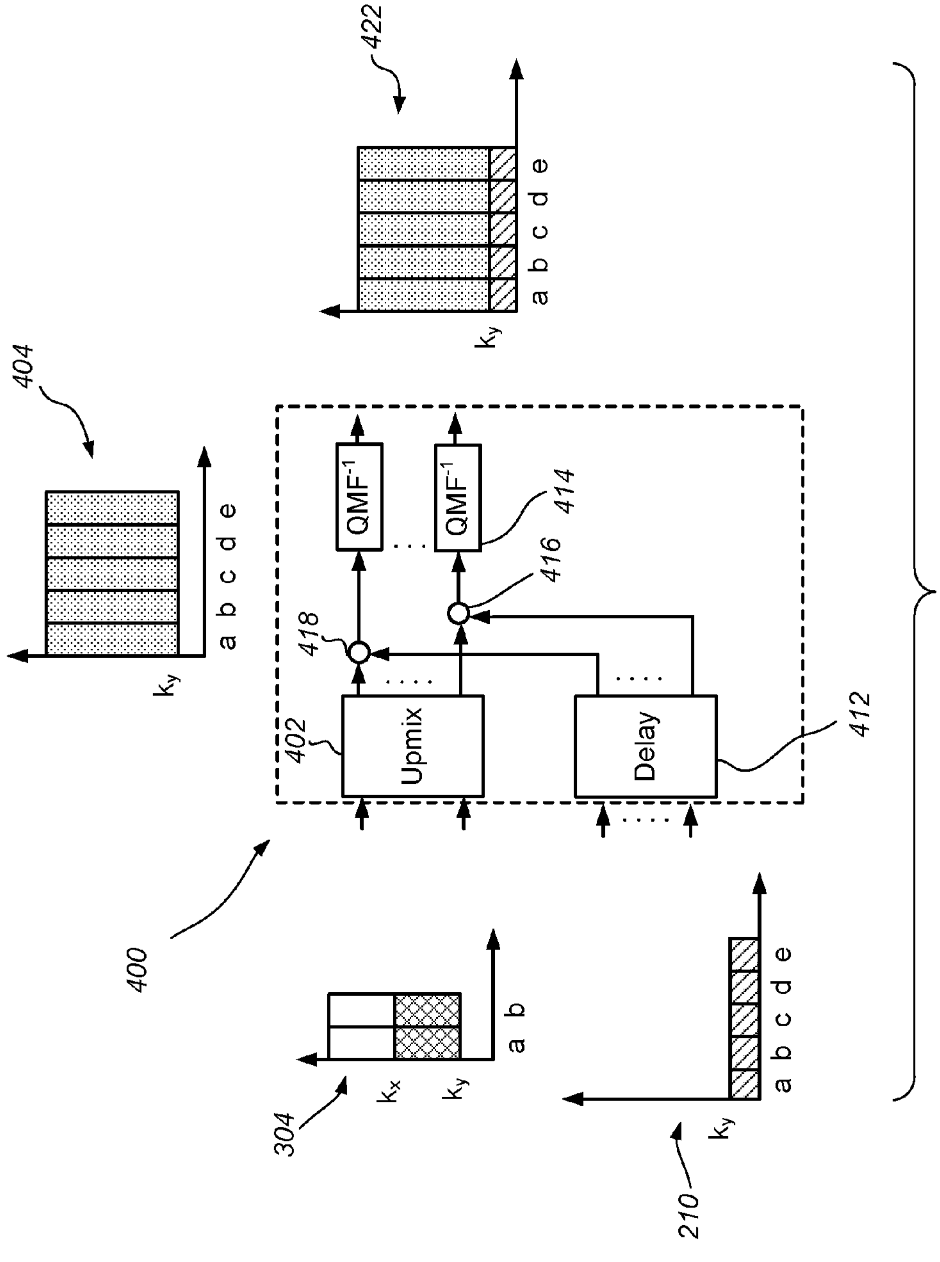
FIG. 10 illustrates a third part of the decoding system in FIG. 7.

In the exemplary embodiment described in conjunction with FIGS. 8-10, the reconstruction of an encoded 5.1 surround sound is described. It may be noted that the low frequency effect signal is not mentioned in the described embodiment or in the drawings. This does not mean that any low frequency effects are neglected. The low frequency effects (Lfe) are added to the reconstructed 5 channels in any suitable way well known by a person skilled in the art. It may also be noted that the described decoder is equally well suited for other types of encoded surround sound such as 7.1 or 9.1 surround sound.

FIG. 8 illustrates the first conceptual part 200 of the decoder 100 in FIG. 7. The decoder comprises two receiving stages 212, 214. In the first receiving stage 212, a bit-stream 202 is decoded and dequantized into two waveform-coded downmix signals 208*a-b*. Each of the two waveform-coded downmix signals 208*a-b* comprises spectral coefficients corresponding to frequencies between a first cross-over frequency $k_y$ and a second cross-over frequency $k_x$.

In the second receiving stage 214, the bit-stream 202 is decoded and dequantized into five waveform-coded signals 210*a-e*. Each of the five waveform-coded downmix signals 210*a-e* comprises spectral coefficients corresponding to frequencies up to the first cross-over frequency $k_x$.

By way of example, the signals 210*a-e* comprise two channel pair elements and one single channel element for the centre channel. The channel pair elements may for example be a combination of the left front and left surround signal and a combination of the right front and the right surround signal. A further example is a combination of the left front and the right front signals and a combination of the left surround and right surround signal. These channel pair elements may for example be coded in a sum-and-difference format. All five signals 210*a-e* may be coded using overlapping windowed transforms with independent windowing and still be decodable by the decoder. This may allow for an improved coding quality and thus an improved quality of the decoded signal.

By way of example, the first cross-over frequency $k_y$ is 1.1 kHz. By way of example, the second cross-over frequency $k_x$ lies within the range of is 5.6-8 kHz. It should be noted that the first cross-over frequency $k_y$ can vary, even on an individual signal basis, i.e. the encoder can detect that a signal component in a specific output signal may not be faithfully reproduced by the stereo downmix signals 208*a-b* and can for that particular time instance increase the bandwidth, i.e. the first cross-over frequency $k_y$, of the relevant waveform coded signal, i.e. 210*a-e*, to do proper waveform coding of the signal component.

As will be described later on in this description, the remaining stages of the encoder 100 typically operates in the Quadrature Mirror Filters (QMF) domain. For this reason, each of the signals 208*a-b*, 210*a-e* received by the first and second receiving stage 212, 214, which are received in a modified discrete cosine transform (MDCT) form, are transformed into the time domain by applying an inverse MDCT 216. Each signal is then transformed back to the frequency domain by applying a QMF transform 218.

In FIG. 9, the five waveform-coded signals 210 are downmixed to two downmix signals 310, 312 comprising spectral coefficients corresponding to frequencies up to the first cross-over frequency $k_y$ at a downmix stage 308. These downmix signals 310, 312 may be formed by performing a downmix on the low pass multi-channel signals 210*a-e* using the same downmixing scheme as was used in an encoder to create the two downmix signals 208*a-b* shown in FIG. 8.

The two new downmix signals 310, 312 are then combined in a first combing stage 320, 322 with the corresponding downmix signal 208*a-b* to form a combined downmix signals 302*a-b*. Each of the combined downmix signals 302*a-b* thus comprises spectral coefficients corresponding to frequencies up to the first cross-over frequency $k_y$ originating from the downmix signals 310, 312 and spectral coefficients corresponding to frequencies between the first cross-over frequency $k_y$ and the second cross-over frequency $k_x$ originating from the two waveform-coded downmix signals 208*a-b* received in the first receiving stage 212 (shown in FIG. 8).

The encoder further comprises a high frequency reconstruction (HFR) stage 314. The HFR stage is configured to extend each of the two combined downmix signals 302*a-b* from the combining stage to a frequency range above the second cross-over frequency $k_x$ by performing high frequency reconstruction. The performed high frequency reconstruction may according to some embodiments comprise performing spectral band replication, SBR. The high frequency reconstruction may be done by using high frequency reconstruction parameters which may be received by the HFR stage 314 in any suitable way.

The output from the high frequency reconstruction stage 314 is two signals 304*a-b* comprising the downmix signals 208*a-b* with the HFR extension 316, 318 applied. As described above, the HFR stage 314 is performing high frequency reconstruction based on the frequencies present in the input signal 210*a-e* from the second receiving stage 214 (shown in FIG. 8) combined with the two downmix signals 208*a-b*. Somewhat simplified, the HFR range 316, 318 comprises parts of the spectral coefficients from the downmix signals 310, 312 that has been copied up to the HFR range 316, 318. Consequently, parts of the five waveform-coded signals 210*a-e* will appear in the HFR range 316, 318 of the output 304 from the HFR stage 314.

It should be noted that the downmixing at the downmixing stage 308 and the combining in the first combining stage 320, 322 prior to the high frequency reconstruction stage 314, can be done in the time-domain, i.e. after each signal has transformed into the time domain by applying an inverse modified discrete cosine transform (MDCT) 216 (shown in FIG. 8). However, given that the waveform-coded signals 210*a-e* and the waveform-coded downmix signals 208*a-b* can be coded by a waveform coder using overlapping windowed transforms with independent windowing, the signals 210*a-e* and 208*a-b* may not be seamlessly combined in a time domain. Thus, a better controlled scenario is attained if at least the combining in the first combining stage 320, 322 is done in the QMF domain.

FIG. 10 illustrates the third and final conceptual part 400 of the encoder 100. The output 304 from the HFR stage 314 constitutes the input to an upmix stage 402. The upmix stage 402 creates a five signal output 404*a-e* by performing parametric upmix on the frequency extended signals 304*a-b*. Each of the five upmix signals 404*a-e* corresponds to one of the five encoded channels in the encoded 5.1 surround sound for frequencies above the first cross-over frequency $k_y$. According to an exemplary parametric upmix procedure, the upmix stage 402 first receives parametric mixing parameters. The upmix stage 402 further generates decorrelated versions of the two frequency extended combined downmix signals 304*a-b*. The upmix stage 402 further subjects the two frequency extended combined downmix signals 304*a-b* and the decorrelated versions of the two frequency extended combined downmix signals 304*a-b* to a matrix operation, wherein the parameters of the matrix operation are given by the upmix parameters. Alternatively, any other parametric upmixing procedure known in the art may be applied. Applicable parametric upmixing procedures are described for example in *"MPEG Surround—The ISO/MPEG Standard for Efficient and Compatible Multichannel Audio Coding"* (Herre et al., Journal of the Audio Engineering Society, Vol. 56, No. 11, 2008 November).

The output 404*a-e* from the upmix stage 402 does thus not comprising frequencies below the first cross-over frequency $k_y$. The remaining spectral coefficients corresponding to frequencies up to the first cross-over frequency $k_y$ exists in the five waveform-coded signals 210*a-e* that has been delayed by a delay stage 412 to match the timing of the upmix signals 404.

The encoder 100 further comprises a second combining stage 416, 418. The second combining stage 416, 418 is configured to combine the five upmix signals 404*a-e* with the five waveform-coded signals 210*a-e* which was received by the second receiving stage 214 (shown in FIG. 8).

It may be noted that any present Lfe signal may be added as a separate signal to the resulting combined signal 422. Each of the signals 422 is then transformed to the time domain by applying an inverse QMF transform 420. The output from the inverse QMF transform 414 is thus the fully decoded 5.1 channel audio signal.

Figure 11:
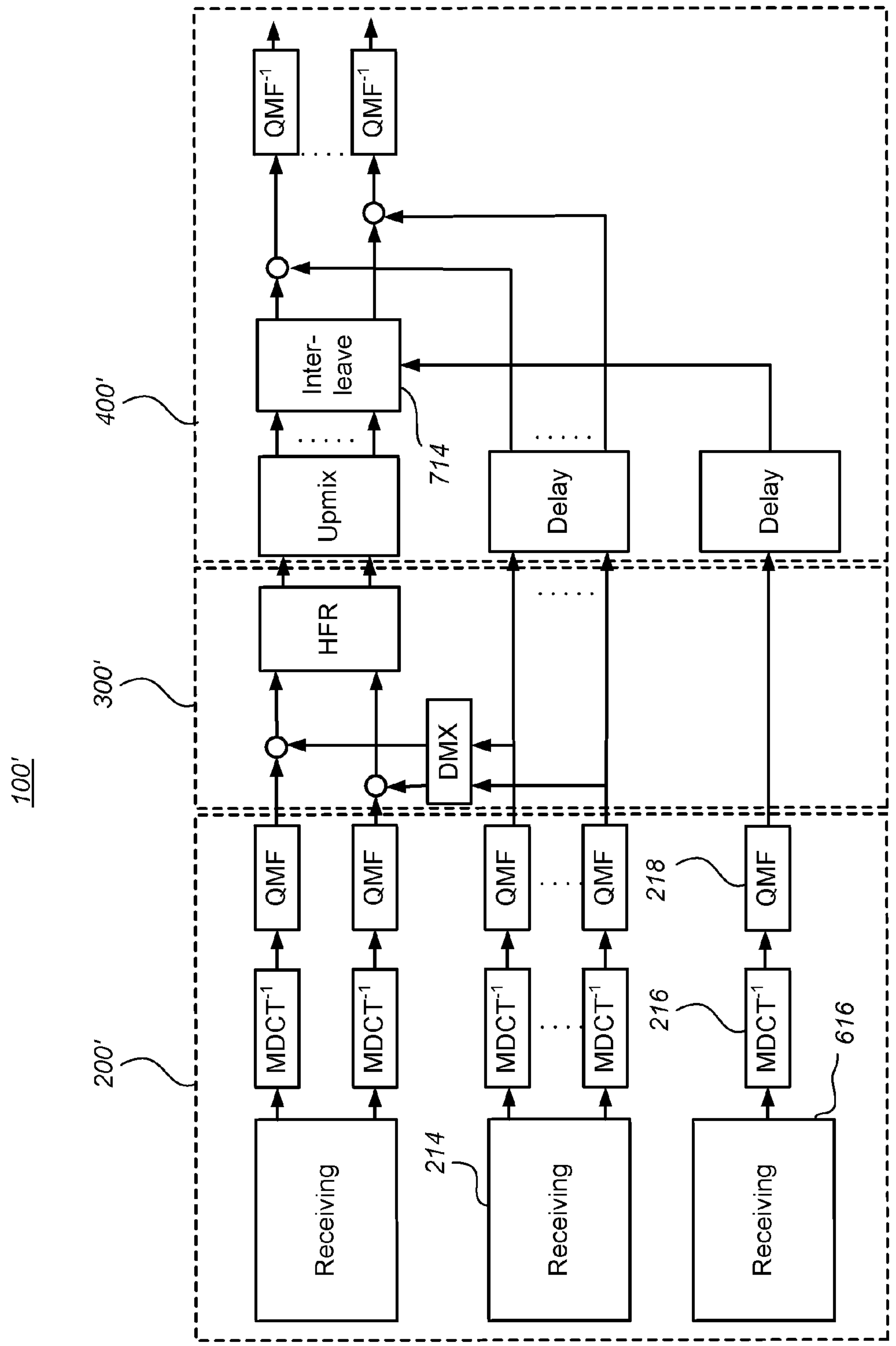
FIG. 11 is a generalized block diagram of a decoding system in accordance with an example embodiment.

FIG. 11 illustrates a decoding system 100' being a modification of the decoding system 100 of FIG. 7. The decoding system 100' has conceptual parts 200', 300', and 400' corresponding to the conceptual parts 100, 200, and 300 of FIG. 16. The difference between the decoding system 100' of FIG. 11 and the decoding system of FIG. 7 is that there is a third receiving stage 616 in the conceptual part 200' and an interleaving stage 714 in the third conceptual part 400'.

The third receiving stage 616 is configured to receive a further waveform-coded signal. The further waveform-coded signal comprises spectral coefficients corresponding to a subset of the frequencies above the first cross-over frequency. The further waveform-coded signal may be transformed into the time domain by applying an inverse MDCT 216. It may then be transformed back to the frequency domain by applying a QMF transform 218.

It is to be understood that the further waveform-coded signal may be received as a separate signal. However, the further waveform-coded signal may also form part of one or more of the five waveform-coded signals 210*a-e*. In other words, the further waveform-coded signal may be jointly coded with one or more of the five waveform-coded signals 201*a-e*, for instance using the same MCDT transform. If so, the third receiving stage 616 corresponds to the second receiving stage, i.e. the further waveform-coded signal is received together with the five waveform-coded signals 210*a-e* via the second receiving stage 214.

Figure 12:
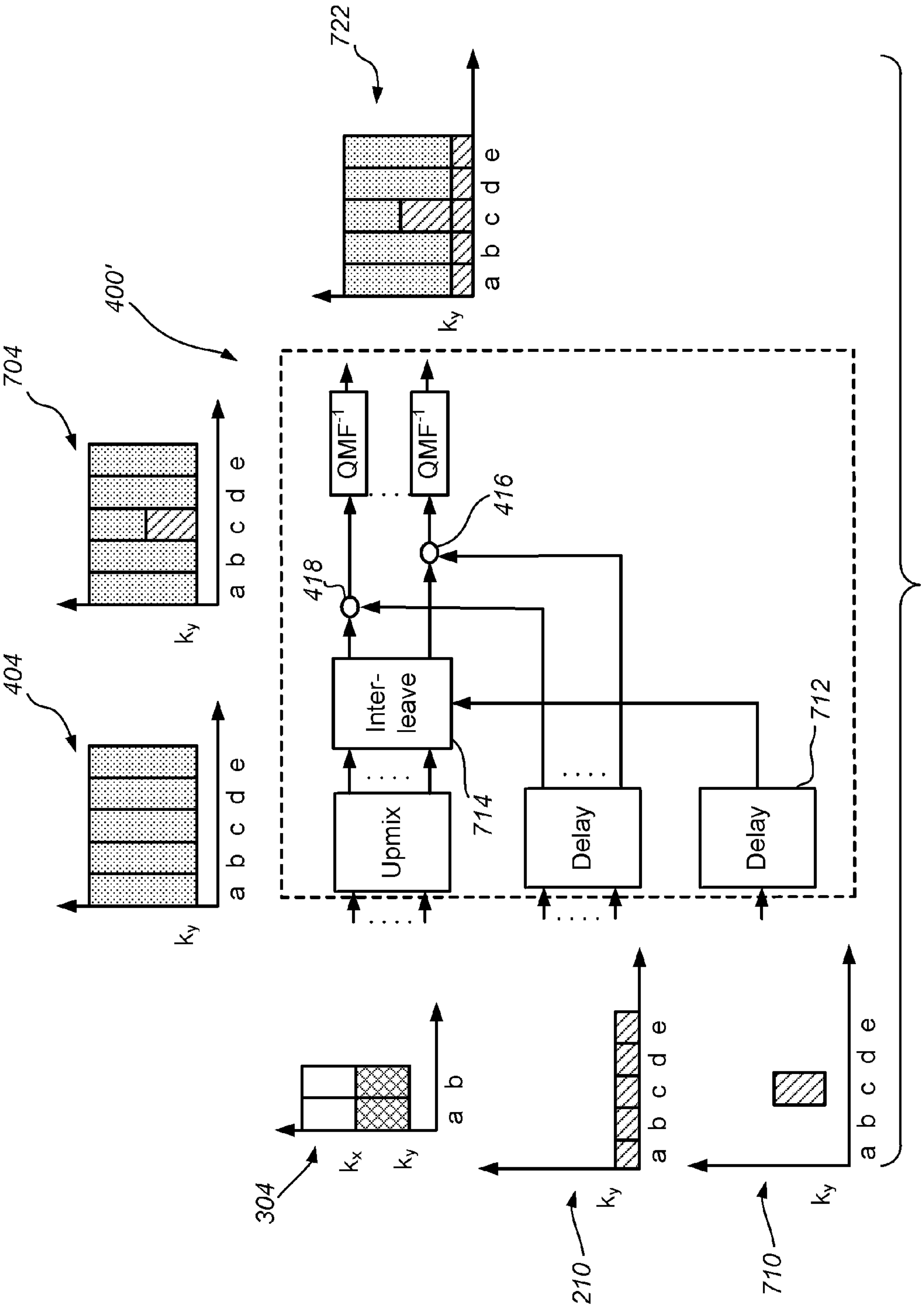
FIG. 12 illustrates a third part of the decoding system of FIG. 11.

FIG. 12 illustrates the third conceptual part 300' of the decoder 100' of FIG. 11 in more detail. The further waveform-coded signal 710 is input to the third conceptual part 400' in addition to the high frequency extended downmix-signals 304*a*-*b* and the five waveform-coded signals 210*a*-*e*. In the illustrated example, the further waveform-coded signal 710 corresponds to the third channel of the five channels. The further waveform-coded signal 710 further comprises spectral coefficients corresponding to a frequency interval starting from the first cross-over frequency $k_y$. However, the form of the subset of the frequency range above the first cross-over frequency covered by the further waveform-coded signal 710 may of course vary in different embodiments. It is also to be noted that a plurality of waveform-coded signals 710*a*-*e* may be received, wherein the different waveform-coded signals may correspond to different output channels. The subset of the frequency range covered by the plurality of further waveform-coded signals 710*a*-*e* may vary between different ones of the plurality of further waveform-coded signals 710*a*-*e*.

The further waveform-coded signal 710 may be delayed by a delay stage 712 to match the timing of the upmix signals 404 being output from the upmix stage 402. The upmix signals 404 and the further waveform-coded signal 710 are then input to an interleave stage 714. The interleave stage 714 interleaves, i.e., combines the upmix signals 404 with the further waveform-coded signal 710 to generate an interleaved signal 704. In the present example, the interleaving stage 714 thus interleaves the third upmix signal 404*c* with the further waveform-coded signal 710. The interleaving may be performed by adding the two signals together. However, typically, the interleaving is performed by replacing the upmix signals 404 with the further waveform-coded signal 710 in the frequency range and time range where the signals overlap.

The interleaved signal 704 is then input to the second combining stage, 416, 418, where it is combined with the waveform-coded signals 201*a*-*e* to generate an output signal 722 in the same manner as described with reference to FIG. 19. It is to be noted that the order of the interleave stage 714 and the second combining stage 416, 418 may be reversed so that the combining is performed before the interleaving.

Also, in the situation where the further waveform-coded signal 710 forms part of one or more of the five waveform-coded signals 210*a*-*e*, the second combining stage 416, 418, and the interleave stage 714 may be combined into a single stage. Specifically, such a combined stage would use the spectral content of the five waveform-coded signals 210*a*-*e* for frequencies up to the first cross-over frequency $k_y$. For frequencies above the first cross-over frequency, the combined stage would use the upmix signals 404 interleaved with the further waveform-coded signal 710.

The interleave stage 714 may operate under the control of a control signal. For this purpose the decoder 100' may receive, for example via the third receiving stage 616, a control signal which indicates how to interleave the further waveform-coded signal with one of the M upmix signals. For example, the control signal may indicate the frequency range and the time range for which the further waveform-coded signal 710 is to be interleaved with one of the upmix signals 404. For instance, the frequency range and the time range may be expressed in terms of time/frequency tiles for which the interleaving is to be made. The time/frequency tiles may be time/frequency tiles with respect to the time/frequency grid of the QMF domain where the interleaving takes place.

The control signal may use vectors, such as binary vectors, to indicate the time/frequency tiles for which interleaving are to be made. Specifically, there may be a first vector relating to a frequency direction, indicating the frequencies for which interleaving is to be performed. The indication may for example be made by indicating a logic one for the corresponding frequency interval in the first vector. There may also be a second vector relating to a time direction, indicating the time intervals for which interleaving are to be performed. The indication may for example be made by indicating a logic one for the corresponding time interval in the second vector. For this purpose, a time frame is typically divided into a plurality of time slots, such that the time indication may be made on a sub-frame basis. By intersecting the first and the second vectors, a time/frequency matrix may be constructed. For example, the time/frequency matrix may be a binary matrix comprising a logic one for each time/frequency tile for which the first and the second vectors indicate a logic one. The interleave stage 714 may then use the time/frequency matrix upon performing interleaving, for instance such that one or more of the upmix signals 704 are replaced by the further wave-form coded signal 710 for the time/frequency tiles being indicated, such as by a logic one, in the time/frequency matrix.

It is noted that the vectors may use other schemes than a binary scheme to indicate the time/frequency tiles for which interleaving are to be made. For example, the vectors could indicate by means of a first value such as a zero that no interleaving is to be made, and by second value that interleaving is to be made with respect to a certain channel identified by the second value.

Stereo Coding

As used in this section, left-right coding or encoding means that the left (L) and right (R) stereo signals are coded without performing any transformation between the signals.

As used in this section, sum- and difference coding or encoding means that the sum M of the left and right stereo signals are coded as one signal (sum) and the difference S between the left and right stereo signal are coded as one signal (difference). The sum-and-difference coding may also be called mid-side coding. The relation between the left-right form and the sum-difference form is thus M=L+R and S=L−R. It may be noted that different normalizations or scaling are possible when transforming left and right stereo signals into the sum- and difference form and vice versa, as long as the transforming in both direction matches. In this disclosure, M=L+R and S=L−R is primarily used, but a system using a different scaling, e.g. M=(L+R)/2 and S=(L−R)/2 works equally well.

As used in this section, downmix-complementary (dmx/comp) coding or encoding means subjecting the left and right stereo signal to a matrix multiplication depending on a weighting parameter a prior to coding. The dmx/comp coding may thus also be called dmx/comp/a coding. The relation between the downmix-complementary form, the left-right form, and the sum-difference form is typically dmx=L+R=M, and comp=(1−a)L−(1+a)R=−aM+S. Notably, the downmix signal in the downmix-complementary representation is thus equivalent to the sum signal M of the sum-and-difference representation.

As used in this section, an audio signal may be a pure audio signal, an audio part of an audiovisual signal or multimedia signal or any of these in combination with metadata.

Figure 13:
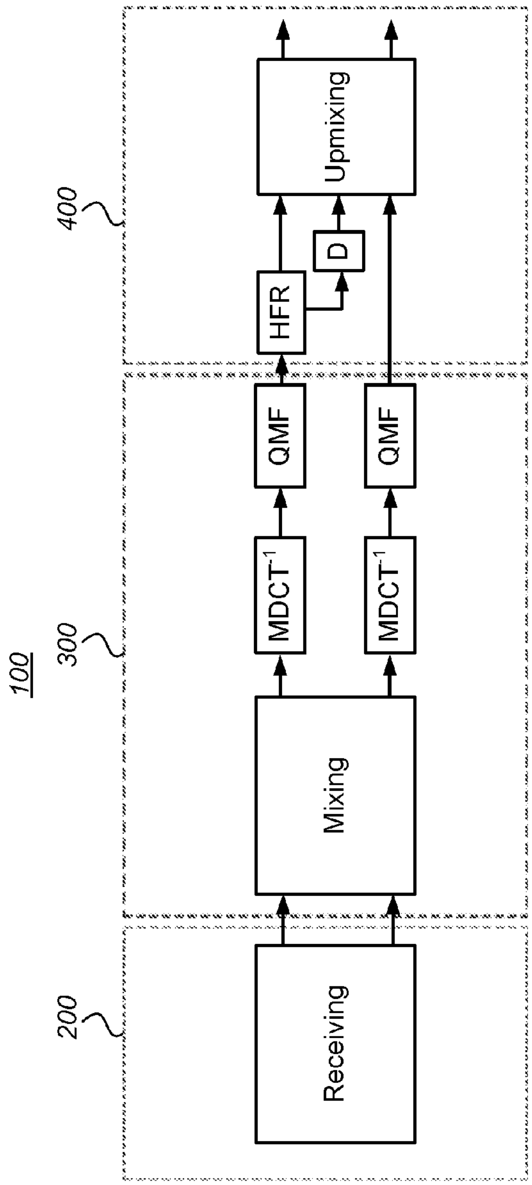
FIG. 13 is a generalized block diagram of a decoding system in accordance with an example embodiment.

FIG. 13 is a generalized block diagram of a decoding system 100 comprising three conceptual parts 200, 300, 400 that will be explained in greater detail in conjunction with FIG. 14-16 below. In first conceptual part 200, a bit stream is received and decoded into a first and a second signal. The first signal comprises both a first waveform-coded signal comprising spectral data corresponding to frequencies up to a first cross-over frequency and a waveform-coded downmix signal comprising spectral data corresponding to frequencies above the first cross-over frequency. The second signal only comprises a second waveform-coded signal comprising spectral data corresponding to frequencies up to the first cross-over frequency.

In the second conceptual part 300, in case the waveform-coded parts of the first and second signal is not in a sum-and-difference form, e.g. in an M/S form, the waveform-coded parts of the first and second signal are transformed to the sum-and-difference form. After that, the first and the second signal are transformed into the time domain and then into the Quadrature Mirror Filters, QMF, domain. In the third conceptual part 400, the first signal is high frequency reconstructed (HFR). Both the first and the second signal is then upmixed to create a left and a right stereo signal output having spectral coefficients corresponding to the entire frequency band of the encoded signal being decoded by the decoding system 100.

Figure 14:
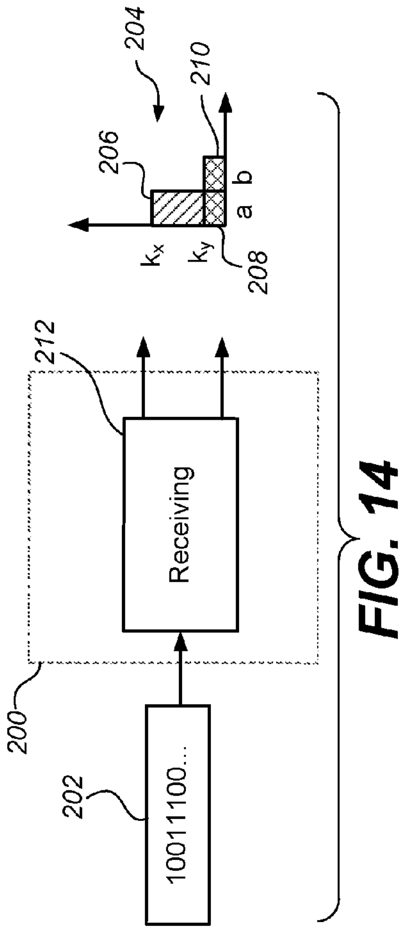
FIG. 14 illustrates a first part of the decoding system in FIG. 13.

FIG. 14 illustrates the first conceptual part 200 of the decoding system 100 in FIG. 13. The decoding system 100 comprises a receiving stage 212. In the receiving stage 212, a bit stream frame 202 is decoded and dequantizing into a first signal 204*a* and a second signal 204*b*. The bit stream frame 202 corresponds to a time frame of the two audio signals being decoded. The first signal 204*a* comprises a first waveform-coded signal 208 comprising spectral data corresponding to frequencies up to a first cross-over frequency $k_y$ and a waveform-coded downmix signal 206 comprising spectral data corresponding to frequencies above the first cross-over frequency $k_y$. By way of example, the first cross-over frequency $k_y$ is 1.1 kHz.

According to some embodiments, the waveform-coded downmix signal 206 comprises spectral data corresponding to frequencies between the first cross-over frequency $k_y$ and a second cross-over frequency $k_x$. By way of example, the second cross-over frequency $k_x$ lies within the range of is 5.6-8 kHz.

The received first and second wave-form coded signals 208, 210 may be waveform-coded in a left-right form, a sum-difference form and/or a downmix-complementary form wherein the complementary signal depends on a weighting parameter a being signal adaptive. The waveform-coded downmix signal 206 corresponds to a downmix suitable for parametric stereo which, according to the above, corresponds to a sum form. However, the signal 204*b* has no content above the first cross-over frequency $k_y$. Each of the signals 206, 208, 210 is represented in a modified discrete cosine transform (MDCT) domain.

Figure 15:
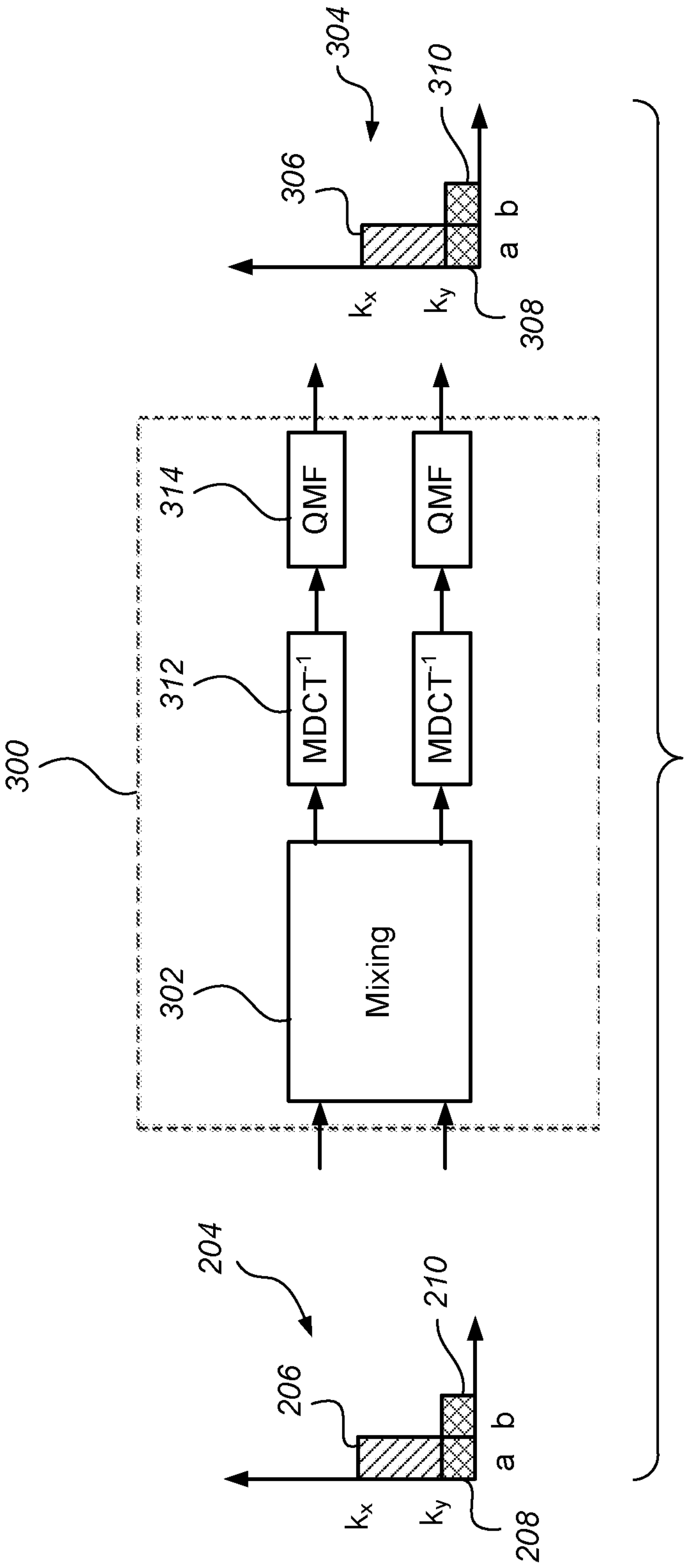
FIG. 15 illustrates a second part of the decoding system in FIG. 13.

FIG. 15 illustrates the second conceptual part 300 of the decoding system 100 in FIG. 13. The decoding system 100 comprises a mixing stage 302. The design of the decoding system 100 requires that the input to the high frequency reconstruction stage, which will be described in greater detail below, needs to be in a sum-format. Consequently, the mixing stage is configured to check whether the first and the second signal waveform-coded signal 208, 210 are in a sum-and-difference form. If the first and the second signal waveform-coded signal 208, 210 are not in a sum-and-difference form for all frequencies up to the first cross-over frequency $k_y$, the mixing stage 302 will transform the entire waveform-coded signal 208, 210 into a sum-and-difference form. In case at least a subset of the frequencies of the input signals 208, 210 to the mixing stage 302 is in a downmix-complementary form, the weighting parameter a is required as an input to the mixing stage 302. It may be noted that the input signals 208, 210 may comprise several subset of frequencies coded in a downmix-complementary form and that in that case each subset does not have to be coded with use of the same value of the weighting parameter a. In this case, several weighting parameters a are required as an input to the mixing stage 302.

As mentioned above, the mixing stage 302 always output a sum-and-difference representation of the input signals 204*a-b*. To be able to transform signals represented in the MDCT domain into the sum-and-difference representation, the windowing of the MDCT coded signals need to be the same. This implies that, in case the first and the second signal waveform-coded signal 208, 210 are in a L/R or downmix-complementary form, the windowing for the signal 204*a* and the windowing for the signal 204*b* cannot be independent Consequently, in case the first and the second signal waveform-coded signal 208, 210 is in a sum-and-difference form, the windowing for the signal 204*a* and the windowing for the signal 204*b* may be independent.

After the mixing stage 302, the sum-and-difference signal is transformed into the time domain by applying an inverse modified discrete cosine transform ($MDCT^{-1}$) 312.

The two signals 304*a-b* are then analyzed with two QMF banks 314. Since the downmix signal 306 does not comprise the lower frequencies, there is no need of analyzing the signal with a Nyquist filterbank to increase frequency resolution. This may be compared to systems where the downmix signal comprises low frequencies, e.g. conventional parametric stereo decoding such as MPEG-4 parametric stereo. In those systems, the downmix signal needs to be analyzed with the Nyquist filterbank in order to increases the frequency resolution beyond what is achieved by a QMF bank and thus better match the frequency selectivity of the human auditory system, as e.g. represented by the Bark frequency scale.

The output signal 304 from the QMF banks 314 comprises a first signal 304*a* which is a combination of a waveform-coded sum-signal 308 comprising spectral data corresponding to frequencies up to the first cross-over frequency $k_y$ and the waveform-coded downmix signal 306 comprising spectral data corresponding to frequencies between the first cross-over frequency $k_y$ and the second cross-over frequency $k_x$. The output signal 304 further comprises a second signal 304*b* which comprises a waveform-coded difference-signal 310 comprising spectral data corresponding to frequencies up to the first cross-over frequency $k_y$. The signal 304*b* has no content above the first cross-over frequency $k_y$.

As will be described later on, a high frequency reconstruction stage 416 (shown in conjunction with FIG. 16) uses the lower frequencies, i.e. the first waveform-coded signal 308 and the waveform-coded downmix signal 306 from the output signal 304, for reconstructing the frequencies above the second cross-over frequency $k_x$. It is advantageous that the signal on which the high frequency reconstruction stage 416 operates on is a signal of similar type across the lower frequencies. From this perspective it is advantageous to have the mixing stage 302 to always output a sum-and-difference representation of the first and the second signal waveform-coded signal 208, 210 since this implies that the first waveform-coded signal 308 and the waveform-coded downmix signal 306 of the outputted first signal 304*a* are of similar character.

Figure 16:
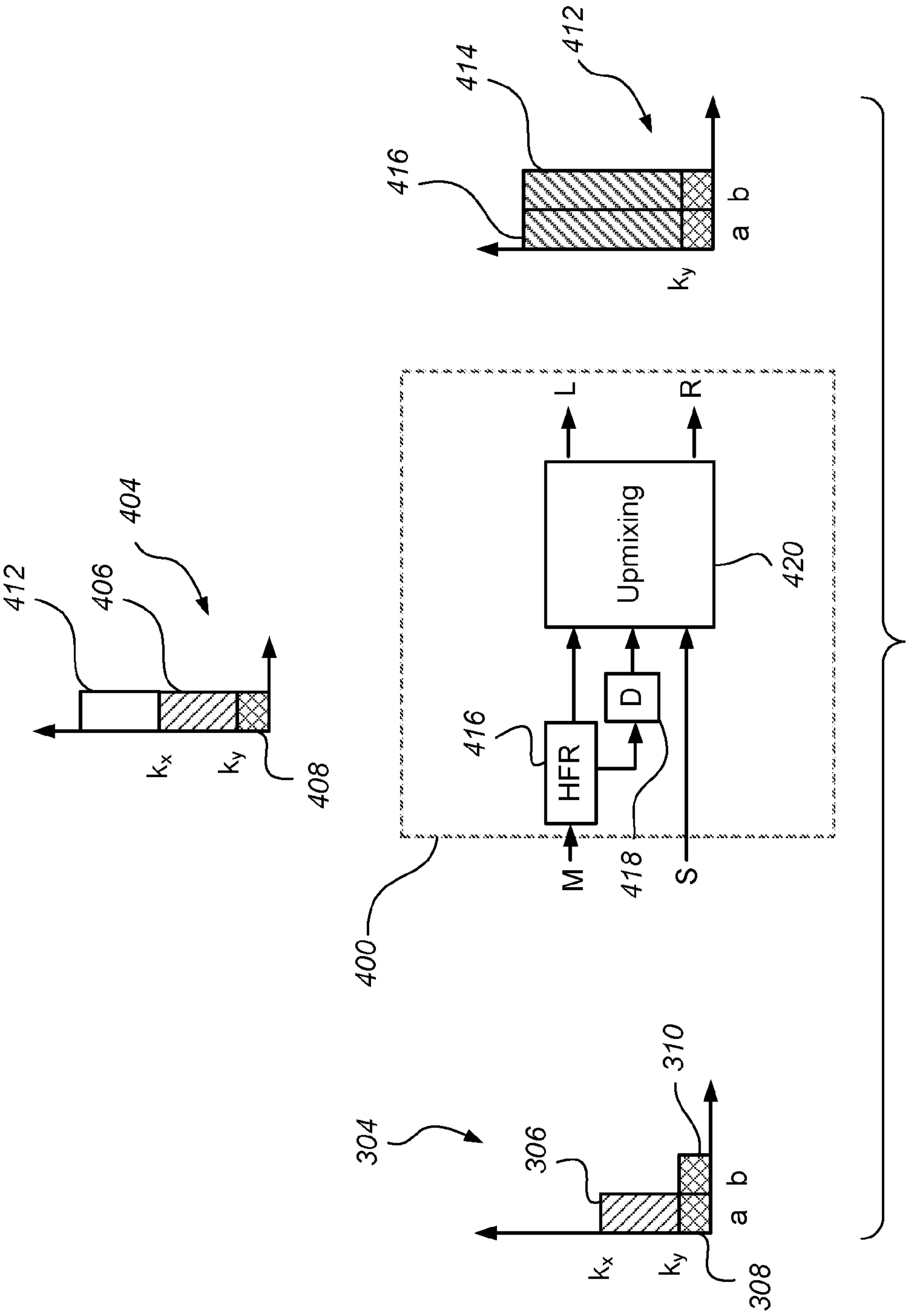
FIG. 16 illustrates a third part of the decoding system in FIG. 13.

FIG. 16 illustrates the third conceptual part 400 of the decoding system 100 in FIG. 13. The high frequency reconstruction (HRF) stage 416 is extending the downmix signal 306 of the first signal input signal 304*a* to a frequency range above the second cross-over frequency $k_x$ by performing high frequency reconstruction. Depending on the configuration of the HFR stage 416, the input to the HFR stage 416 is the entire signal 304*a* or the just the downmix signal 306. The high frequency reconstruction is done by using high frequency reconstruction parameters which may be received by high frequency reconstruction stage 416 in any suitable way. According to an embodiment, the performed high frequency reconstruction comprises performing spectral band replication, SBR.

The output from the high frequency reconstruction stage 314 is a signal 404 comprising the downmix signal 406 with the SBR extension 412 applied. The high frequency reconstructed signal 404 and the signal 304*b* is then fed into an upmixing stage 420 so as to generate a left L and a right R stereo signal 412*a-b*. For the spectral coefficients corresponding to frequencies below the first cross-over frequency $k_y$ the upmixing comprises performing an inverse sum-and-difference transformation of the first and the second signal 408, 310. This simply means going from a mid-side representation to a left-right representation as outlined before. For the spectral coefficients corresponding to frequencies over to the first cross-over frequency $k_y$, the downmix signal 406 and the SBR extension 412 is fed through a decorrelator 418. The downmix signal 406 and the SBR extension 412 and the decorrelated version of the downmix signal 406 and the SBR extension 412 is then upmixed using parametric mixing parameters to reconstruct the left and the right channels 416, 414 for frequencies above the first cross-over frequency $k_y$. Any parametric upmixing procedure known in the art may be applied.

It should be noted that in the above exemplary embodiment 100 of the encoder, shown in FIGS. 13-16, high frequency reconstruction is needed since the first received signal 204*a* only comprises spectral data corresponding to frequencies up to the second cross-over frequency $k_x$. In further embodiments, the first received signal comprises spectral data corresponding to all frequencies of the encoded signal. According to this embodiment, high frequency reconstruction is not needed. The person skilled in the art understands how to adapt the exemplary encoder 100 in this case.

Figure 17:
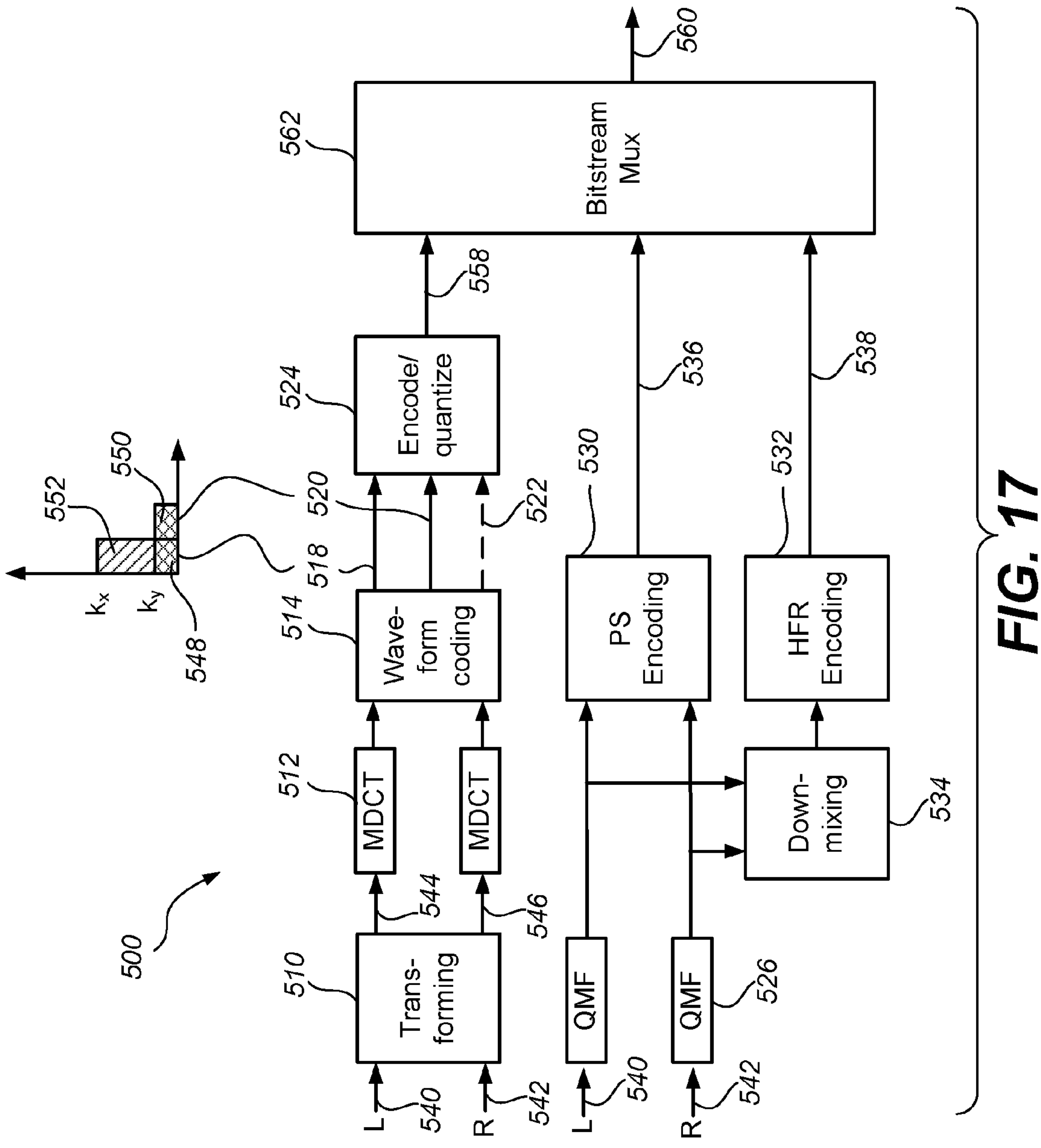
FIG. 17 is a generalized block diagram of an encoding system in accordance with a first example embodiment.

FIG. 17 shows by way of example a generalized block diagram of an encoding system 500 in accordance with an embodiment.

In the encoding system, a first and second signal 540, 542 to be encoded are received by a receiving stage (not shown). These signals 540, 542 represent a time frame of the left 540 and the right 542 stereo audio channels. The signals 540, 542 are represented in the time domain. The encoding system comprises a transforming stage 510. The signals 540, 542 are transformed into a sum-and-difference format 544, 546 in the transforming stage 510.

The encoding system further comprising a waveform-coding stage 514 configured to receive the first and the second transformed signal 544, 546 from the transforming stage 510. The waveform-coding stage typically operates in a MDCT domain. For this reason, the transformed signals 544, 546 are subjected to a MDCT transform 512 prior to the waveform-coding stage 514. In the waveform-coding stage, the first and the second transformed signal 544, 546 are waveform-coded into a first and a second waveform-coded signal 518, 520, respectively.

For frequencies above a first cross-over frequency $k_y$, the waveform-coding stage 514 is configured to waveform-code the first transformed signal 544 into a waveform-code signal 552 of the first waveform-coded signal 518. The waveform-coding stage 514 may be configured to set the second waveform-coded signal 520 to zero above the first cross-over frequency $k_y$ or to not encode theses frequencies at all. For frequencies above the first cross-over frequency $k_y$, the waveform-coding stage 514 is configured to waveform-code the first transformed signal 544 into a waveform-coded signal 552 of the first waveform-coded signal 518.

For frequencies below the first cross-over frequency $k_y$, a decision is made in the waveform-coding stage 514 on what kind of stereo coding to use for the two signals 548, 550. Depending on the characteristics of the transformed signals 544, 546 below the first cross-over frequency $k_y$, different decisions can be made for different subsets of the waveform-coded signal 548, 550. The coding can either be Left/Right coding, Mid/Side coding, i.e. coding the sum and difference, or dmx/comp/a coding. In the case the signals 548, 550 are waveform-coded by a sum-and-difference coding in the waveform-coding stage 514, the waveform-coded signals 518, 520 may be coded using overlapping windowed transforms with independent windowing for the signals 518, 520, respectively.

An exemplary first cross-over frequency $k_y$ is 1.1 kHz, but this frequency may be varied depending on the bit transmission rate of the stereo audio system or depending on the characteristics of the audio to be encoded.

At least two signals 518, 520 are thus outputted from the waveform-coding stage 514. In the case one or several subsets, or the entire frequency band, of the signals below the first cross over frequency $k_y$ are coded in a downmix/complementary form by performing a matrix operation, depending on the weighting parameter a, this parameter is also outputted as a signal 522. In the case of several subsets being encoded in a downmix/complementary form, each subset does not have to be coded with use of the same value of the weighting parameter a. In this case, several weighting parameters are outputted as the signal 522.

These two or three signals 518, 520, 522, are encoded and quantized 524 into a single composite signal 558.

To be able to reconstruct the spectral data of the first and the second signal 540, 542 for frequencies above the first cross-over frequency on a decoder side, parametric stereo parameters 536 needs to be extracted from the signals 540, 542. For this purpose the encoder 500 comprises a parametric stereo (PS) encoding stage 530. The PS encoding stage 530 typically operates in a QMF domain. Therefore, prior to being input to the PS encoding stage 530, the first and second signals 540, 542 are transformed to a QMF domain by a QMF analysis stage 526. The PS encoder stage 530 is adapted to only extract parametric stereo parameters 536 for frequencies above the first cross-over frequency $k_y$.

It may be noted that the parametric stereo parameters 536 are reflecting the characteristics of the signal being parametric stereo encoded. They are thus frequency selective, i.e. each parameter of the parameters 536 may correspond to a subset of the frequencies of the left or the right input signal 540, 542. The PS encoding stage 530 calculates the parametric stereo parameters 536 and quantizes these either in a uniform or a non-uniform fashion. The parameters are as mentioned above calculated frequency selective, where the entire frequency range of the input signals 540, 542 is divided into e.g. 15 parameter bands. These may be spaced according to a model of the frequency resolution of the human auditory system, e.g. a bark scale.

In the exemplary embodiment of the encoder 500 shown in FIG. 17, the waveform-coding stage 514 is configured to waveform-code the first transformed signal 544 for frequencies between the first cross-over frequency $k_y$ and a second cross-over frequency $k_x$ and setting the first waveform-coded signal 518 to zero above the second cross-over frequency $k_x$. This may be done to further reduce the required transmission rate of the audio system in which the encoder 500 is a part. To be able to reconstruct the signal above the second cross-over frequency $k_x$, high frequency reconstruction parameters 538 needs to be generated. According to this exemplary embodiment, this is done by downmixing the two signals 540, 542, represented in the QMF domain, at a downmixing stage 534. The resulting downmix signal, which for example is equal to the sum of the signals 540, 542, is then subjected to high frequency reconstruction encoding at a high frequency reconstruction, HFR, encoding stage 532 in order to generate the high frequency reconstruction parameters 538. The parameters 538 may for example include a spectral envelope of the frequencies above the second cross-over frequency $k_x$, noise addition information etc. as well known to the person skilled in the art.

An exemplary second cross-over frequency $k_x$ is 5.6-8 kHz, but this frequency may be varied depending on the bit transmission rate of the stereo audio system or depending on the characteristics of the audio to be encoded.

The encoder 500 further comprises a bitstream generating stage, i.e. bitstream multiplexer, 524. According to the exemplary embodiment of the encoder 500, the bitstream generating stage is configured to receive the encoded and quantized signal 544, and the two parameters signals 536, 538. These are converted into a bitstream 560 by the bitstream generating stage 562, to further be distributed in the stereo audio system.

According to another embodiment, the waveform-coding stage 514 is configured to waveform-code the first transformed signal 544 for all frequencies above the first cross-over frequency $k_y$. In this case, the HFR encoding stage 532 is not needed and consequently no high frequency reconstruction parameters 538 are included in the bit-stream.

Figure 18:
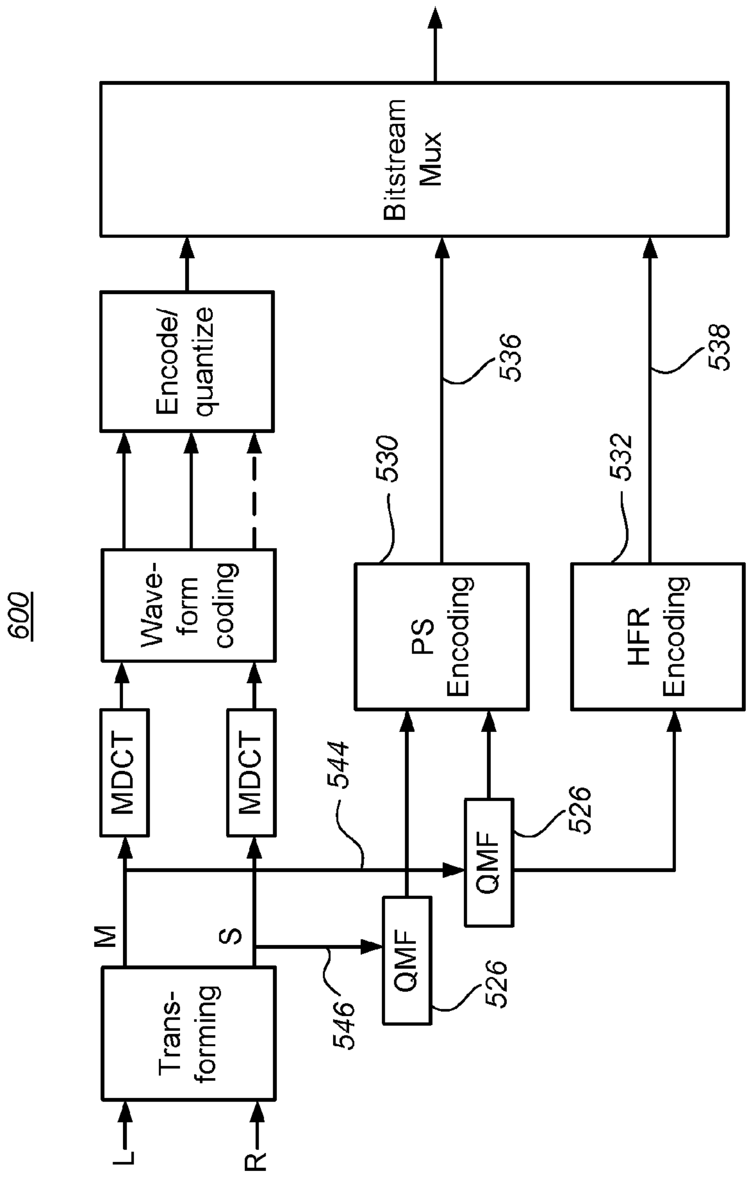
FIG. 18 is a generalized block diagram of an encoding system in accordance with a second example embodiment.

FIG. 18 shows by way of example a generalized block diagram of an encoder system 600 in accordance with another embodiment.

Voice Mode Coding.

Figure 19A:
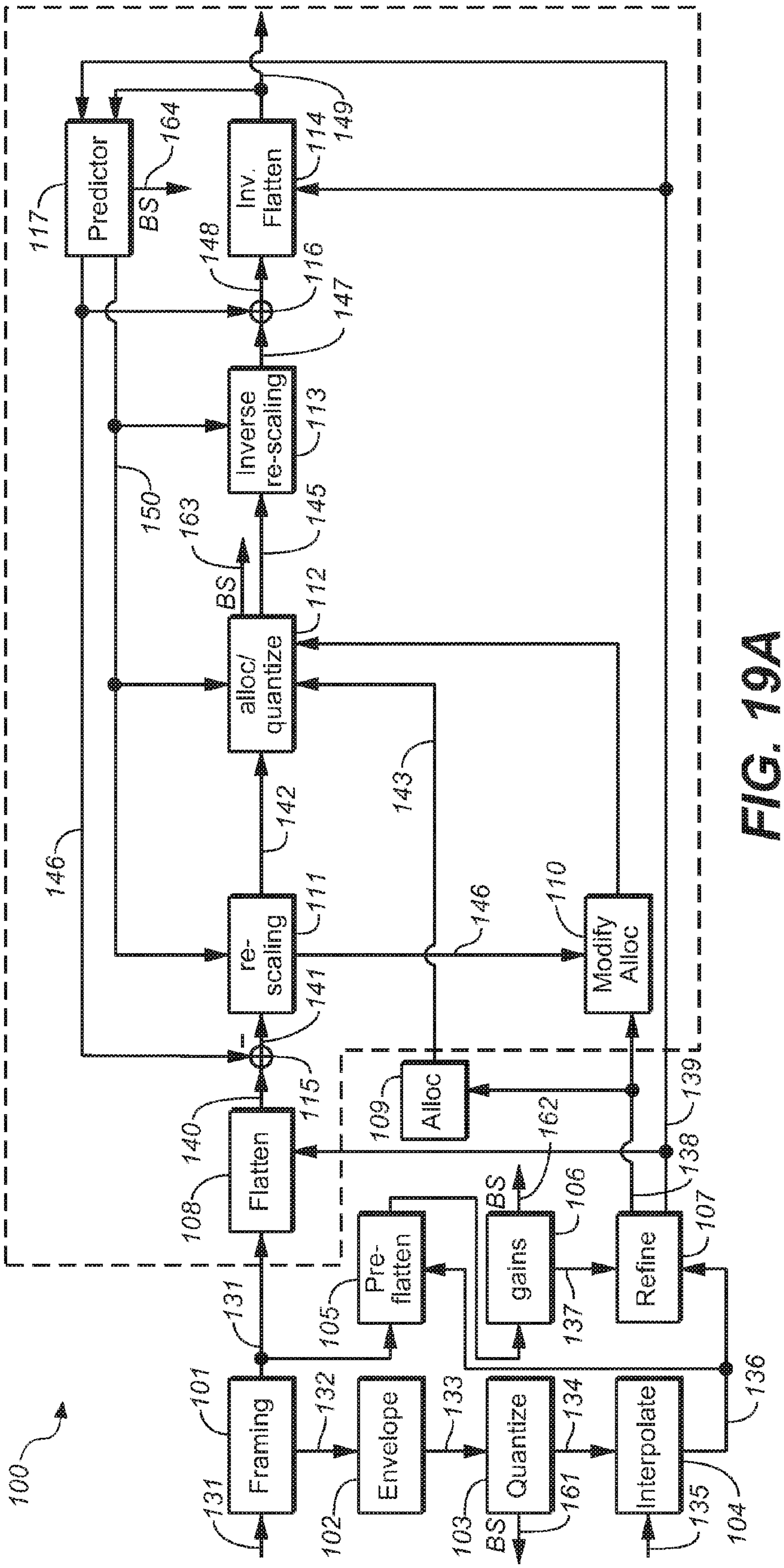
FIG. 19*a* shows a block diagram of an example audio encoder providing a bitstream at a constant bit-rate.

FIG. 19*a* shows a block diagram of an example transform-based speech encoder 100. The encoder 100 receives as an input a block 131 of transform coefficients (also referred to as a coding unit). The block 131 of transform coefficient may have been obtained by a transform unit configured to transform a sequence of samples of the input audio signal from the time domain into the transform domain. The transform unit may be configured to perform an MDCT. The transform unit may be part of a generic audio codec such as AAC or HE-AAC. Such a generic audio codec may make use of different block sizes, e.g. a long block and a short block. Example block sizes are 1024 samples for a long block and 256 samples for a short block. Assuming a sampling rate of 44.1 kHz and an overlap of 50%, a long block covers approx. 20 ms of the input audio signal and a short block covers approx. 5 ms of the input audio signal. Long blocks are typically used for stationary segments of the input audio signal and short blocks are typically used for transient segments of the input audio signal.

Speech signals may be considered to be stationary in temporal segments of about 20 ms. In particular, the spectral envelope of a speech signal may be considered to be stationary in temporal segments of about 20 ms. In order to be able to derive meaningful statistics in the transform domain for such 20 ms segments, it may be useful to provide the transform-based speech encoder 100 with short blocks 131 of transform coefficients (having a length of e.g. 5 ms). By doing this, a plurality of short blocks 131 may be used to derive statistics regarding a time segments of e.g. 20 ms (e.g. the time segment of a long block). Furthermore, this has the advantage of providing an adequate time resolution for speech signals.

Hence, the transform unit may be configured to provide short blocks 131 of transform coefficients, if a current segment of the input audio signal is classified to be speech. The encoder 100 may comprise a framing unit 101 configured to extract a plurality of blocks 131 of transform coefficients, referred to as a set 132 of blocks 131. The set 132 of blocks may also be referred to as a frame. By way of example, the set 132 of blocks 131 may comprise four short blocks of 256 transform coefficients, thereby covering approx. a 20 ms segment of the input audio signal.

The set 132 of blocks may be provided to an envelope estimation unit 102. The envelope estimation unit 102 may be configured to determine an envelope 133 based on the set 132 of blocks. The envelope 133 may be based on root means squared (RMS) values of corresponding transform coefficients of the plurality of blocks 131 comprised within the set 132 of blocks. A block 131 typically provides a plurality of transform coefficients (e.g. 256 transform coefficients) in a corresponding plurality of frequency bins 301 (see FIG. 21*a*). The plurality of frequency bins 301 may be grouped into a plurality of frequency bands 302. The plurality of frequency bands 302 may be selected based on psychoacoustic considerations. By way of example, the frequency bins 301 may be grouped into frequency bands 302 in accordance to a logarithmic scale or a Bark scale. The envelope 134 which has been determined based on a current set 132 of blocks may comprise a plurality of energy values for the plurality of frequency bands 302, respectively. A particular energy value for a particular frequency band 302 may be determined based on the transform coefficients of the blocks 131 of the set 132, which correspond to frequency bins 301 falling within the particular frequency band 302. The particular energy value may be determined based on the RMS value of these transform coefficients. As such, an envelope 133 for a current set 132 of blocks (referred to as a current envelope 133) may be indicative of an average envelope of the blocks 131 of transform coefficients comprised within the current set 132 of blocks, or may be indicative of an average envelope of blocks 132 of transform coefficients used to determine the envelope 133.

Figure 20:
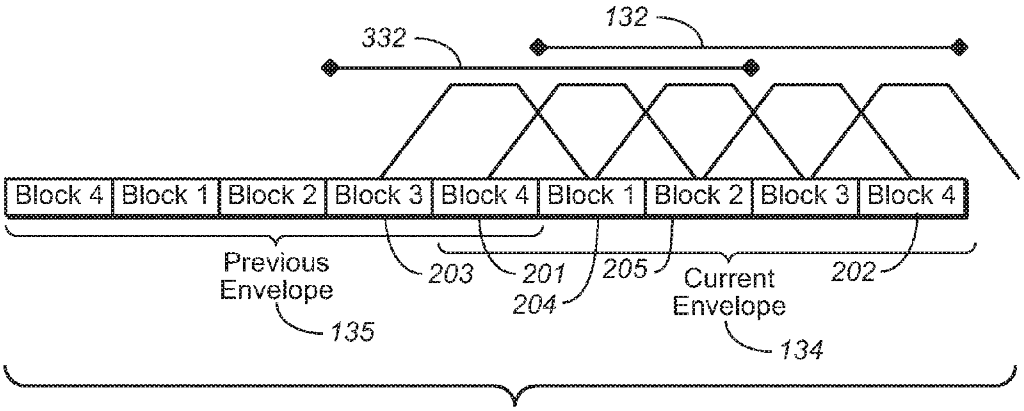
FIG. 20 illustrates the generation of an example envelope based on a plurality of blocks of transform coefficients.

It should be noted that the current envelope 133 may be determined based on one or more further blocks 131 of transform coefficients adjacent to the current set 132 of blocks. This is illustrated in FIG. 20, where the current envelope 133 (indicated by the quantized current envelope 134) is determined based on the blocks 131 of the current set 132 of blocks and based on the block 201 from the set of blocks preceding the current set 132 of blocks. In the illustrated example, the current envelope 133 is determined based on five blocks 131. By taking into account adjacent blocks when determining the current envelope 133, a continuity of the envelopes of adjacent sets 132 of blocks may be ensured.

When determining the current envelope 133, the transform coefficients of the different blocks 131 may be weighted. In particular, the outermost blocks 201, 202 which are taken into account for determining the current envelope 133 may have a lower weight than the remaining blocks 131. By way of example, the transform coefficients of the outermost blocks 201, 202 may be weighted with 0.5, wherein the transform coefficients of the other blocks 131 may be weighted with 1.

It should be noted that in a similar manner to considering blocks 201 of a preceding set 132 of blocks, one or more blocks (so called look-ahead blocks) of a directly following set 132 of blocks may be considered for determining the current envelope 133.

The energy values of the current envelope 133 may be represented on a logarithmic scale (e.g. on a dB scale). The current envelope 133 may be provided to an envelope quantization unit 103 which is configured to quantize the energy values of the current envelope 133. The envelope quantization unit 103 may provide a pre-determined quantizer resolution, e.g. a resolution of 3 dB. The quantization indices of the envelope 133 may be provided as envelope data 161 within a bitstream generated by the encoder 100. Furthermore, the quantized envelope 134, i.e. the envelope comprising the quantized energy values of the envelope 133, may be provided to an interpolation unit 104.

Figure 21A:
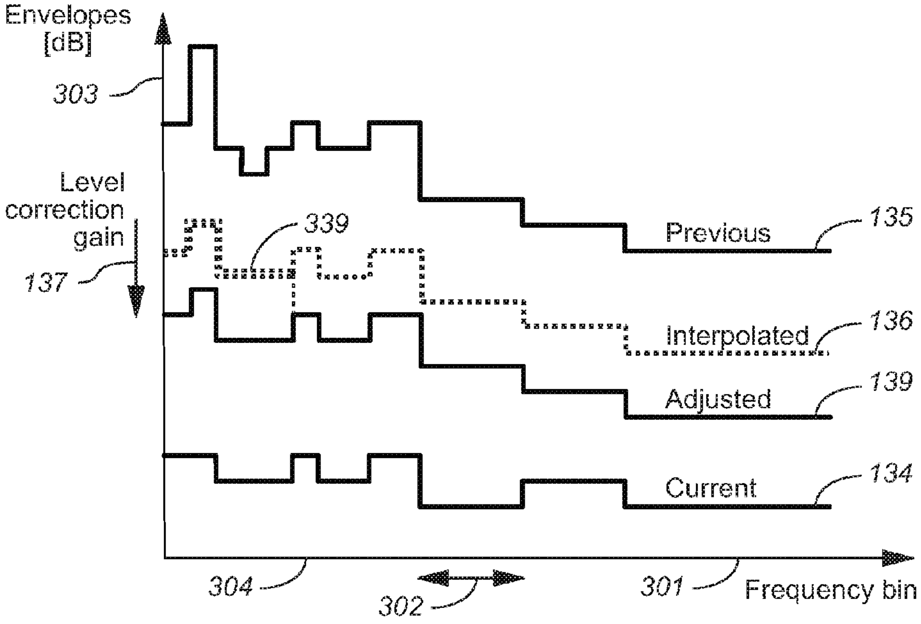
FIG. 21*a* illustrates example envelopes of blocks of transform coefficients.
Figure 21B:
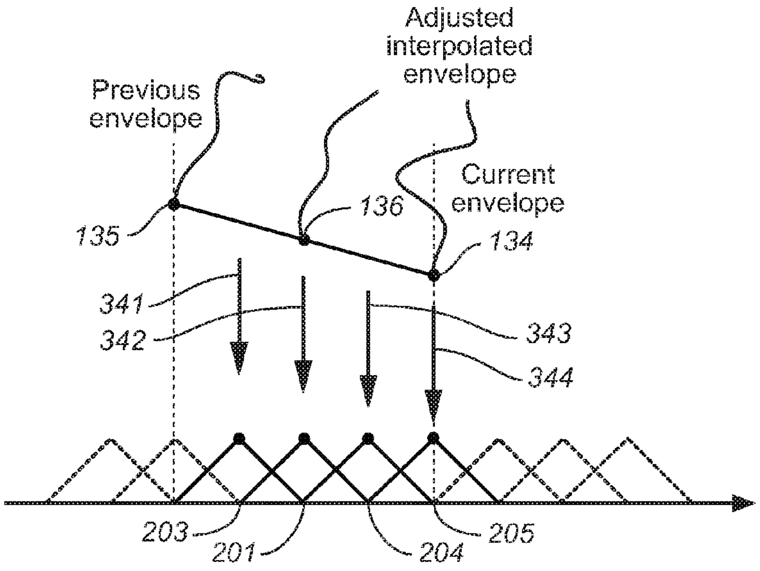
FIG. 21*b* illustrates the determination of an example interpolated envelope.

The interpolation unit 104 is configured to determine an envelope for each block 131 of the current set 132 of blocks based on the quantized current envelope 134 and based on the quantized previous envelope 135 (which has been determined for the set 132 of blocks directly preceding the current set 132 of blocks). The operation of the interpolation unit 104 is illustrated in FIGS. 20, 21*a* and 21*b*. FIG. 20 shows a sequence of blocks 131 of transform coefficients. The sequence of blocks 131 is grouped into succeeding sets 132 of blocks, wherein each set 132 of blocks is used to determine a quantized envelope, e.g. the quantized current envelope 134 and the quantized previous envelope 135. FIG. 21*a* shows examples of a quantized previous envelope 135 and of a quantized current envelope 134. As indicated above, the envelopes may be indicative of spectral energy 303 (e.g. on a dB scale). Corresponding energy values 303 of the quantized previous envelope 135 and of the quantized current envelope 134 for the same frequency band 302 may be interpolated (e.g. using linear interpolation) to determine an interpolated envelope 136. In other words, the energy values 303 of a particular frequency band 302 may be interpolated to provide the energy value 303 of the interpolated envelope 136 within the particular frequency band 302.

It should be noted that the set of blocks for which the interpolated envelopes 136 are determined and applied may differ from the current set 132 of blocks, based on which the quantized current envelope 134 is determined. This is illustrated in FIG. 20 which shows a shifted set 332 of blocks, which is shifted compared to the current set 132 of blocks and which comprises the blocks 3 and 4 of the previous set 132 of blocks (indicated by reference numerals 203 and 201, respectively) and the blocks 1 and 2 of the current set 132 of blocks (indicated by reference numerals 204 and 205, respectively). As a matter of fact, the interpolated envelopes 136 determined based on the quantized current envelope 134 and based on the quantized previous envelope 135 may have an increased relevance for the blocks of the shifted set 332 of blocks, compared to the relevance for the blocks of the current set 132 of blocks.

Hence, the interpolated envelopes 136 shown in FIG. 21*b* may be used for flattening the blocks 131 of the shifted set 332 of blocks. This is shown by FIG. 21*b* in combination with FIG. 20. It can be seen that the interpolated envelope 341 of FIG. 21*b* may be applied to block 203 of FIG. 20, that the interpolated envelope 342 of FIG. 21*b* may be applied to block 201 of FIG. 20 that the interpolated envelope 343 of FIG. 21*b* may be applied to block 204 of FIG. 20, and that the interpolated envelope 344 of FIG. 21*b* (which in the illustrated example corresponds to the quantized current envelope 136) may be applied to block 205 of FIG. 20. As such, the set 132 of blocks for determining the quantized current envelope 134 may differ from the shifted set 332 of blocks for which the interpolated envelopes 136 are determined and to which the interpolated envelopes 136 are applied (for flattening purposes). In particular, the quantized current envelope 134 may be determined using a certain look-ahead with respect to the blocks 203, 201, 204, 205 of the shifted set 332 of blocks, which are to be flattened using the quantized current envelope 134. This is beneficial from a continuity point of view.

The interpolation of energy values 303 to determine interpolated envelopes 136 is illustrated in FIG. 21*b*. It can be seen that by interpolation between an energy value of the quantized previous envelope 135 to the corresponding energy value of the quantized current envelope 134 energy values of the interpolated envelopes 136 may be determined for the blocks 131 of the shifted set 332 of blocks. In particular, for each block 131 of the shifted set 332 an interpolated envelope 136 may be determined, thereby providing a plurality of interpolated envelopes 136 for the plurality of blocks 203, 201, 204, 205 of the shifted set 332 of blocks. The interpolated envelope 136 of a block 131 of transform coefficient (e.g. any of the blocks 203, 201, 204, 205 of the shifted set 332 of blocks) may be used to encode the block 131 of transform coefficients. It should be noted that the quantization indices 161 of the current envelope 133 are provided to a corresponding decoder within the bitstream. Consequently, the corresponding decoder may be configured to determine the plurality of interpolated envelopes 136 in an analog manner to the interpolation unit 104 of the encoder 100.

The framing unit 101, the envelope estimation unit 103, the envelope quantization unit 103, and the interpolation unit 104 operate on a set of blocks (i.e. the current set 132 of blocks and/or the shifted set 332 of blocks). On the other hand, the actual encoding of transform coefficient may be performed on a block-by-block basis. In the following, reference is made to the encoding of a current block 131 of transform coefficients, which may be any one of the plurality of block 131 of the shifted set 332 of blocks (or possibly the current set 132 of blocks in other implementations of the transform-based speech encoder 100).

The current interpolated envelope 136 for the current block 131 may provide an approximation of the spectral envelope of the transform coefficients of the current block 131. The encoder 100 may comprise a pre-flattening unit 105 and an envelope gain determination unit 106 which are configured to determine an adjusted envelope 139 for the current block 131, based on the current interpolated envelope 136 and based on the current block 131. In particular, an envelope gain for the current block 131 may be determined such that a variance of the flattened transform coefficients of the current block 131 is adjusted. X(k), k=1, . . . , K may be the transform coefficients of the current block 131 (with e.g. K=256), and E(k), k=1, . . . , K may be the mean spectral energy values 303 of current interpolated envelope 136 (with the energy values E(k) of a same frequency band 302 being equal). The envelope lain a may be determined such that the variance of the flattened transform coefficients $$\tilde{X}(k) = \frac{X(k)}{a \cdot \sqrt{E(k)}}$$

is adjusted. In particular, the envelope gain a may be determined such that the variance is one.

It should be noted that the envelope gain a may be determined for a sub-range of the complete frequency range of the current block 131 of transform coefficients. In other words, the envelope gain a may be determined only based on a subset of the frequency bins 301 and/or only based on a subset of the frequency bands 302. By way of example, the envelope gain a may be determined based on the frequency bins 301 greater than a start frequency bin 304 (the start frequency bin being greater than 0 or 1). As a consequence, the adjusted envelope 139 for the current block 131 may be determined by applying the envelope gain a only to the mean spectral energy values 303 of the current interpolated envelope 136 which are associated with frequency bins 301 lying above the start frequency bin 304. Hence, the adjusted envelope 139 for the current block 131 may correspond to the current interpolated envelope 136, for frequency bins 301 at and below the start frequency bin, and may correspond to the current interpolated envelope 136 offset by the envelope gain a, for frequency bins 301 above the start frequency bin. This is illustrated in FIG. 21*a* by the adjusted envelope 339 (shown in dashed lines).

The application of the envelope gain a 137 (which is also referred to as a level correction gain) to the current interpolated envelope 136 corresponds to an adjustment or an offset of the current interpolated envelope 136, thereby yielding an adjusted envelope 139, as illustrated by FIG. 21*a*. The envelope gain a 137 may be encoded as gain data 162 into the bitstream.

The encoder 100 may further comprise an envelope refinement unit 107 which is configured to determine the adjusted envelope 139 based on the envelope gain a 137 and based on the current interpolated envelope 136. The adjusted envelope 139 may be used for signal processing of the block 131 of transform coefficient. The envelope gain a 137 may be quantized to a higher resolution (e.g. in 1 dB steps) compared to the current interpolated envelope 136 (which may be quantized in 3 dB steps). As such, the adjusted envelope 139 may be quantized to the higher resolution of the envelope gain a 137 (e.g. in 1 dB steps).

Furthermore, the envelope refinement unit 107 may be configured to determine an allocation envelope 138. The allocation envelope 138 may correspond to a quantized version of the adjusted envelope 139 (e.g. quantized to 3 dB quantization levels). The allocation envelope 138 may be used for bit allocation purposes. In particular, the allocation envelope 138 may be used to determine—for a particular transform coefficient of the current block 131—a particular quantizer from a pre-determined set of quantizers, wherein the particular quantizer is to be used for quantizing the particular transform coefficient.

The encoder 100 comprises a flattening unit 108 configured to flatten the current block 131 using the adjusted envelope 139, thereby yielding the block 140 of flattened transform coefficients $\tilde{X}(k)$. The block 140 of flattened transform coefficients $\tilde{X}(k)$ may be encoded using a prediction loop within the transform domain. As such, the block 140 may be encoded using a subband predictor 117. The prediction loop comprises a difference unit 115 configured to determine a block 141 of prediction error coefficients $\Delta(k)$, based on the block 140 of flattened transform coefficients $\tilde{X}(k)$ and based on a block 150 of estimated transform coefficients $\tilde{X}(k)$, e.g. $\Delta(k)=\tilde{X}(k)-\tilde{X}(k)$. It should be noted that due to the fact that the block 140 comprises flattened transform coefficients, i.e. transform coefficients which have been normalized or flattened using the energy values 303 of the adjusted envelope 139, the block 150 of estimated transform coefficients also comprises estimates of flattened transform coefficients. In other words, the difference unit 115 operates in the so-called flattened domain. By consequence, the block 141 of prediction error coefficients $\Delta(k)$ is represented in the flattened domain.

The block 141 of prediction error coefficients $\Delta(k)$ may exhibit a variance which differs from one. The encoder 100 may comprise a rescaling unit 111 configured to rescale the prediction error coefficients $\Delta(k)$ to yield a block 142 of rescaled error coefficients. The rescaling unit 111 may make use of one or more pre-determined heuristic rules to perform the rescaling. As a result, the block 142 of rescaled error coefficients exhibits a variance which is (in average) closer to one (compared to the block 141 of prediction error coefficients). This may be beneficial to the subsequent quantization and encoding.

Figure 22:
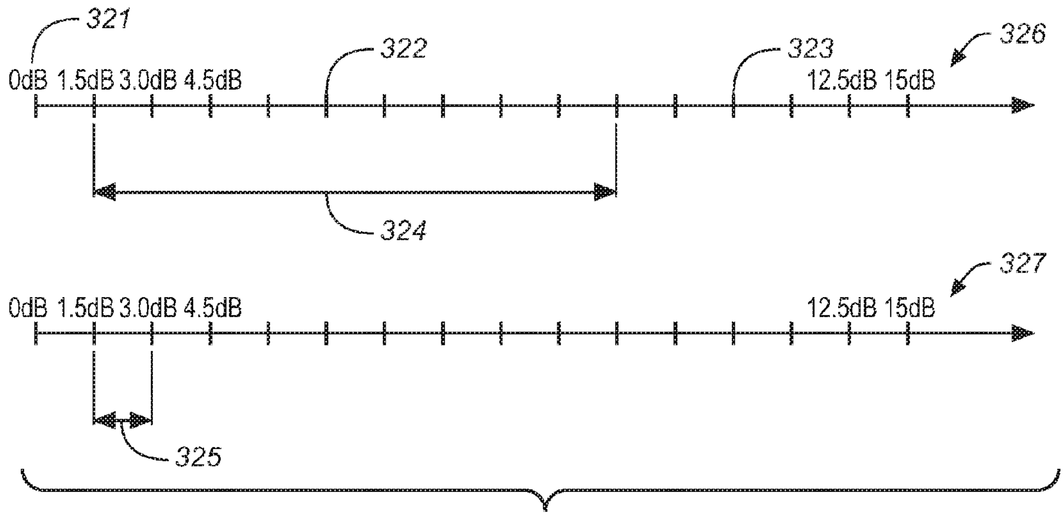
FIG. 22 illustrates example sets of quantizers.

The encoder 100 comprises a coefficient quantization unit 112 configured to quantize the block 141 of prediction error coefficients or the block 142 of rescaled error coefficients. The coefficient quantization unit 112 may comprise or may make use of a set of pre-determined quantizers. The set of pre-determined quantizers may provide quantizers with different degrees of precision or different resolution. This is illustrated in FIG. 22 where different quantizers 321, 322, 323 are illustrated. The different quantizers may provide different levels of precision (indicated by the different dB values). A particular quantizer of the plurality of quantizers 321, 322, 323 may correspond to a particular value of the allocation envelope 138. As such, an energy value of the allocation envelope 138 may point to a corresponding quantizer of the plurality of quantizers. As such, the determination of an allocation envelope 138 may simplify the selection process of a quantizer to be used for a particular error coefficient. In other words, the allocation envelope 138 may simplify the bit allocation process.

The set of quantizers may comprise one or more quantizers 322 which make use of dithering for randomizing the quantization error. This is illustrated in FIG. 22 showing a first set 326 of pre-determined quantizers which comprises a subset 324 of dithered quantizers and a second set 327 pre-determined quantizers which comprises a subset 325 of dithered quantizers. As such, the coefficient quantization unit 112 may make use of different sets 326, 327 of pre-determined quantizers, wherein the set of pre-determined quantizers, which is to be used by the coefficient quantization unit 112 may depend on a control parameter 146 provided by the predictor 117 and/or determined based on other side information available at the encoder and at the corresponding decoder. In particular, the coefficient quantization unit 112 may be configured to select a set 326, 327 of pre-determined quantizers for quantizing the block 142 of rescaled error coefficient, based on the control parameter 146, wherein the control parameter 146 may depend on one or more predictor parameters provided by the predictor 117. The one or more predictor parameters may be indicative of the quality of the block 150 of estimated transform coefficients provided by the predictor 117.

The quantized error coefficients may be entropy encoded, using e.g. a Huffman code, thereby yielding coefficient data 163 to be included into the bitstream generated by the encoder 100.

In the following further details regarding the selection or determination of a set 326 of quantizers 321, 322, 323 are described. A set 326 of quantizers may correspond to an ordered collection 326 of quantizers. The ordered collection 326 of quantizers may comprise N quantizers, wherein each quantizer may correspond to a different distortion level. As such, the collection 326 of quantizers may provide N possible distortion levels. The quantizers of the collection 326 may be ordered according to decreasing distortion (or equivalently according to increasing SNR). Furthermore, the quantizers may be labeled by integer labels. By way of example, the quantizers may be labeled 0, 1, 2, etc., wherein an increasing integer label may indicate an increasing SNR.

The collection 326 of quantizers may be such that an SNR gap between two consecutive quantizers is at least approximately constant. For example, the SNR of the quantizer with a label "1" may be 1.5 dB, and the SNR of the quantizer with a label "2" may be 3.0 dB. Hence, the quantizers of the ordered collection 326 of quantizers may be such that by changing from a first quantizer to an adjacent second quantizer, the SNR (signal-to-noise ratio) is increased by a substantially constant value (e.g. 1.5 dB), for all pairs of first and second quantizers.

The collection 326 of quantizers may comprise

- a noise-filling quantizer 321 that may provide an SNR that is slightly lower than or equal 0 dB, which for the rate allocation process may be approximated as 0 dB;
- $N_{dith}$ quantizers 322 that may use subtractive dithering and that typically correspond to intermediate SNR levels (e.g. $N_{dith}>0$); and
- $N_{cq}$ classic quantizers 323 that do not use subtractive dithering and that typically correspond to relatively high SNR levels (e.g. $N_{cq}>0$). The un-dithered quantizers 323 may correspond to scalar quantizers.

The total number N of quantizers is given by $N=1+N_{dith}+N_{cq}$.

Figure 24A:
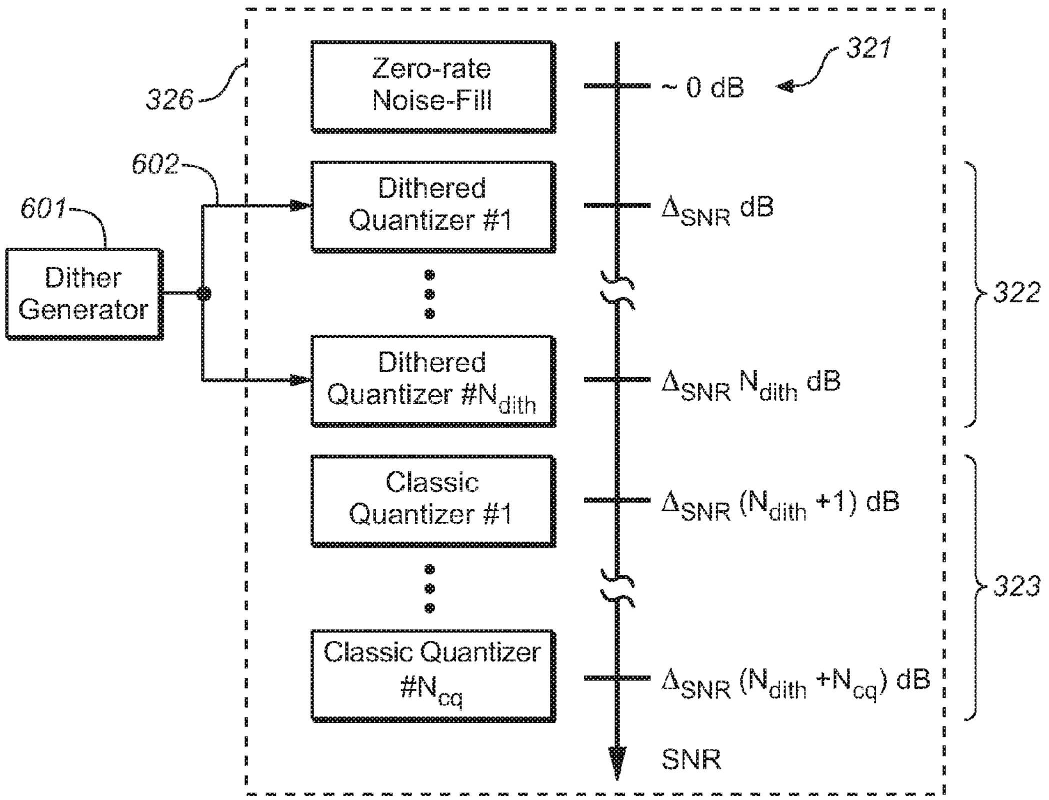
FIG. 24*a* shows a block diagram of an example set of admissible quantizers.

An example of a quantizer collection 326 is shown in FIG. 24*a*. The noise-filling quantizer 321 of the collection 326 of quantizers may be implemented, for example, using a random number generator that outputs a realization of a random variable according to a predefined statistical model.

In addition, the collection 326 of quantizers may comprise one or more dithered quantizers 322. The one or more dithered quantizers may be generated using a realization of a pseudo-number dither signal 602 as shown in FIG. 24*a*. The pseudo-number dither signal 602 may correspond to a block 602 of pseudo-random dither values. The block 602 of dither numbers may have the same dimensionality as the dimensionality of the block 142 of rescaled error coefficients, which is to be quantized. The dither signal 602 (or the block 602 of dither values) may be generated using a dither generator 601. In particular, the dither signal 602 may be generated using a look-up table containing uniformly distributed random samples.

Figure 24B:
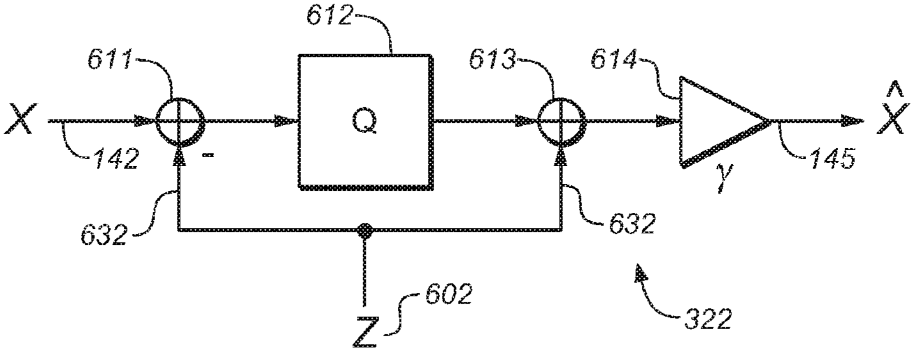
FIG. 24*b* shows a block diagram of an example dithered quantizer.

As will be shown in the context of FIG. 24*b*, individual dither values 632 of the block 602 of dither values are used to apply a dither to a corresponding coefficient which is to be quantized (e.g. to a corresponding rescaled error coefficient of the block 142 of rescaled error coefficients). The block 142 of rescaled error coefficients may comprise a total of K rescaled error coefficients. In a similar manner, the block 602 of dither values may comprise K dither values 632. The $k^{th}$ dither value 632, with k=1, . . . , K, of the block 602 of dither values may be applied to the $k^{th}$ rescaled error coefficient of the block 142 of rescaled error coefficients.

As indicated above, the block 602 of dither values may have the same dimension as the block 142 of rescaled error coefficients, which are to be quantized. This is beneficial, as this allows using a single block 602 of dither values for all the dithered quantizers 322 of a collection 326 of quantizers. In other words, in order to quantize and encode a given block 142 of rescaled error coefficients, the pseudo-random dither 602 may be generated only once for all admissible collections 326, 327 of quantizers and for all possible allocations for the distortion. This facilitates achieving synchronicity between the encoder 100 and the corresponding decoder, as the use of the single dither signal 602 does not need to be explicitly signaled to the corresponding decoder. In particular, the encoder 100 and the corresponding decoder may make use of the same dither generator 601 which is configured to generate the same block 602 of dither values for the block 142 of rescaled error coefficients.

The composition of the collection 326 of quantizers is preferably based on psycho-acoustical considerations. Low rate transform coding may lead to spectral artifacts including spectral holes and band-limitation that are triggered by the nature of the reverse-water filling process that takes place in conventional quantization schemes which are applied to transform coefficients. The audibility of the spectral holes can be reduced by injecting noise into those frequency bands 302 which happened to be below water level for a short time period and which were thus allocated with a zero bit-rate.

In general, it is possible to achieve an arbitrarily low bit-rate with a dithered quantizer 322. For example, in the scalar case one may choose to use a very large quantization step-size. Nevertheless, the zero bit-rate operation is not feasible in practice, because it would impose demanding requirements on the numeric precision needed to enable operation of the quantizer with a variable length coder. This provides the motivation to apply a generic noise fill quantizer 321 to the 0 dB SNR distortion level, rather than to apply a dithered quantizer 322. The proposed collection 326 of quantizers is designed such that the dithered quantizers 322 are used for distortion levels that are associated with relatively small step sizes, such that the variable length coding can be implemented without having to address issues related to maintaining the numerical precision.

For the case of scalar quantization, the quantizers 322 with subtractive dithering may be implemented using post-gains that provide near optimal MSE performance. An example of a subtractively dithered scalar quantizer 322 is shown in FIG. 24*b*. The dithered quantizer 322 comprises a uniform scalar quantizer Q 612 that is used within a subtractive dithering structure. The subtractive dithering structure comprises a dither subtraction unit 611 which is configured to subtract a dither value 632 (from the block 602 of dither values) from a corresponding error coefficient (from the block 142 of rescaled error coefficients). Furthermore, the subtractive dithering structure comprises a corresponding addition unit 613 which is configured to add the dither value 632 (from the block 602 of dither values) to the corresponding scalar quantized error coefficient. In the illustrated example, the dither subtraction unit 611 is placed upstream of the scalar quantizer Q 612 and the dither addition unit 613 is placed downstream of the scalar quantizer Q 612. The dither values 632 from the block 602 of dither values may taken on values from the interval [−0.5, 0.5) or [0,1) times the step size of the scalar quantizer 612. It should be noted that in an alternative implementation of the dithered quantizer 322, the dither subtraction unit 611 and the dither addition unit 613 may be exchanged with one another.

The subtractive dithering structure may be followed by a scaling unit 614 which is configured to rescale the quantized error coefficients by a quantizer post-gain γ. Subsequent to scaling of the quantized error coefficients, the block 145 of quantized error coefficients is obtained. It should be noted that the input X to the dithered quantizer 322 typically corresponds to the coefficients of the block 142 of rescaled error coefficients which fall into the particular frequency band which is to be quantized using the dithered quantizer 322. In a similar manner, the output of the dithered quantizer 322 typically corresponds to the quantized coefficients of the block 145 of quantized error coefficients which fall into the particular frequency band.

It may be assumed that the input X to the dithered quantizer 322 is zero mean and that the variance $\sigma_X^2=E\{X^2\}$ of the input X is known. (For example, the variance of the signal may be determined from the envelope of the signal.) Furthermore, it may be assumed that a pseudo-random dither block Z 602 comprising dither values 632 is available to the encoder 100 and to the corresponding decoder. Furthermore, it may be assumed that the dither values 632 are independent from the input X. Various different dithers 602 may be used, but it is assume in the following that the dither Z 602 is uniformly distributed between 0 and Δ, which may be denoted by U(0, Δ). In practice, any dither that fulfills the so-called Schuchman conditions may be used (e.g. a dither 602 which is uniformly distributed between [−0.5,0.5) times the step size Δ of the scalar quantizer 612).

The quantizer Q 612 may be a lattice and the extent of its Voronoi cell may be Δ. In this case, the dither signal would have a uniform distribution over the extent of the Voronoi cell of the lattice that is used.

The quantizer post-gain γ may be derived given the variance of the signal and the quantization step size, since the dither quantizer is analytically tractable for any step size (i.e., bit-rate). In particular, the post-gain may be derived to improve the MSE performance of a quantizer with a subtractive dither. The post-gain may be given by:

$$\gamma = \frac{\sigma_X^2}{\sigma_X^2 + \frac{\Delta^2}{12}}.$$

Even though by application of the post-gain γ, the MSE performance of the dithered quantizer 322 may be improved, a dithered quantizer 322 typically has a lower MSE performance than a quantizer with no dithering (although this performance loss vanishes as the bit-rate increases). Consequently, in general, dithered quantizers are more noisy than their un-dithered versions. Therefore, it may be desirable to use dithered quantizers 322 only when the use of dithered quantizers 322 is justified by the perceptually beneficial noise-fill property of dithered quantizers 322.

Hence, a collection 326 of quantizers comprising three types of quantizers may be provided. The ordered quantizer collection 326 may comprise a single noise-fill quantizer 321, one or more quantizers 322 with subtractive dithering and one or more classic (un-dithered) quantizers 323. The consecutive quantizers 321, 322, 323 may provide incremental improvements to the SNR. The incremental improvements between a pair of adjacent quantizers of the ordered collection 326 of quantizers may be substantially constant for some or all of the pairs of adjacent quantizers.

A particular collection 326 of quantizers may be defined by the number of dithered quantizers 322 and by the number of un-dithered quantizers 323 comprised within the particular collection 326. Furthermore, the particular collection 326 of quantizers may be defined by a particular realization of the dither signal 602. The collection 326 may be designed in order to provide perceptually efficient quantization of the transform coefficient rendering: zero rate noise-fill (yielding SNR slightly lower or equal to 0 dB); noise-fill by subtractive dithering at intermediate distortion level (intermediate SNR); and lack of the noise-fill at low distortion levels (high SNR). The collection 326 provides a set of admissible quantizers that may be selected during a rate-allocation process. An application of a particular quantizer from the collection 326 of quantizers to the coefficients of a particular frequency band 302 is determined during the rate-allocation process. It is typically not known a priori, which quantizer will be used to quantize the coefficients of a particular frequency band 302. However, it is typically known a priori, what the composition of the collection 326 of the quantizers is.

Figure 24C:
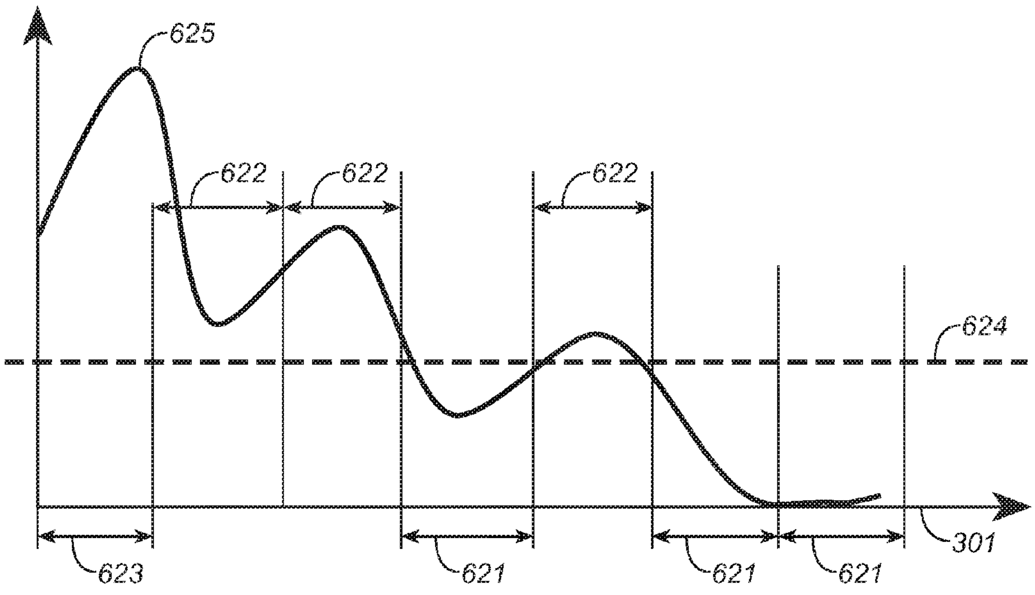
FIG. 24*c* illustrates an example selection of quantizers based on the spectrum of a block of transform coefficients.
Figure 25:
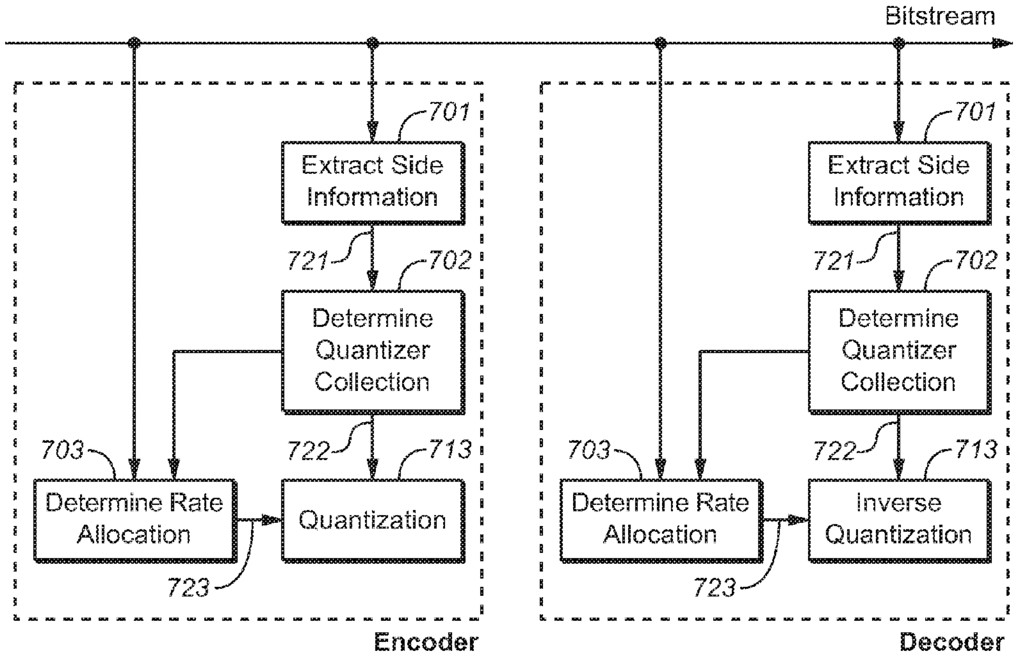
FIG. 25 illustrates an example scheme for determining a set of quantizers at an encoder and at a corresponding decoder.

The aspect of using different types of quantizers for different frequency bands 302 of a block 142 of error coefficients is illustrated in FIG. 24*c*, where an exemplary outcome of the rate allocation process is shown. In this example, it is assumed that the rate allocation follows the so-called reverse water-filling principle. FIG. 24*c* illustrates the spectrum 625 of an input signal (or the envelope of the to-be-quantized block of coefficients). It can be seen that the frequency band 623 has relatively high spectral energy and is quantized using a classical quantizer 323 which provides relatively low distortion levels. The frequency bands 622 exhibit a spectral energy above the water level 624. The coefficients in these frequency bands 622 may be quantized using the dithered quantizers 322 which provide intermediate distortion levels. The frequency bands 621 exhibit a spectral energy below the water level 624. The coefficients in these frequency bands 621 may be quantized using zero-rate noise fill. The different quantizers used to quantize the particular block of coefficients (represented by the spectrum 625) may be part of a particular collection 326 of quantizers, which has been determined for the particular block of coefficients.

Hence, the three different types of quantizers 321, 322, 323 may be applied selectively (for example selectively with regards to frequency). The decision on the application of a particular type of quantizer may be determined in the context of a rate allocation procedure, which is described below. The rate allocation procedure may make use of a perceptual criterion that can be derived from the RMS envelope of the input signal (or, for example, from the power spectral density of the signal). The type of the quantizer to be applied in a particular frequency band 302 does not need to be signaled explicitly to the corresponding decoder. The need for signaling the selected type of quantizer is eliminated, since the corresponding decoder is able to determine the particular set 326 of quantizers that was used to quantize a block of the input signal from the underlying perceptual criterion (e.g. the allocation envelope 138), from the pre-determined composition of the collection of the quantizers (e.g. a pre-determined set of different collections of quantizers), and from a single global rate allocation parameter (also referred to as an offset parameter).

The determination at the decoder of the collection 326 of quantizers, which has been used by the encoder 100 is facilitated by designing the collection 326 of the quantizers so that the quantizers are ordered according to their distortion (e.g. SNR). Each quantizer of the collection 326 may decrease the distortion (may refine the SNR) of the preceding quantizer by a constant value. Furthermore, a particular collection 326 of quantizers may be associated with a single realization of a pseudo-random dither signal 602, during the entire rate allocation process. As a result of this, the outcome of the rate allocation procedure does not affect the realization of the dither signal 602. This is beneficial for ensuring a convergence of the rate allocation procedure. Furthermore, this enables the decoder to perform decoding if the decoder knows the single realization of the dither signal 602. The decoder may be made aware of the realization of the dither signal 602 by using the same pseudo-random dither generator 601 at the encoder 100 and at the corresponding decoder.

As indicated above, the encoder 100 may be configured to perform a bit allocation process. For this purpose, the encoder 100 may comprise bit allocation units 109, 110. The bit allocation unit 109 may be configured to determine the total number of bits 143 which are available for encoding the current block 142 of rescaled error coefficients. The total number of bits 143 may be determined based on the allocation envelope 138. The bit allocation unit 110 may be configured to provide a relative allocation of bits to the different rescaled error coefficients, depending on the corresponding energy value in the allocation envelope 138.

The bit allocation process may make use of an iterative allocation procedure. In the course of the allocation procedure, the allocation envelope 138 may be offset using an offset parameter, thereby selecting quantizers with increased/decreased resolution. As such, the offset parameter may be used to refine or to coarsen the overall quantization. The offset parameter may be determined such that the coefficient data 163, which is obtained using the quantizers given by the offset parameter and the allocation envelope 138, comprises a number of bits which corresponds to (or does not exceed) the total number of bits 143 assigned to the current block 131. The offset parameter which has been used by the encoder 100 for encoding the current block 131 is included as coefficient data 163 into the bitstream. As a consequence, the corresponding decoder is enabled to determine the quantizers which have been used by the coefficient quantization unit 112 to quantize the block 142 of rescaled error coefficients.

As such, the rate allocation process may be performed at the encoder 100, where it aims at distributing the available bits 143 according to a perceptual model. The perceptual model may depend on the allocation envelope 138 derived from the block 131 of transform coefficients. The rate allocation algorithm distributes the available bits 143 among the different types of quantizers, i.e. the zero-rate noise-fill 321, the one or more dithered quantizers 322 and the one or more classic un-dithered quantizers 323. The final decision on the type of quantizer to be used to quantize the coefficients of a particular frequency band 302 of the spectrum may depend on the perceptual signal model, on the realization of the pseudo-random dither and on the bit-rate constraint.

At the corresponding decoder, the bit allocation (indicated by the allocation envelope 138 and by the offset parameter) may be used to determine the probabilities of the quantization indices in order to facilitate the lossless decoding. A method of computation of probabilities of quantization indices may be used, which employs the usage of a realization of the full-band pseudo random dither 602, the perceptual model parameterized by the signal envelope 138 and the rate allocation parameter (i.e. the offset parameter). Using the allocation envelope 138, the offset parameter and the knowledge regarding the block 602 of dither values, the composition of the collection 326 of quantizers at the decoder may be in sync with the collection 326 used at the encoder 100.

As outlined above, the bit-rate constraint may be specified in terms of a maximum allowed number of bits per frame 143. This applies e.g. to quantization indices which are subsequently entropy encoded using e.g. a Huffman code. In particular, this applies in coding scenarios where the bitstream is generated in a sequential fashion, where a single parameter is quantized at a time, and where the corresponding quantization index is converted to a binary codeword, which is appended to the bitstream.

If arithmetic coding (or range coding) is in use, the principle is different. In the context of arithmetic coding, typically a single codeword is assigned to a long sequence of quantization indices. It is typically not possible to associate exactly a particular portion of the bitstream with a particular parameter. In particular, in the context of arithmetic coding, the number of bits that is required to encode a random realization of a signal is typically unknown. This is the case even if the statistical model of the signal is known.

In order to address the above mentioned technical problem, it is proposed to make the arithmetic encoder a part of the rate allocation algorithm. During the rate allocation process the encoder attempts to quantize and encode a set of coefficients of one or more frequency bands 302. For every such attempt, it is possible to observe the change of the state of the arithmetic encoder and to compute the number of positions to advance in the bitstream (instead of computing a number of bits). If a maximum bit-rate constraint is set, this maximum bit-rate constraint may be used in the rate allocation procedure. The cost of the termination bits of the arithmetic code may be included in the cost of the last coded parameter and, in general, the cost of the termination bits will vary depending on the state of the arithmetic coder. Nevertheless, once the termination cost is available, it is possible to determine the number of bits needed to encode the quantization indices corresponding to the set of coefficients of the one or more frequency bands 302.

It should be noted that in the context of arithmetic encoding, a single realization of the dither 602 may be used for the whole rate allocation process (of a particular block 142 of coefficients). As outlined above, the arithmetic encoder may be used to estimate the bit-rate cost of a particular quantizer selection within the rate allocation procedure. The change of the state of the arithmetic encoder may be observed and the state change may be used to compute a number of bits needed to perform the quantization. Furthermore, the process of termination of the arithmetic code may be used within in the rate allocation process.

As indicated above, the quantization indices may be encoded using an arithmetic code or an entropy code. If the quantization indices are entropy encoded, the probability distribution of the quantization indices may be taken into account, in order to assign codewords of varying length to individual or to groups of quantization indices. The use of dithering may have an impact on the probability distribution of the quantization indices. In particular, the particular realization of a dither signal 602 may have an impact on the probability distribution of the quantization indices. Due to the virtually unlimited number of realizations of the dither signal 602, in the general case, the codeword probabilities are not known a priori and it is not possible to use Huffman coding.

It has been observed by the inventors that it is possible to reduce the number of possible dither realizations to a relatively small and manageable set of realizations of the dither signal 602. By way of example, for each frequency band 302 a limited set of dither values may be provided. For this purpose, the encoder 100 (as well as the corresponding decoder) may comprise a discrete dither generator 801 configured to generate the dither signal 602 by selecting one of M pre-determined dither realizations (see FIG. 26). By way of example, M different pre-determined dither realizations may be used for every frequency band 302. The number M of pre-determined dither realizations may be M<5 (e.g. M=4 or M=3)

Due to the limited number M of dither realizations, it is possible to train a (possibly multidimensional) Huffman codebook for each dither realization, yielding a collection 803 of M codebooks. The encoder 100 may comprise a codebook selection unit 802 which is configured to select one of the collection 803 of M pre-determined codebooks, based on the selected dither realization. By doing this, it is ensured that the entropy encoding is in sync with the dither generation. The selected codebook 811 may be used to encode individual or groups of quantization indices which have been quantized using the selected dither realization. As a consequence, the performance of entropy encoding can be improved, when using dithered quantizers.

Figure 26:
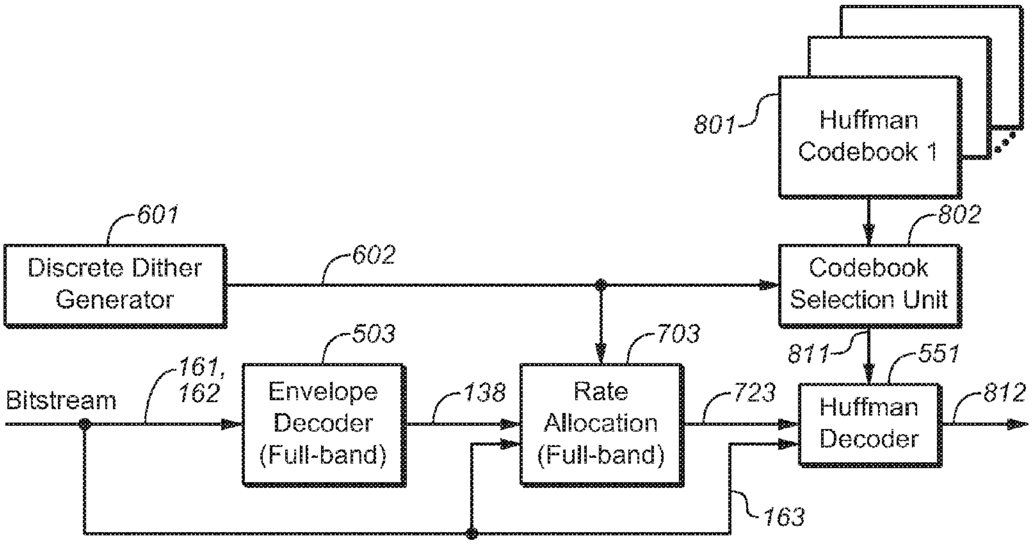
FIG. 26 shows a block diagram of an example scheme for decoding entropy encoded quantization indices which have been determined using a dithered quantizer.

The collection 803 of pre-determined codebooks and the discrete dither generator 801 may also be used at the corresponding decoder (as illustrated in FIG. 26). The decoding is feasible if a pseudo-random dither is used and if the decoder remains in sync with the encoder 100. In this case, the discrete dither generator 801 at the decoder generates the dither signal 602, and the particular dither realization is uniquely associated with a particular Huffman codebook 811 from the collection 803 of codebooks. Given the psychoacoustic model (for instance, represented by the allocation envelope 138 and the rate allocation parameter) and the selected codebook 811, the decoder is able to perform decoding using the Huffman decoder 551 to yield the decoded quantization indices 812.

As such, a relatively small set 803 of Huffman codebooks may be used instead of arithmetic coding. The use of a particular codebook 811 from the set 813 of Huffman codebooks may depend on a pre-determined realization of the dither signal 602. At the same time, a limited set of admissible dither values forming M pre-determined dither realizations may be used. The rate allocation process may then involve the use of un-dithered quantizers, of dithered quantizers and of Huffman coding.

As a result of quantization of the rescaled error coefficients, a block 145 of quantized error coefficients is obtained. The block 145 of quantized error coefficients corresponds to the block of error coefficients which are available at the corresponding decoder. Consequently, the block 145 of quantized error coefficients may be used for determining a block 150 of estimated transform coefficients. The encoder 100 may comprise an inverse rescaling unit 113 configured to perform the inverse of the rescaling operations performed by the rescaling unit 113, thereby yielding a block 147 of scaled quantized error coefficients. An addition unit 116 may be used to determine a block 148 of reconstructed flattened coefficients, by adding the block 150 of estimated transform coefficients to the block 147 of scaled quantized error coefficients. Furthermore, an inverse flattening unit 114 may be used to apply the adjusted envelope 139 to the block 148 of reconstructed flattened coefficients, thereby yielding a block 149 of reconstructed coefficients. The block 149 of reconstructed coefficients corresponds to the version of the block 131 of transform coefficients which is available at the corresponding decode. By consequence, the block 149 of reconstructed coefficients may be used in the predictor 117 to determine the block 150 of estimated coefficients.

The block 149 of reconstructed coefficients is represented in the un-flattened domain, i.e. the block 149 of reconstructed coefficients is also representative of the spectral envelope of the current block 131. As outlined below, this may be beneficial for the performance of the predictor 117.

The predictor 117 may be configured to estimate the block 150 of estimated transform coefficients based on one or more previous blocks 149 of reconstructed coefficients. In particular, the predictor 117 may be configured to determine one or more predictor parameters such that a pre-determined prediction error criterion is reduced (e.g. minimized). By way of example, the one or more predictor parameters may be determined such that an energy, or a perceptually weighted energy, of the block 141 of prediction error coefficients is reduced (e.g. minimized). The one or more predictor parameters may be included as predictor data 164 into the bitstream generated by the encoder 100.

The predictor 117 may make use of a signal model, as described in the patent application U.S. 61/750,052 and the patent applications which claim priority thereof, the content of which is incorporated by reference. The one or more predictor parameters may correspond to one or more model parameters of the signal model.

Figure 19B:
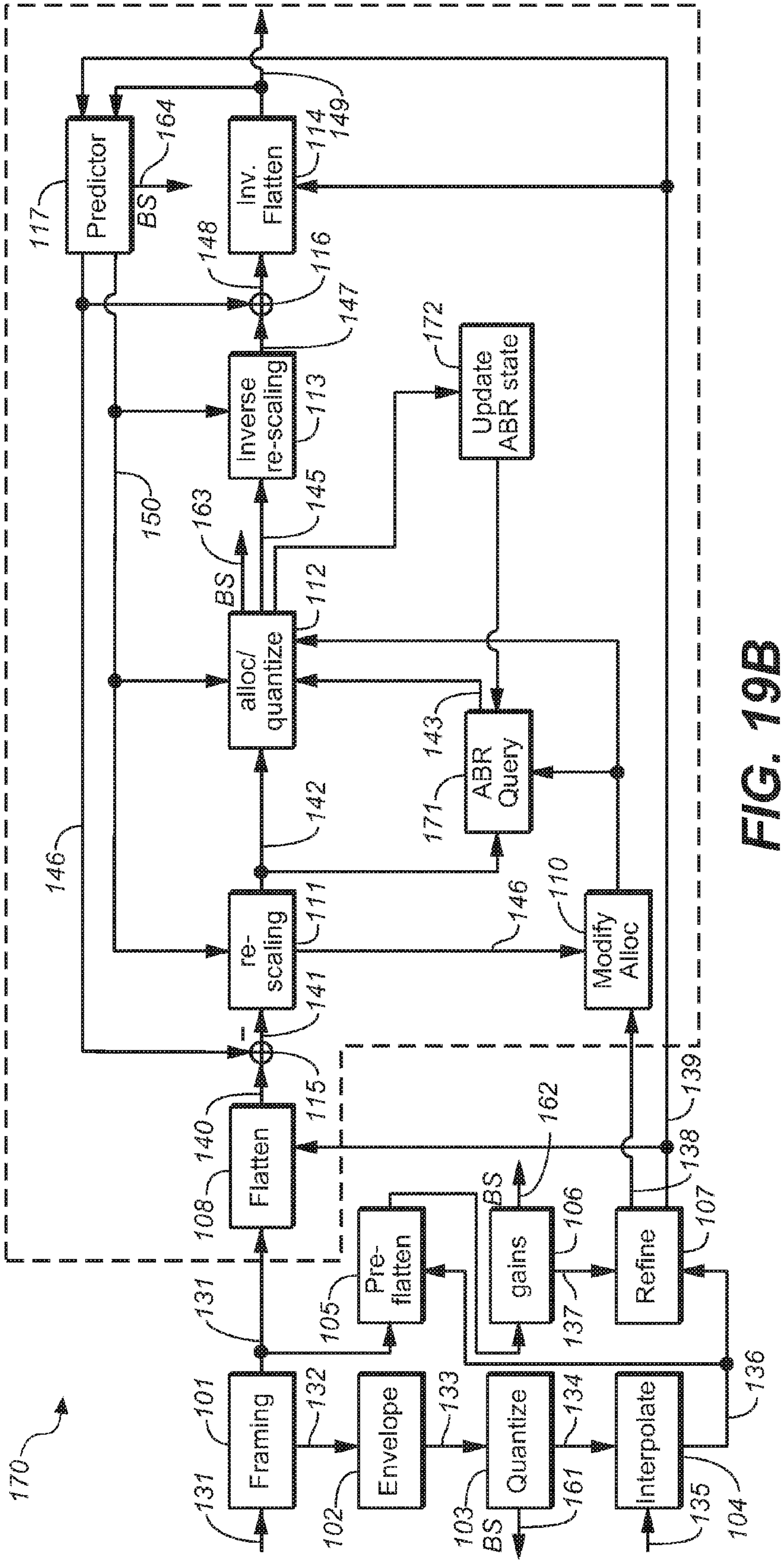
FIG. 19*b* shows a block diagram of an example audio encoder providing a bitstream at a variable bit-rate.

FIG. 19*b* shows a block diagram of a further example transform-based speech encoder 170. The transform-based speech encoder 170 of FIG. 19*b* comprises many of the components of the encoder 100 of FIG. 19*a*. However, the transform-based speech encoder 170 of FIG. 19*b* is configured to generate a bitstream having a variable bit-rate. For this purpose, the encoder 170 comprises an Average Bit Rate (ABR) state unit 172 configured to keep track of the bit-rate which has been used up by the bitstream for preceding blocks 131. The bit allocation unit 171 uses this information for determining the total number of bits 143 which is available for encoding the current block 131 of transform coefficients.

Figure 23A:
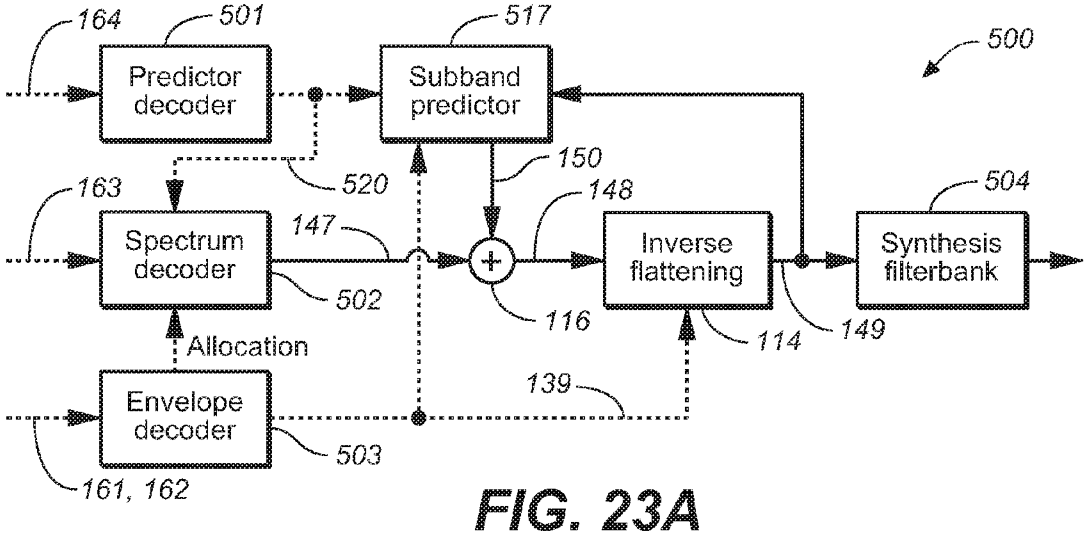
FIG. 23*a* shows a block diagram of an example audio decoder.
Figure 23B:
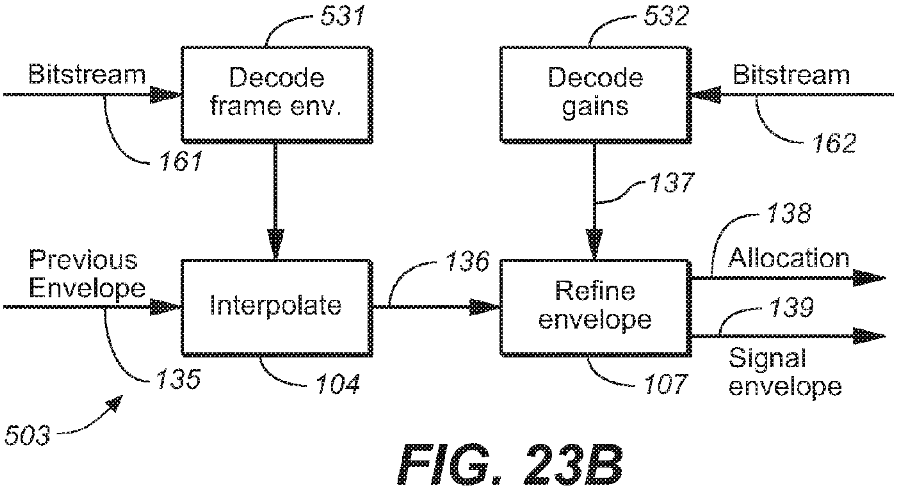
FIG. 23*b* shows a block diagram of an example envelope decoder of the audio decoder of FIG. 23*a;*
Figure 23C:
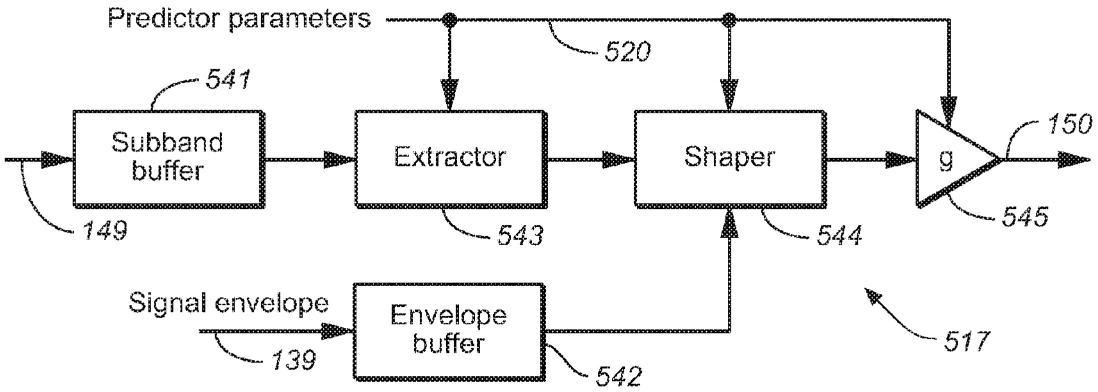
FIG. 23*c* shows a block diagram of an example subband predictor of the audio decoder of FIG. 23*a;*

In the following, a corresponding transform-based speech decoder 500 is described in the context of FIGS. 23*a* to 23*d*. FIG. 23*a* shows a block diagram of an example transform-based speech decoder 500. The block diagram shows a synthesis filterbank 504 (also referred to as inverse transform unit) which is used to convert a block 149 of reconstructed coefficients from the transform domain into the time domain, thereby yielding samples of the decoded audio signal. The synthesis filterbank 504 may make use of an inverse MDCT with a pre-determined stride (e.g. a stride of approximately 5 ms or 256 samples).

The main loop of the decoder 500 operates in units of this stride. Each step produces a transform domain vector (also referred to as a block) having a length or dimension which corresponds to a pre-determined bandwidth setting of the system. Upon zero-padding up to the transform size of the synthesis filterbank 504, the transform domain vector will be used to synthesize a time domain signal update of a pre-determined length (e.g. 5 ms) to the overlap/add process of the synthesis filterbank 504.

As indicated above, generic transform-based audio codecs typically employ frames with sequences of short blocks in the 5 ms range for transient handling. As such, generic transform-based audio codecs provide the necessary transforms and window switching tools for a seamless coexistence of short and long blocks. A voice spectral frontend defined by omitting the synthesis filterbank 504 of FIG. 23*a* may therefore be conveniently integrated into the general purpose transform-based audio codec, without the need to introduce additional switching tools. In other words, the transform-based speech decoder 500 of FIG. 23*a* may be conveniently combined with a generic transform-based audio decoder. In particular, the transform-based speech decoder 500 of FIG. 23*a* may make use of the synthesis filterbank 504 provided by the generic transform-based audio decoder (e.g. the AAC or HE-AAC decoder).

From the incoming bitstream (in particular from the envelope data 161 and from the gain data 162 comprised within the bitstream), a signal envelope may be determined by an envelope decoder 503. In particular, the envelope decoder 503 may be configured to determine the adjusted envelope 139 based on the envelope data 161 and the gain data 162). As such, the envelope decoder 503 may perform tasks similar to the interpolation unit 104 and the envelope refinement unit 107 of the encoder 100, 170. As outlined above, the adjusted envelope 109 represents a model of the signal variance in a set of predefined frequency bands 302.

Furthermore, the decoder 500 comprises an inverse flattening unit 114 which is configured to apply the adjusted envelope 139 to a flattened domain vector, whose entries may be nominally of variance one. The flattened domain vector corresponds to the block 148 of reconstructed flattened coefficients described in the context of the encoder 100, 170. At the output of the inverse flattening unit 114, the block 149 of reconstructed coefficients is obtained. The block 149 of reconstructed coefficients is provided to the synthesis filterbank 504 (for generating the decoded audio signal) and to the subband predictor 517.

The subband predictor 517 operates in a similar manner to the predictor 117 of the encoder 100, 170. In particular, the subband predictor 517 is configured to determine a block 150 of estimated transform coefficients (in the flattened domain) based on one or more previous blocks 149 of reconstructed coefficients (using the one or more predictor parameters signaled within the bitstream). In other words, the subband predictor 517 is configured to output a predicted flattened domain vector from a buffer of previously decoded output vectors and signal envelopes, based on the predictor parameters such as a predictor lag and a predictor gain. The decoder 500 comprises a predictor decoder 501 configured to decode the predictor data 164 to determine the one or more predictor parameters.

The decoder 500 further comprises a spectrum decoder 502 which is configured to furnish an additive correction to the predicted flattened domain vector, based on typically the largest part of the bitstream (i.e. based on the coefficient data 163). The spectrum decoding process is controlled mainly by an allocation vector, which is derived from the envelope and a transmitted allocation control parameter (also referred to as the offset parameter). As illustrated in FIG. 23*a*, there may be a direct dependence of the spectrum decoder 502 on the predictor parameters 520. As such, the spectrum decoder 502 may be configured to determine the block 147 of scaled quantized error coefficients based on the received coefficient data 163. As outlined in the context of the encoder 100, 170, the quantizers 321, 322, 323 used to quantize the block 142 of rescaled error coefficients typically depends on the allocation envelope 138 (which can be derived from the adjusted envelope 139) and on the offset parameter. Furthermore, the quantizers 321, 322, 323 may depend on a control parameter 146 provided by the predictor 117. The control parameter 146 may be derived by the decoder 500 using the predictor parameters 520 (in an analog manner to the encoder 100, 170).

As indicated above, the received bitstream comprises envelope data 161 and gain data 162 which may be used to determine the adjusted envelope 139. In particular, unit 531 of the envelope decoder 503 may be configured to determine the quantized current envelope 134 from the envelope data 161. By way of example, the quantized current envelope 134 may have a 3 dB resolution in predefined frequency bands 302 (as indicated in FIG. 21*a*). The quantized current envelope 134 may be updated for every set 132, 332 of blocks (e.g. every four coding units, i.e. blocks, or every 20 ms), in particular for every shifted set 332 of blocks. The frequency bands 302 of the quantized current envelope 134 may comprise an increasing number of frequency bins 301 as a function of frequency, in order to adapt to the properties of human hearing.

The quantized current envelope 134 may be interpolated linearly from a quantized previous envelope 135 into interpolated envelopes 136 for each block 131 of the shifted set 332 of blocks (or possibly, of the current set 132 of blocks). The interpolated envelopes 136 may be determined in the quantized 3 dB domain. This means that the interpolated energy values 303 may be rounded to the closest 3 dB level. An example interpolated envelope 136 is illustrated by the dotted graph of FIG. 21*a*. For each quantized current envelope 134, four level correction gains a 137 (also referred to as envelope gains) are provided as gain data 162. The gain decoding unit 532 may be configured to determine the level correction gains a 137 from the gain data 162. The level correction gains may be quantized in 1 dB steps. Each level correction gain is applied to the corresponding interpolated envelope 136 in order to provide the adjusted envelopes 139 for the different blocks 131. Due to the increased resolution of the level correction gains 137, the adjusted envelope 139 may have an increased resolution (e.g. a 1 dB resolution).

FIG. 21*b* shows an example linear or geometric interpolation between the quantized previous envelope 135 and the quantized current envelope 134. The envelopes 135, 134 may be separated into a mean level part and a shape part of the logarithmic spectrum. These parts may be interpolated with independent strategies such as a linear, a geometrical, or a harmonic (parallel resistors) strategy. As such, different interpolation schemes may be used to determine the interpolated envelopes 136. The interpolation scheme used by the decoder 500 typically corresponds to the interpolation scheme used by the encoder 100, 170.

The envelope refinement unit 107 of the envelope decoder 503 may be configured to determine an allocation envelope 138 from the adjusted envelope 139 by quantizing the adjusted envelope 139 (e.g. into 3 dB steps). The allocation envelope 138 may be used in conjunction with the allocation control parameter or offset parameter (comprised within the coefficient data 163) to create a nominal integer allocation vector used to control the spectral decoding, i.e. the decoding of the coefficient data 163. In particular, the nominal integer allocation vector may be used to determine a quantizer for inverse quantizing the quantization indices comprised within the coefficient data 163. The allocation envelope 138 and the nominal integer allocation vector may be determined in an analogue manner in the encoder 100, 170 and in the decoder 500.

Figure 27:
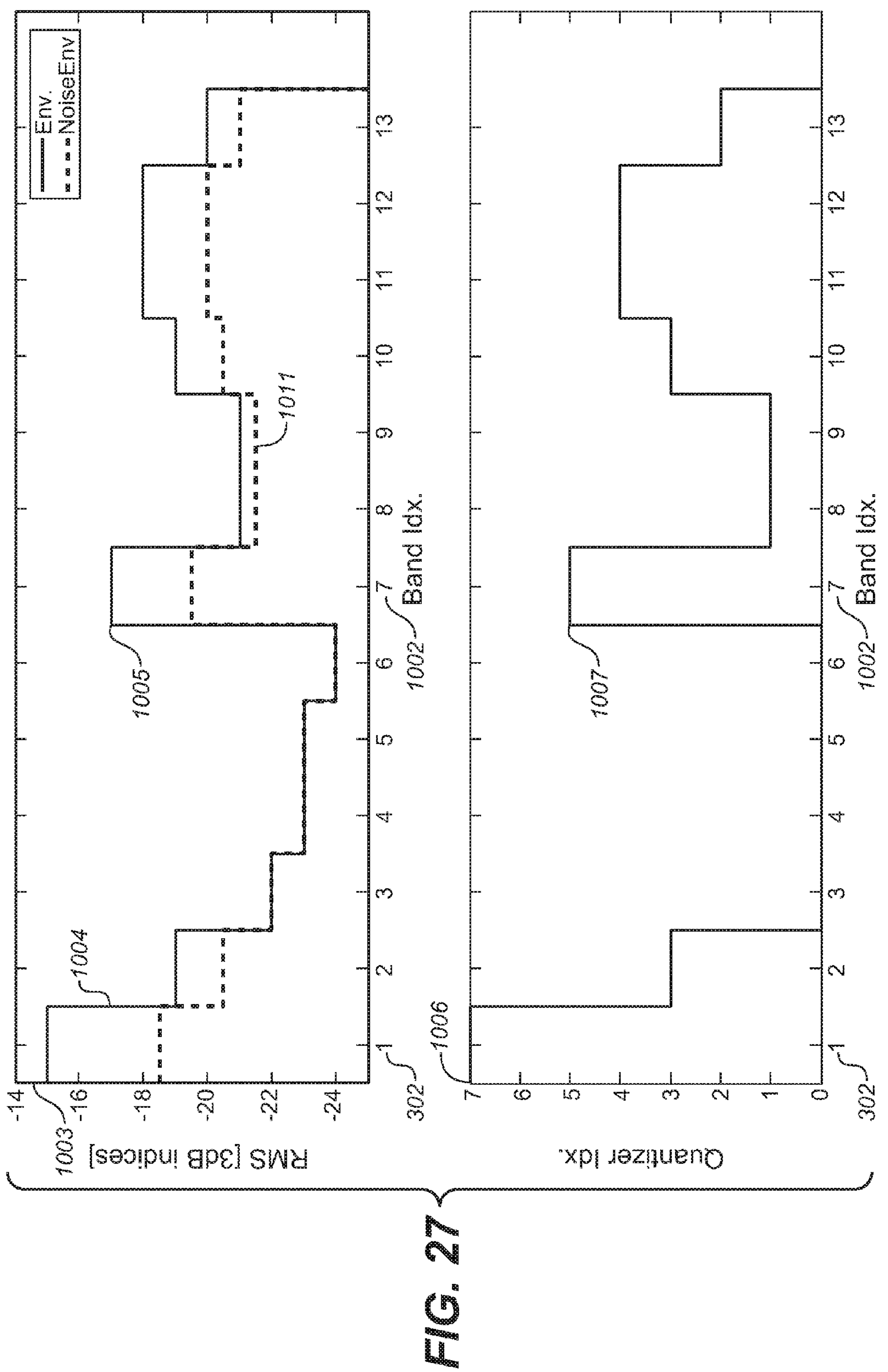
FIG. 27 illustrates an example bit allocation process.

FIG. 27 illustrates an example bit allocation process based on the allocation envelope 138. As outlined above, the allocation envelope 138 may be quantized according to a pre-determined resolution (e.g. a 3 dB resolution). Each quantized spectral energy value of the allocation envelope 138 may be assigned to a corresponding integer value, wherein adjacent integer values may represent a difference in spectral energy corresponding to the pre-determined resolution (e.g. 3 dB difference). The resulting set of integer numbers may be referred to as an integer allocation envelope 1004 (referred to as iEnv). The integer allocation envelope 1004 may be offset by the offset parameter to yield the nominal integer allocation vector (referred to as iAlloc) which provides a direct indication of the quantizer to be used to quantize the coefficient of a particular frequency band 302 (identified by a frequency band index, bandIdx).

FIG. 27 shows in diagram 1003 the integer allocation envelope 1004 as a function of the frequency bands 302. It can be seen that for frequency band 1002 (bandIdx=7) the integer allocation envelope 1004 takes on the integer value −17 (iEnv[7]=−17). The integer allocation envelope 1004 may be limited to a maximum value (referred to as iMax, e.g. iMax=−15). The bit allocation process may make use of a bit allocation formula which provides a quantizer index 1006 (referred to as iAlloc [bandIdx]) as a function of the integer allocation envelope 1004 and of the offset parameter (referred to as AllocOffset). As outlined above, the offset parameter (i.e. AllocOffset) is transmitted to the corresponding decoder 500, thereby enabling the decoder 500 to determine the quantizer indices 1006 using the bit allocation formula. The bit allocation formula may be given by $$iAlloc[\text{band}Idx]=iEnv[\text{band}Idx]-(i\text{Max}-\text{CONSTANT\_OFFSET})+Alloc\text{Offset},$$

wherein CONSTANT_OFFSET may be a constant offset, e.g. CONSTANT_OFFSET=20. By way of example, if the bit allocation process has determined that the bit-rate constraint can be achieved using an offset parameter AllocOffset=−13, the quantizer index 1007 of the $7^{th}$ frequency band may be obtained as iAlloc[7]=−17−(−15-20)−13=5. By using the above mentioned bit allocation formula for all frequency bands 302, the quantizer indices 1006 (and by consequence the quantizers 321, 322, 323) for all frequency bands 302 may be determined. A quantizer index smaller than zero may be rounded up to a quantizer index zero. In a similar manner, a quantizer index greater than the maximum available quantizer index may be rounded down to the maximum available quantizer index.

Furthermore, FIG. 27 shows an example noise envelope 1011 which may be achieved using the quantization scheme described in the present document. The noise envelope 1011 shows the envelope of quantization noise that is introduced during quantization. If plotted together with the signal envelope (represented by the integer allocation envelope 1004 in FIG. 27), the noise envelope 1011 illustrates the fact the distribution of the quantization noise is perceptually optimized with respect to the signal envelope.

In order to allow a decoder 500 to synchronize with a received bitstream, different types of frames may be transmitted. A frame may correspond to a set 132, 332 of blocks, in particular to a shifted block 332 of blocks. In particular, so called P-frames may be transmitted, which are encoded in a relative manner with respect to a previous frame. In the above description, it was assumed that the decoder 500 is aware of the quantized previous envelope 135. The quantized previous envelope 135 may be provided within a previous frame, such that the current set 132 or the corresponding shifted set 332 may correspond to a P-frame. However, in a start-up scenario, the decoder 500 is typically not aware of the quantized previous envelope 135. For this purpose, an I-frame may be transmitted (e.g. upon start-up or on a regular basis). The I-frame may comprise two envelopes, one of which is used as the quantized previous envelope 135 and the other one is used as the quantized current envelope 134. I-frames may be used for the start-up case of the voice spectral frontend (i.e. of the transform-based speech decoder 500), e.g. when following a frame employing a different audio coding mode and/or as a tool to explicitly enable a splicing point of the audio bitstream.

Figure 23D:
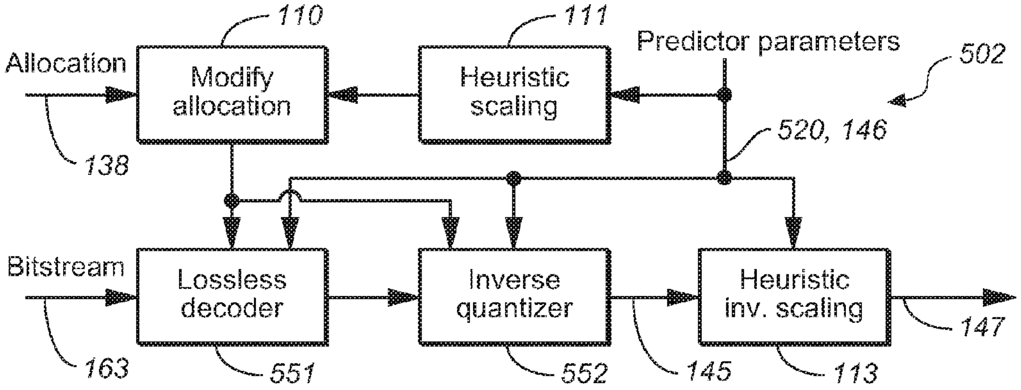
FIG. 23*d* shows a block diagram of an example spectrum decoder of the audio decoder of FIG. 23*a;*

The operation of the subband predictor 517 is illustrated in FIG. 23*d*. In the illustrated example, the predictor parameters 520 are a lag parameter and a predictor gain parameter g. The predictor parameters 520 may be determined from the predictor data 164 using a pre-determined table of possible values for the lag parameter and the predictor gain parameter. This enables the bit-rate efficient transmission of the predictor parameters 520.

The one or more previously decoded transform coefficient vectors (i.e. the one or more previous blocks 149 of reconstructed coefficients) may be stored in a subband (or MDCT) signal buffer 541. The buffer 541 may be updated in accordance to the stride (e.g. every 5 ms). The predictor extractor 543 may be configured to operate on the buffer 541 depending on a normalized lag parameter T. The normalized lag parameter T may be determined by normalizing the lag parameter 520 to stride units (e.g. to MDCT stride units). If the lag parameter T is an integer, the extractor 543 may fetch one or more previously decoded transform coefficient vectors T time units into the buffer 541. In other words, the lag parameter T may be indicative of which ones of the one or more previous blocks 149 of reconstructed coefficients are to be used to determine the block 150 of estimated transform coefficients. A detailed discussion regarding a possible implementation of the extractor 543 is provided in the patent application U.S. 61/750,052 and the patent applications which claim priority thereof, the content of which is incorporated by reference.

The extractor 543 may operate on vectors (or blocks) carrying full signal envelopes. On the other hand, the block 150 of estimated transform coefficients (to be provided by the subband predictor 517) is represented in the flattened domain. Consequently, the output of the extractor 543 may be shaped into a flattened domain vector. This may be achieved using a shaper 544 which makes use of the adjusted envelopes 139 of the one or more previous blocks 149 of reconstructed coefficients. The adjusted envelopes 139 of the one or more previous blocks 149 of reconstructed coefficients may be stored in an envelope buffer 542. The shaper unit 544 may be configured to fetch a delayed signal envelope to be used in the flattening from $T_0$ time units into the envelope buffer 542, where $T_0$ is the integer closest to T. Then, the flattened domain vector may be scaled by the gain parameter g to yield the block 150 of estimated transform coefficients (in the flattened domain).

As an alternative, the delayed flattening process performed by the shaper 544 may be omitted by using a subband predictor 517 which operates in the flattened domain, e.g. a subband predictor 517 which operates on the blocks 148 of reconstructed flattened coefficients. However, it has been found that a sequence of flattened domain vectors (or blocks) does not map well to time signals due to the time aliased aspects of the transform (e.g. the MDCT transform). As a consequence, the fit to the underlying signal model of the extractor 543 is reduced and a higher level of coding noise results from the alternative structure. In other words, it has been found that the signal models (e.g. sinusoidal or periodic models) used by the subband predictor 517 yield an increased performance in the un-flattened domain (compared to the flattened domain).

It should be noted that in an alternative example, the output of the predictor 517 (i.e. the block 150 of estimated transform coefficients) may be added at the output of the inverse flattening unit 114 (i.e. to the block 149 of reconstructed coefficients) (see FIG. 23*a*). The shaper unit 544 of FIG. 23*c* may then be configured to perform the combined operation of delayed flattening and inverse flattening.

Elements in the received bitstream may control the occasional flushing of the subband buffer 541 and of the envelope buffer 541, for example in case of a first coding unit (i.e. a first block) of an I-frame. This enables the decoding of an I-frame without knowledge of the previous data. The first coding unit will typically not be able to make use of a predictive contribution, but may nonetheless use a relatively smaller number of bits to convey the predictor information 520. The loss of prediction gain may be compensated by allocating more bits to the prediction error coding of this first coding unit. Typically, the predictor contribution is again substantial for the second coding unit (i.e. a second block) of an I-frame. Due to these aspects, the quality can be maintained with a relatively small increase in bit-rate, even with a very frequent use of I-frames.

In other words, the sets 132, 332 of blocks (also referred to as frames) comprise a plurality of blocks 131 which may be encoded using predictive coding. When encoding an I-frame, only the first block 203 of a set 332 of blocks cannot be encoded using the coding gain achieved by a predictive encoder. Already the directly following block 201 may make use of the benefits of predictive encoding. This means that the drawbacks of an I-frame with regards to coding efficiency are limited to the encoding of the first block 203 of transform coefficients of the frame 332, and do not apply to the other blocks 201, 204, 205 of the frame 332. Hence, the transform-based speech coding scheme described in the present document allows for a relatively frequent use of I-frames without significant impact on the coding efficiency. As such, the presently described transform-based speech coding scheme is particularly suitable for applications which require a relatively fast and/or a relatively frequent synchronization between decoder and encoder.

FIG. 23*d* shows a block diagram of an example spectrum decoder 502. The spectrum decoder 502 comprises a lossless decoder 551 which is configured to decode the entropy encoded coefficient data 163. Furthermore, the spectrum decoder 502 comprises an inverse quantizer 552 which is configured to assign coefficient values to the quantization indices comprised within the coefficient data 163. As outlined in the context of the encoder 100, 170, different transform coefficients may be quantized using different quantizers selected from a set of pre-determined quantizers, e.g. a finite set of model based scalar quantizers. As shown in FIG. 22, a set of quantizers 321, 322, 323 may comprise different types of quantizers. The set of quantizers may comprise a quantizer 321 which provides noise synthesis (in case of zero bit-rate), one or more dithered quantizers 322 (for relatively low signal-to-noise ratios, SNRs, and for intermediate bit-rates) and/or one or more plain quantizers 323 (for relatively high SNRs and for relatively high bit-rates).

The envelope refinement unit 107 may be configured to provide the allocation envelope 138 which may be combined with the offset parameter comprised within the coefficient data 163 to yield an allocation vector. The allocation vector contains an integer value for each frequency band 302. The integer value for a particular frequency band 302 points to the rate-distortion point to be used for the inverse quantization of the transform coefficients of the particular band 302. In other words, the integer value for the particular frequency band 302 points to the quantizer to be used for the inverse quantization of the transform coefficients of the particular band 302. An increase of the integer value by one corresponds to a 1.5 dB increase in SNR. For the dithered quantizers 322 and the plain quantizers 323, a Laplacian probability distribution model may be used in the lossless coding, which may employ arithmetic coding. One or more dithered quantizers 322 may be used to bridge the gap in a seamless way between low and high bit-rate cases. Dithered quantizers 322 may be beneficial in creating sufficiently smooth output audio quality for stationary noise-like signals.

In other words, the inverse quantizer 552 may be configured to receive the coefficient quantization indices of a current block 131 of transform coefficients. The one or more coefficient quantization indices of a particular frequency band 302 have been determined using a corresponding quantizer from a pre-determined set of quantizers. The value of the allocation vector (which may be determined by offsetting the allocation envelope 138 with the offset parameter) for the particular frequency band 302 indicates the quantizer which has been used to determine the one or more coefficient quantization indices of the particular frequency band 302. Having identified the quantizer, the one or more coefficient quantization indices may be inverse quantized to yield the block 145 of quantized error coefficients.

Furthermore, the spectral decoder 502 may comprise an inverse-rescaling unit 113 to provide the block 147 of scaled quantized error coefficients. The additional tools and interconnections around the lossless decoder 551 and the inverse quantizer 552 of FIG. 23*d* may be used to adapt the spectral decoding to its usage in the overall decoder 500 shown in FIG. 23*a*, where the output of the spectral decoder 502 (i.e. the block 145 of quantized error coefficients) is used to provide an additive correction to a predicted flattened domain vector (i.e. to the block 150 of estimated transform coefficients). In particular, the additional tools may ensure that the processing performed by the decoder 500 corresponds to the processing performed by the encoder 100, 170.

In particular, the spectral decoder 502 may comprise a heuristic scaling unit 111. As shown in conjunction with the encoder 100, 170, the heuristic scaling unit 111 may have an impact on the bit allocation. In the encoder 100, 170, the current blocks 141 of prediction error coefficients may be scaled up to unit variance by a heuristic rule. As a consequence, the default allocation may lead to a too fine quantization of the final downscaled output of the heuristic scaling unit 111. Hence the allocation should be modified in a similar manner to the modification of the prediction error coefficients.

However, as outlined below, it may be beneficial to avoid the reduction of coding resources for one or more of the low frequency bins (or low frequency bands). In particular, this may be beneficial to counter a LF (low frequency) rumble/noise artifact which happens to be most prominent in voiced situations (i.e. for signal having a relatively large control parameter 146, rfu). As such, the bit allocation/quantizer selection in dependence of the control parameter 146, which is described below, may be considered to be a "voicing adaptive LF quality boost".

The spectral decoder may depend on a control parameter 146 named rfu which is a limited version of the predictor gain g, rfu=min(1, max(g, 0)).

Using the control parameter 146, the set of quantizers used in the coefficient quantization unit 112 of the encoder 100, 170 and used in the inverse quantizer 552 may be adapted. In particular, the noisiness of the set of quantizers may be adapted based on the control parameter 146. By way of example, a value of the control parameter 146, rfu, close to 1 may trigger a limitation of the range of allocation levels using dithered quantizers and may trigger a reduction of the variance of the noise synthesis level. In an example, a dither decision threshold at rfu=0.75 and a noise gain equal to 1−rfu may be set. The dither adaptation may affect both the lossless decoding and the inverse quantizer, whereas the noise gain adaptation typically only affects the inverse quantizer.

It may be assumed that the predictor contribution is substantial for voiced/tonal situations. As such, a relatively high predictor gain g (i.e. a relatively high control parameter 146) may be indicative of a voiced or tonal speech signal. In such situations, the addition of dither-related or explicit (zero allocation case) noise has shown empirically to be counterproductive to the perceived quality of the encoded signal. As a consequence, the number of dithered quantizers 322 and/or the type of noise used for the noise synthesis quantizer 321 may be adapted based on the predictor gain g, thereby improving the perceived quality of the encoded speech signal.

As such, the control parameter 146 may be used to modify the range 324, 325 of SNRs for which dithered quantizers 322 are used. By way of example, if the control parameter 146 rfu<0.75, the range 324 for dithered quantizers may be used. In other words, if the control parameter 146 is below a pre-determined threshold, the first set 326 of quantizers may be used. On the other hand, if the control parameter 146 rfu≥0.75, the range 325 for dithered quantizers may be used. In other words, if the control parameter 146 is greater than or equal to the pre-determined threshold, the second set 327 of quantizers may be used.

Furthermore, the control parameter 146 may be used for modification of the variance and bit allocation. The reason for this is that typically a successful prediction will require a smaller correction, especially in the lower frequency range from 0 to 1 kHz. It may be advantageous to make the quantizer explicitly aware of this deviation from the unit variance model in order to free up coding resources to higher frequency bands 302.

EQUIVALENTS, EXTENSIONS, ALTERNATIVES AND MISCELLANEOUS

Further embodiments of the present invention will become apparent to a person skilled in the art after studying the description above. Even though the present description and drawings disclose embodiments and examples, the invention is not restricted to these specific examples. Numerous modifications and variations can be made without departing from the scope of the present invention, which is defined by the accompanying claims. Any reference signs appearing in the claims are not to be understood as limiting their scope.

The systems and methods disclosed hereinabove may be implemented as software, firmware, hardware or a combination thereof. In a hardware implementation, the division of tasks between functional units referred to in the above description does not necessarily correspond to the division into physical units; to the contrary, one physical component may have multiple functionalities, and one task may be carried out by several physical components in cooperation. Certain components or all components may be implemented as software executed by a digital signal processor or microprocessor, or be implemented as hardware or as an application-specific integrated circuit. Such software may be distributed on computer readable media, which may comprise computer storage media (or non-transitory media) and communication media (or transitory media). As is well known to a person skilled in the art, the term computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Further, it is well known to the skilled person that communication media typically embodies computer readable instructions, data structures, program modules or other data in a modulated data signal such as a carrier wave or other transport mechanism and includes any information delivery media.

The invention claimed is:

1. An audio processing system configured to accept an audio bitstream, the audio processing system comprising:

a decoder adapted to receive the bitstream and to output quantized spectral coefficients;

a front-end component, which includes:

a dequantization stage adapted to receive the quantized spectral coefficients and to output a first frequency-domain representation of an intermediate signal; and an inverse transform stage for receiving the first frequency-domain representation of the intermediate signal and synthesizing, based thereon, a time-domain representation of the intermediate signal;

a processing stage, which includes:

an analysis filterbank for receiving the time-domain representation of the intermediate signal and outputting a second frequency-domain representation of the intermediate signal;

at least one processing component for receiving said second frequency-domain representation of the intermediate signal and outputting a frequency-domain representation of a processed audio signal; and a synthesis filterbank for receiving the frequency-domain representation of the processed audio signal and outputting a time-domain representation of the processed audio signal; and a sample rate converter for receiving said time-domain representation of the processed audio signal and outputting a reconstructed audio signal sampled at a target sampling frequency, wherein the respective internal sampling rates of the time-domain representation of the intermediate audio signal and of the time-domain representation of the processed audio signal are equal, and wherein said at least one processing component includes:

a parametric upmix stage for receiving a downmix signal with M channels and outputting, based thereon, a signal with N channels, wherein the parametric upmix stage is operable at least in a mode where 1≤M<N, associated with a delay, and a mode where 1≤M=N; and a first delay stage configured to incur a delay, when the parametric upmix stage is in the mode where 1≤M=N, to compensate for the delay associated with the mode where 1≤M<N in order for the processing stage to have a constant total delay independently of a current operating mode of the parametric upmix stage.

2. The audio processing system of claim 1, wherein the front-end component is operable in an audio mode and a voice-specific mode, and wherein a mode change from the audio mode into the voice-specific mode of the front-end component includes reducing a maximal frame length of the inverse transform stage.

3. The audio processing system of claim 2, wherein the sample rate converter is operable to provide a reconstructed audio signal sampled at the target sampling frequency differing by up to 5% from the internal sampling rate of said time-domain representation of the processed audio signal.

4. The audio processing system of claim 1, further comprising a bypass line arranged parallel to the processing stage and comprising a second delay stage configured to incur a delay equal to the constant total delay of the processing stage.

5. The audio processing system of claim 1, wherein the parametric upmix stage is further operable at least in a mode where M=3 and N=5.

6. The audio processing system of claim 5, wherein the front-end component is configured, in that mode of the parametric upmix stage where M=3 and N=5, to provide an intermediate signal comprising a downmix signal where the front-end component derives two channels out of the M=3 channels from jointly coded channels in the audio bitstream.

7. The audio processing system of claim 1, wherein said at least one processing component further includes a spectral band replication module arranged upstream of the parametric upmix stage and operable to reconstruct high-frequency content, wherein the spectral band replication module is configured to be active at least in those modes of the parametric upmix stage where M<N; and is operable independently of the current mode of the parametric upmix stage when the parametric upmix stage is in any of the modes where M=N.

8. The audio processing system of claim 7, wherein said at least one processing component further includes a waveform coding stage arranged parallel to or downstream of the parametric upmix stage and operable to augment each of the N channels with waveform-coded low-frequency content, wherein the waveform coding stage is activatable and deactivatable independently of the current mode of the parametric upmix stage and the spectral band replication module.

9. The audio processing system of claim 8, operable at least in a decoding mode where the parametric upmix stage is in a M=N mode with M >2.

10. The audio processing system of claim 9, operable at least in the following decoding modes:

i) parametric upmix stage in M=N=1 mode;

ii) parametric upmix stage in M=N=1 mode and spectral band replication module active;

iii) parametric upmix stage in M=1, N=2 mode and spectral band replication module active;

iv) parametric upmix stage in M=1, N=2 mode, spectral band replication module active and waveform coding stage active;

v) parametric upmix stage in M=2, N=5 mode and spectral band replication module active;

vi) parametric upmix stage in M=2, N=5 mode, spectral band replication module active and waveform coding stage active;

vii) parametric upmix stage in M=3, N=5 mode and spectral band replication module active;

viii) parametric upmix stage in M=N=2 mode;

ix) parametric upmix stage in M=N=2 mode and spectral band replication module active;

x) parametric upmix stage in M=N=7 mode;

xi) parametric upmix stage in M=N=7 mode and spectral band replication module active.

11. The audio processing system of claim 1, further comprising the following components arranged downstream of the processing stage:

a phase shifting component configured to receive the time-domain representation of the processed audio signal, in which at least one channel represents a surround channel, and to perform a 90-degree phase shift on said at least one surround channel; and a downmix component configured to receive the processed audio signal from the phase shifting component and to output, based thereon, a downmix signal with two channels.

12. The audio processing system of claim 1, further comprising an Lfe decoder configured to prepare at least one additional channel based on the audio bitstream and include said additional channel(s) in the reconstructed audio signal.

13. A method of processing an audio bitstream, the method comprising:

providing quantized spectral coefficients based on the bitstream;

receiving the quantized spectral coefficients and performing inverse quantization followed by a frequency-to-time transformation, whereby a time-domain representation of an intermediate audio signal is obtained;

providing a frequency-domain representation of the intermediate audio signal based on the time-domain representation of the intermediate audio signal;

providing a frequency-domain representation of a processed audio signal by performing at least one processing step on the frequency-domain representation of the intermediate audio signal;

providing a time-domain representation of the processed audio signal based on the frequency-domain representation of the processed audio signal; and changing the sampling rate of the time-domain representation of the processed audio signal into a target sampling frequency, whereby a reconstructed audio signal is obtained, wherein the respective internal sampling rates of the time-domain representation of the intermediate audio signal and of the time-domain representation of the processed audio signal are equal, wherein the method further comprises:

determining a current mode among at least a mode where 1≤M<N, associated with a delay, and a mode where 1≤M=N, wherein the at least one processing step includes:

receiving a downmix signal with M channels and outputting, based thereon, a signal with N channels;

in response to the current mode being the mode where 1≤M=N, incurring a delay to compensate for the delay associated with the mode where 1≤M<N in order for a total delay of the processing step to be constant independently of the current mode.

14. The method of claim 13, wherein said inverse quantization and/or frequency-to-time transformation are performed in a hardware component operable at least in an audio mode and a voice-specific mode, a current mode being selected in accordance with metadata associated with the quantized spectral coefficients, and wherein a mode change from the audio mode into the voice-specific mode includes reducing a maximal frame length of the frequency-to-time transformation.

15. A non-transitory computer program product comprising a non-transitory computer-readable medium with instructions for performing the method of claim 13.

* * * * *